(12) United States Patent
Koguchi

(10) Patent No.: US 6,612,801 B1
(45) Date of Patent: Sep. 2, 2003

(54) METHOD AND DEVICE FOR ARRAYING SUBSTRATES AND PROCESSING APPARATUS THEREOF

(75) Inventor: Akira Koguchi, Maebaru (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/649,404

(22) Filed: Aug. 24, 2000

(30) Foreign Application Priority Data

Aug. 26, 1999 (JP) .......................................... 11-240161
Nov. 15, 1999 (JP) .......................................... 11-323866

(51) Int. Cl.[7] .............................................. B65G 49/07
(52) U.S. Cl. .................. 414/416.02; 414/404; 414/938
(58) Field of Search ........................... 414/404, 416.02, 414/938

(56) References Cited

U.S. PATENT DOCUMENTS

| | | | | |
|---|---|---|---|---|
| 4,573,851 A | * | 3/1986 | Butler | 414/404 |
| 4,611,966 A | * | 9/1986 | Johnson | 414/404 |
| 4,695,217 A | * | 9/1987 | Lau | 414/404 |
| 4,856,957 A | * | 8/1989 | Lau et al. | 414/404 |
| RE33,341 E | * | 9/1990 | Lee et al. | 414/404 |
| 4,987,407 A | * | 1/1991 | Lee | 414/404 X |
| 5,125,784 A | * | 6/1992 | Asano | 414/404 |
| 5,269,643 A | * | 12/1993 | Kodama et al. | 414/938 X |
| 5,299,901 A | | 4/1994 | Takayama | |
| 5,620,295 A | | 4/1997 | Nishi | |
| 5,655,871 A | | 8/1997 | Ishii | |
| 6,092,980 A | | 7/2000 | Kumasaka | |

FOREIGN PATENT DOCUMENTS

| | | | | |
|---|---|---|---|---|
| EP | 908927 A2 | 4/1999 | | |
| JP | 1251633 | * | 10/1989 | ................. 414/404 |
| JP | 3 94446 | * | 4/1991 | ................. 414/938 |
| JP | 5-175179 | 7/1993 | | |
| JP | 05175179 A | 7/1993 | | |
| JP | 7-310192 | 11/1995 | | |
| JP | 8-195368 | 7/1996 | | |
| JP | 8-195373 | 7/1996 | | |
| JP | 9-115868 | 5/1997 | | |

* cited by examiner

Primary Examiner—Steven A. Bratlie
(74) Attorney, Agent, or Firm—Morrison & Foerster LLP

(57) ABSTRACT

A substrate arraying method, a substrate arraying device and a small-sized processing apparatus commonly includes a step of taking 26 sheets of wafers W out of one carrier C at regular intervals of L, a step of taking 26 sheets of wafers W out of another carrier C at regular intervals of L and a step of respectively inserting the 26 sheets of wafers W taken out of the latter carrier C between the 26 sheets of wafers W taken out of the former carrier C to form a group of wafers 100 where 52 sheets of wafers W are arranged at regular intervals of L/2 which is substantially half of the intervals of L. Consequently, it is possible to complete the stable formation of substrates group in a short time.

12 Claims, 68 Drawing Sheets

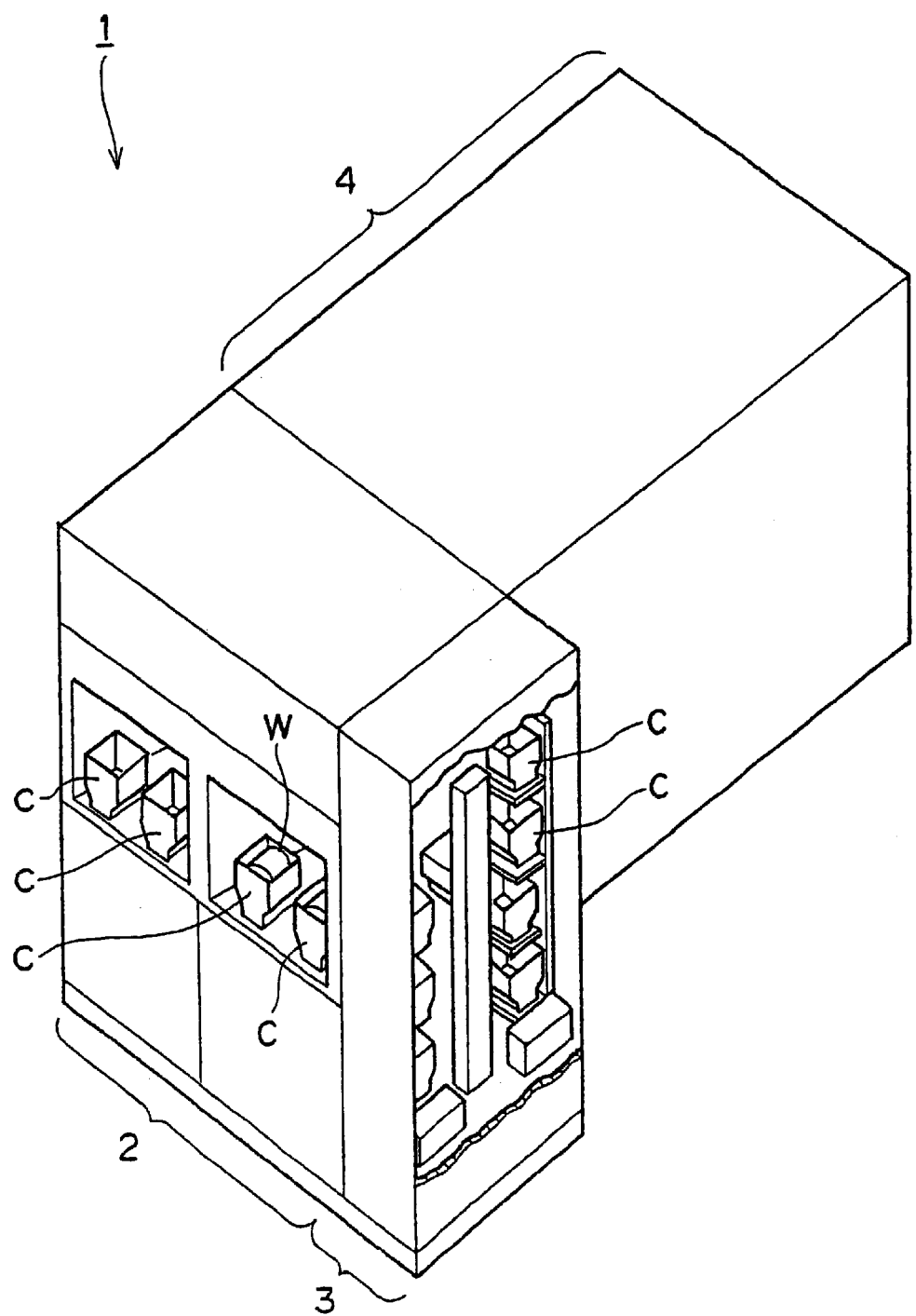
F I G. 1

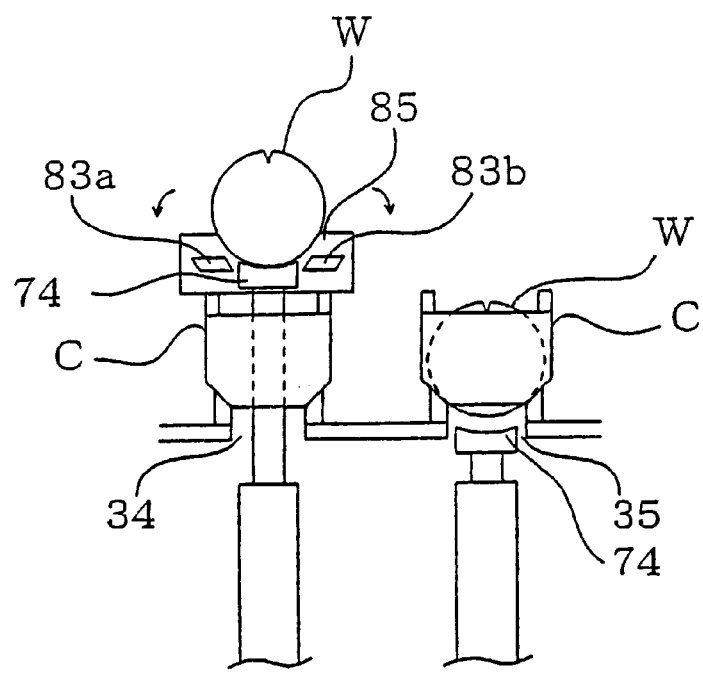
F I G. 15
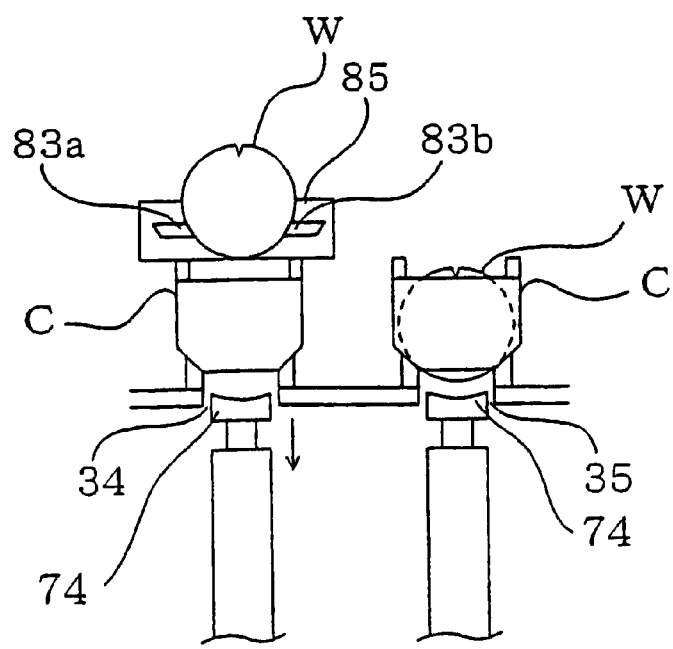
F I G. 16

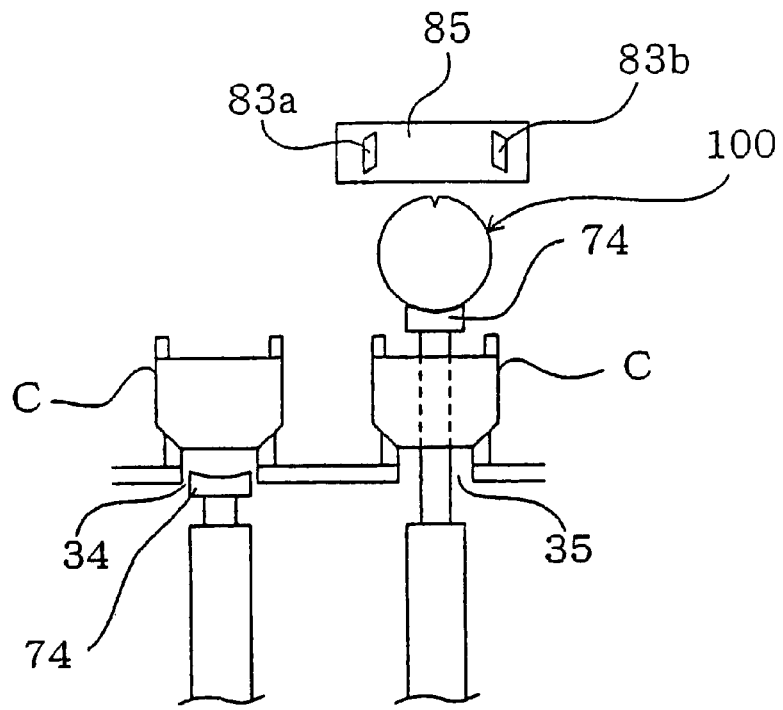
F I G. 21
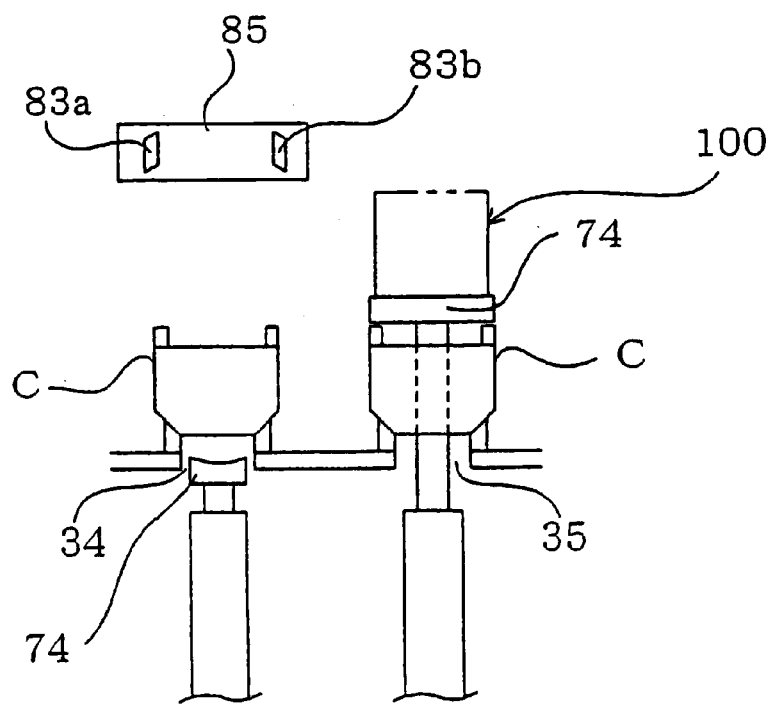
F I G. 22

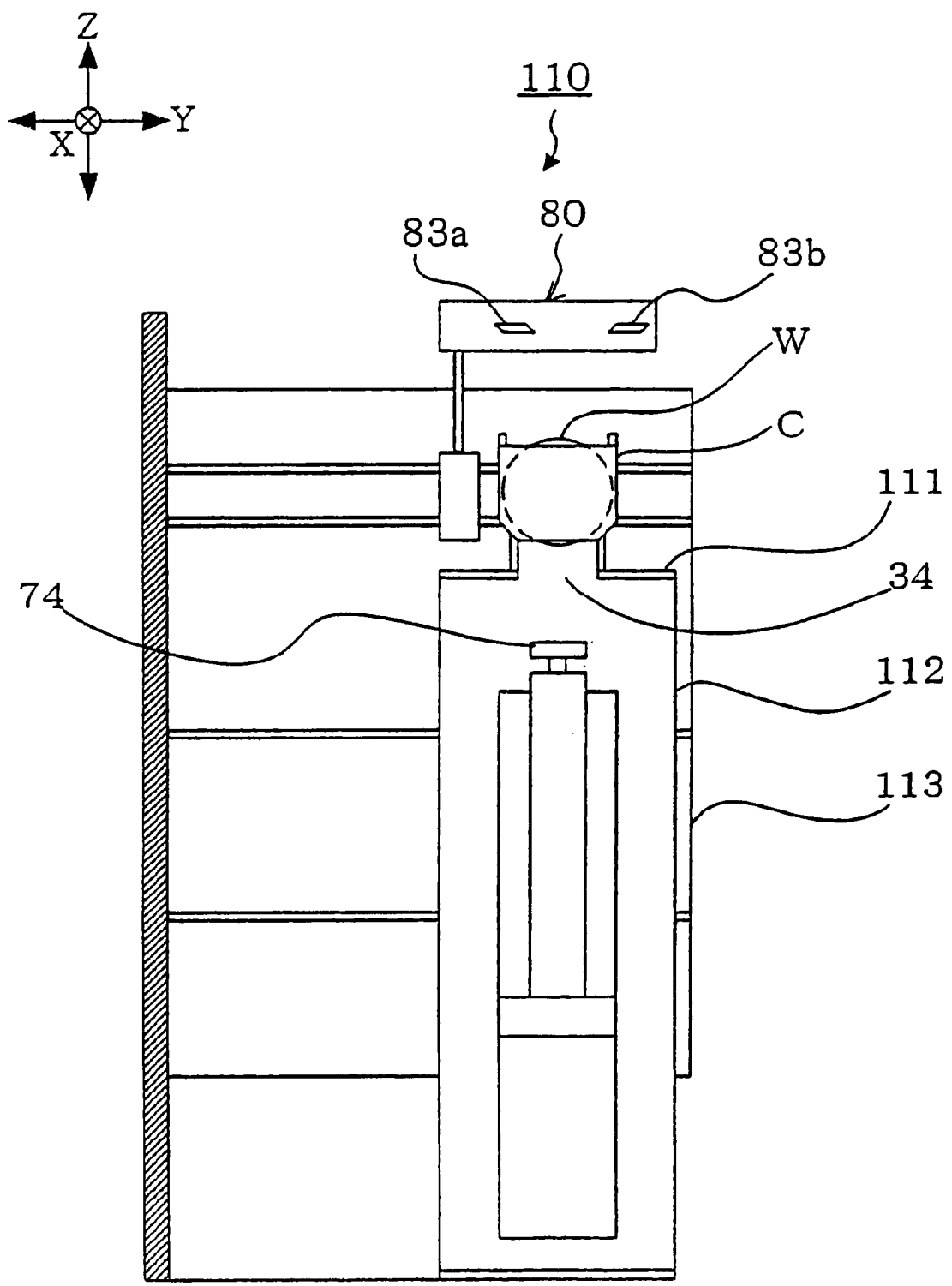
F I G. 27

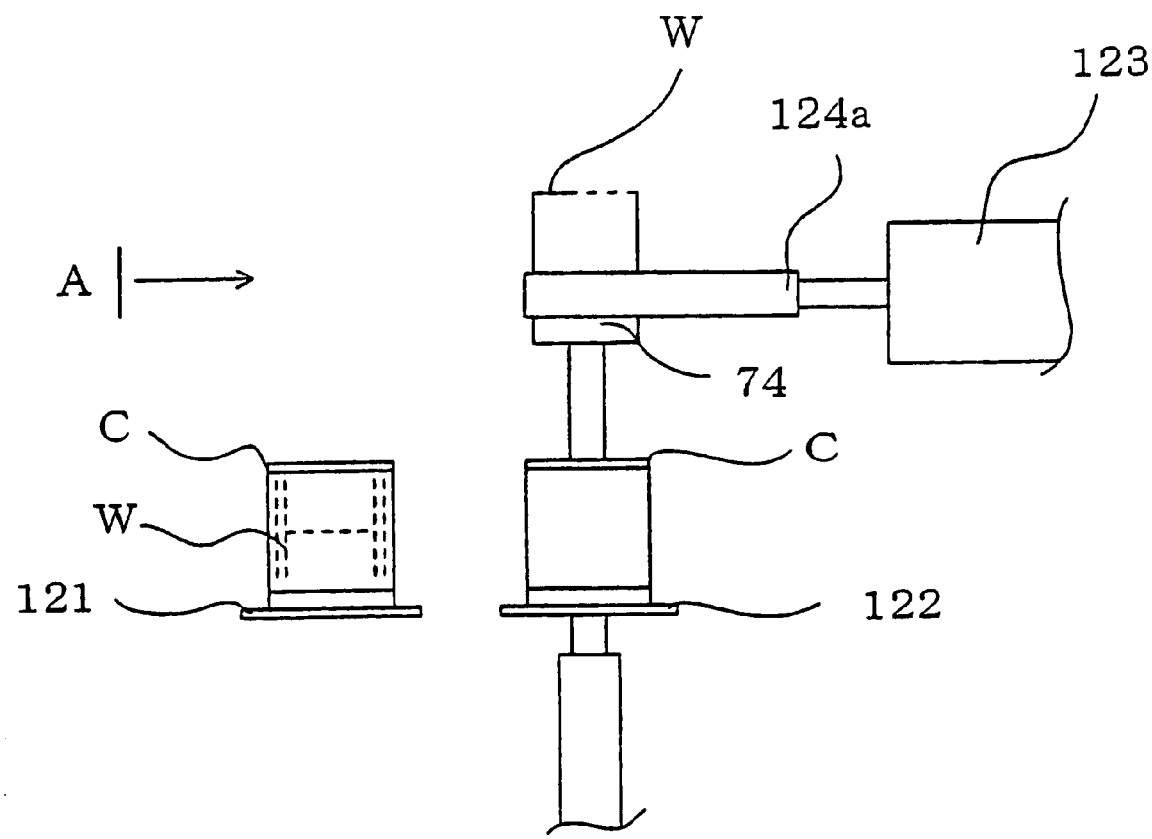
F I G. 32 A
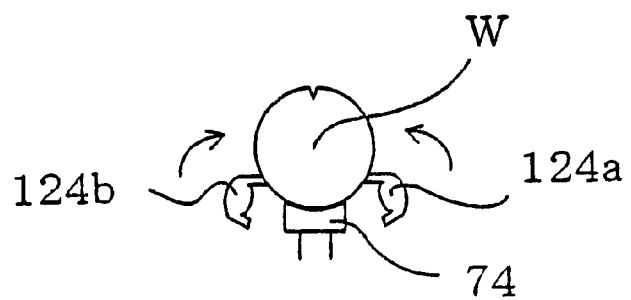
F I G. 32 B

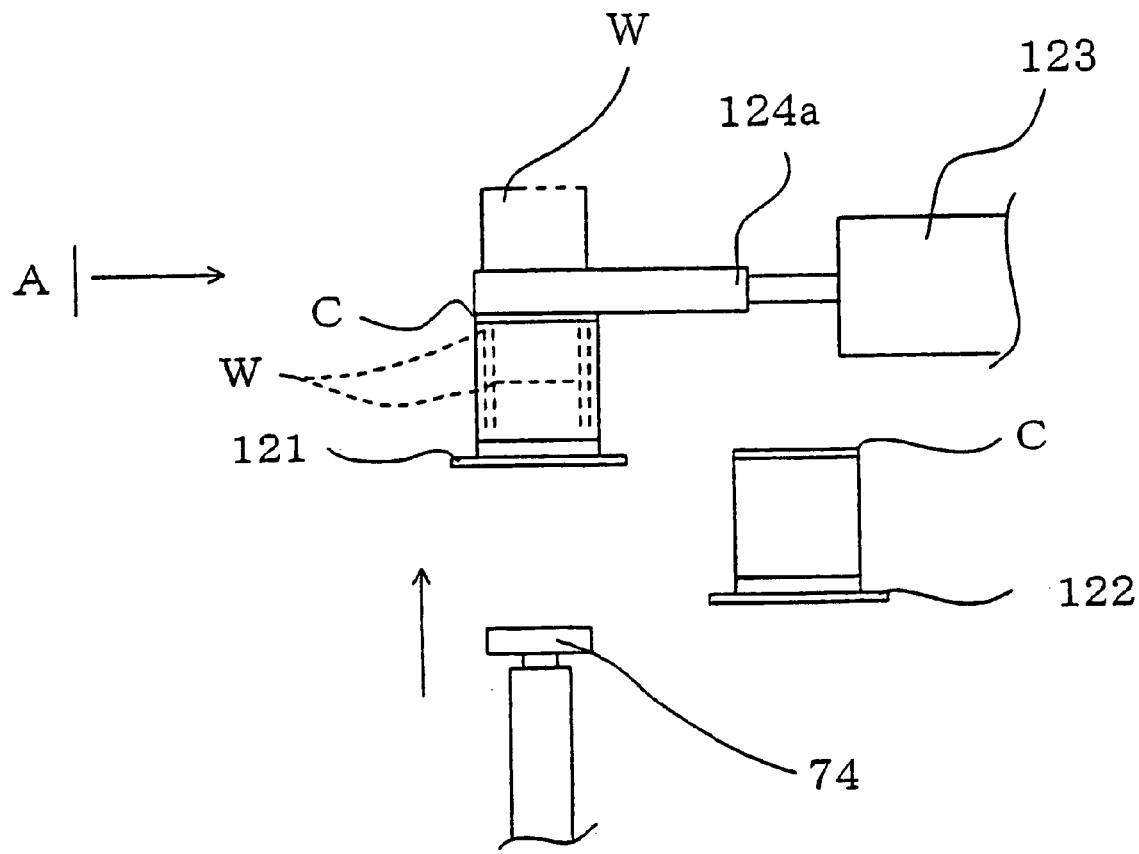
F I G. 35A
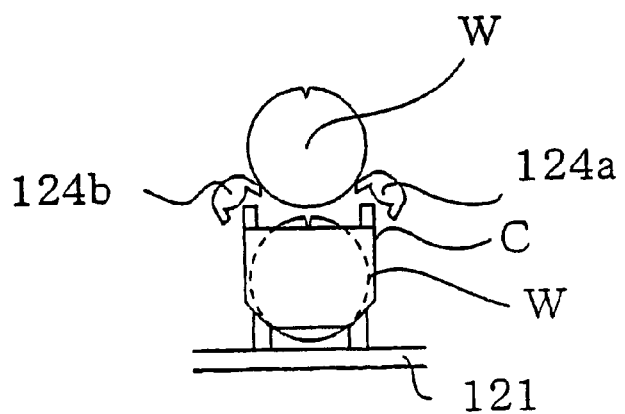
F I G. 35B

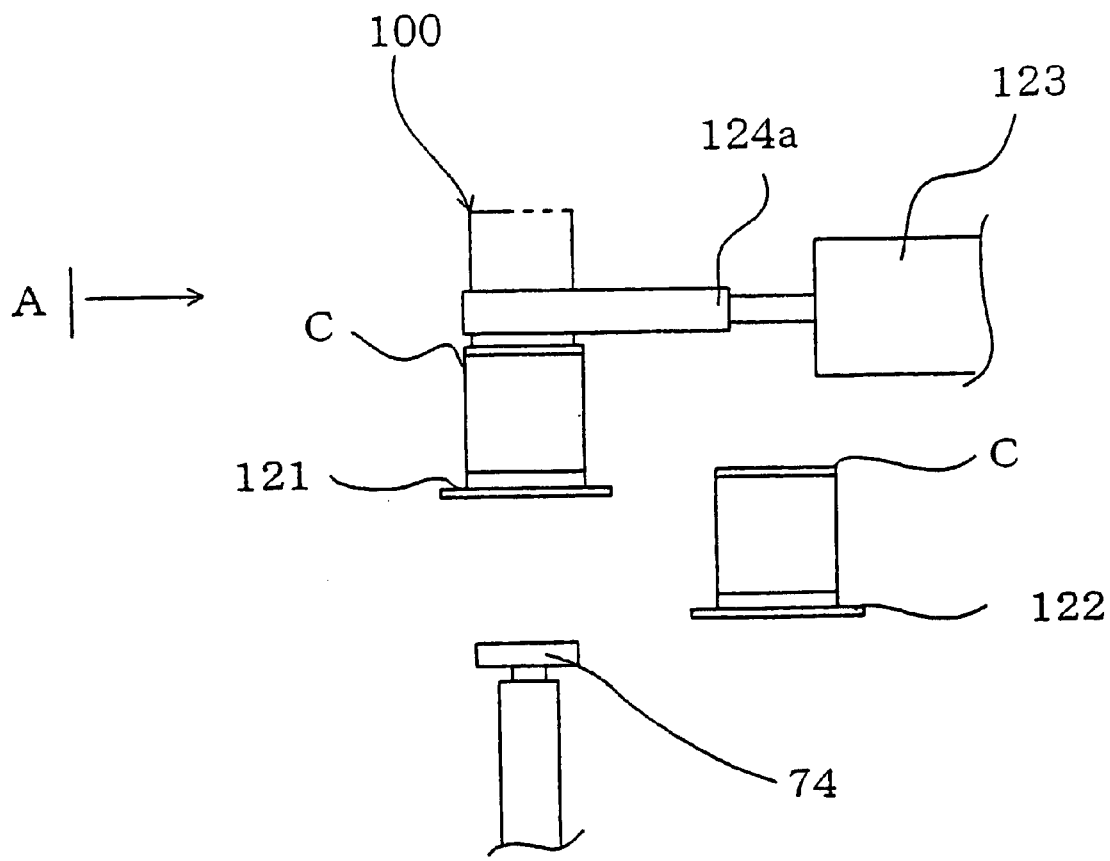
F I G. 37A
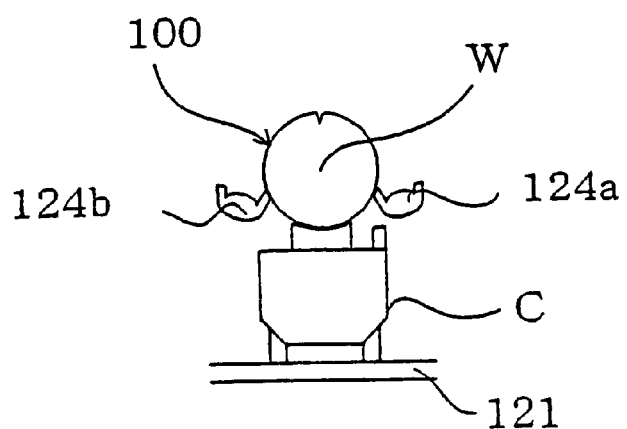
F I G. 37B

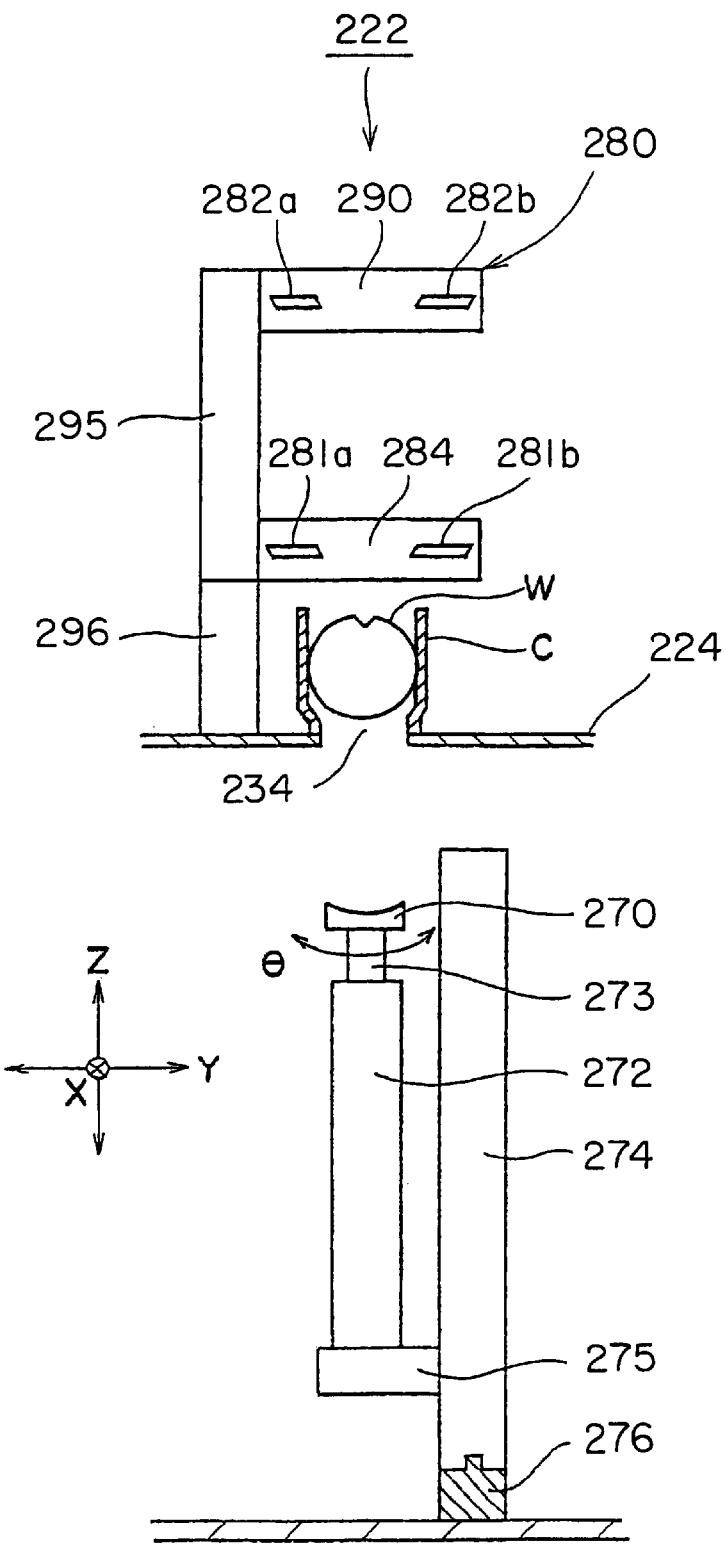
F I G. 41

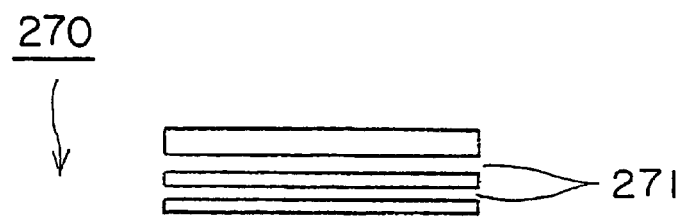
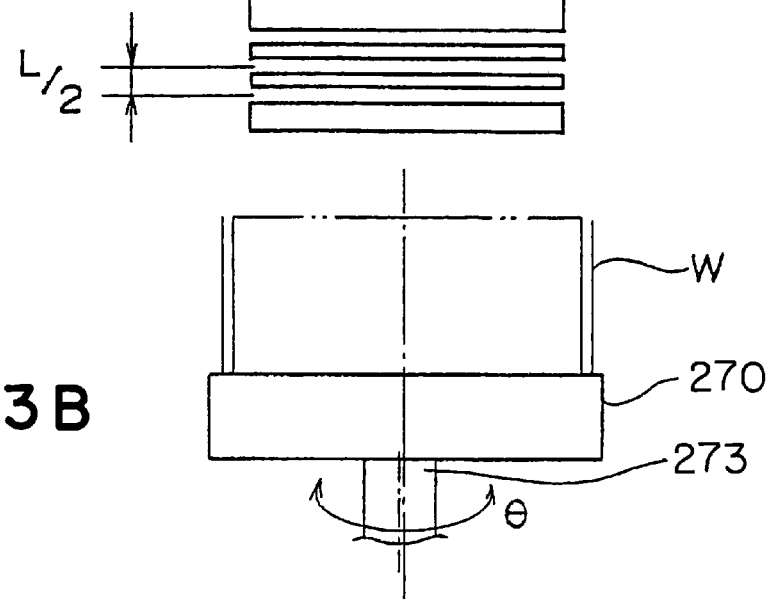
FIG. 43A
FIG. 43B

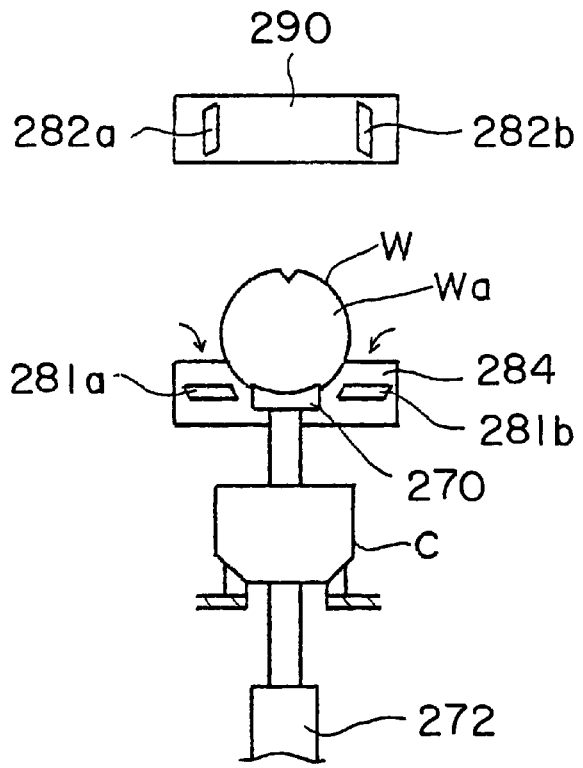
F I G. 48
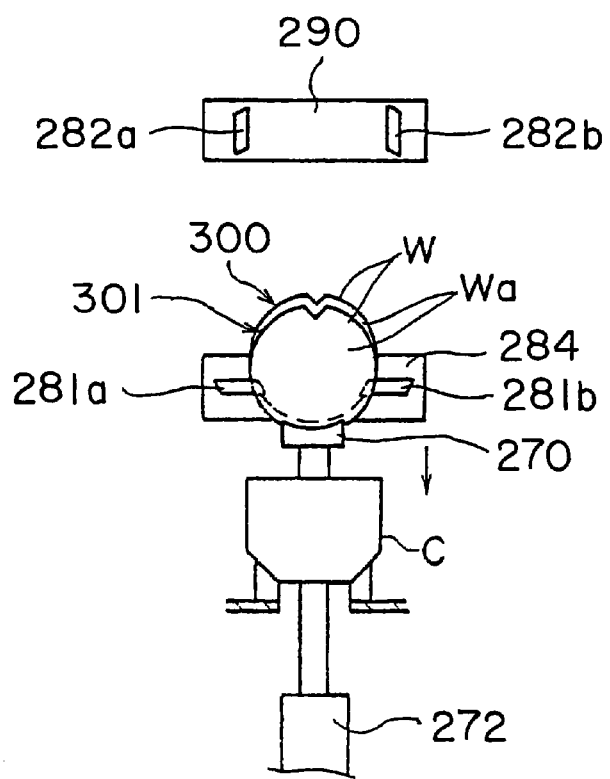
F I G. 49

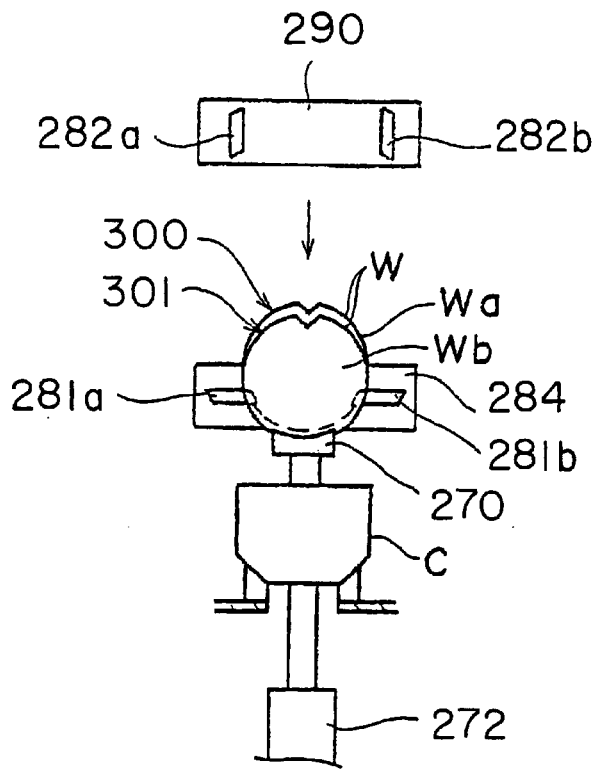
F I G. 52
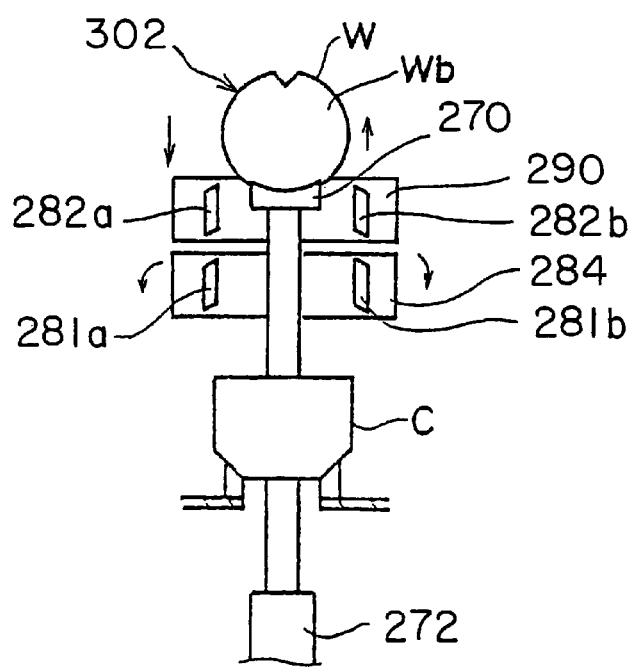
F I G. 53

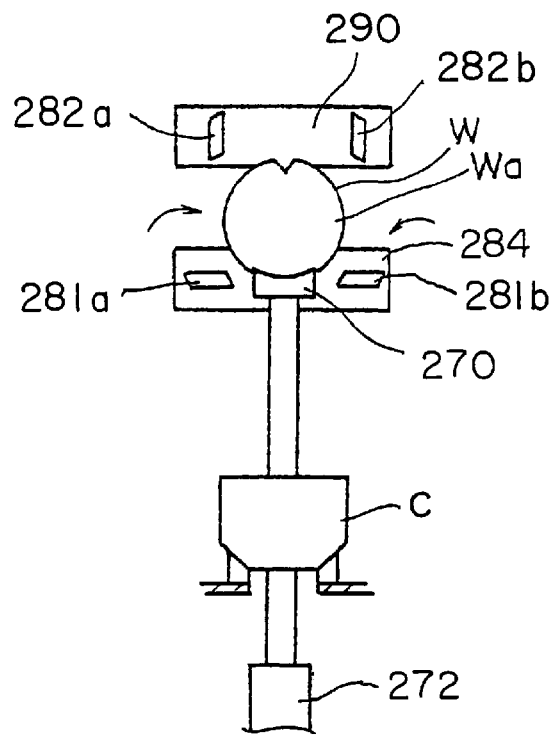
F I G. 76
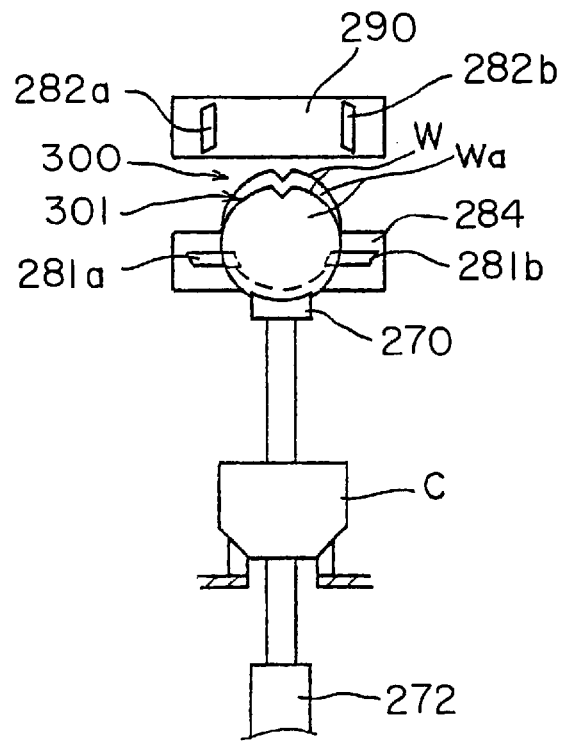
F I G. 77

METHOD AND DEVICE FOR ARRAYING SUBSTRATES AND PROCESSING APPARATUS THEREOF

BACKGROUND OF THE INVENTION

1. Technical Field of the Invention

The present invention relates to a method of arraying substrates, such as semiconductor wafers, a device for arraying the substrates and a processing apparatus of the substrates.

2. Description of the Related Art

For example, in the manufacturing process for semiconductor devices, a cleaning apparatus is used to wash semiconductor wafers (referred to "wafers" hereinafter) as substrates by a designated chemical liquid or a cleaning liquid, such as demineralized water, thereby to remove various contamination adhering to surfaces of the wafers, for example, particles, organic contaminants, metal impurities, etc. Particularly, there is a widely-used cleaning apparatus which dips the wafers in a cleaning bath filled up with the cleaning liquid to clean the wafers.

Japanese Patent No. 2634350 discloses the above-mentioned cleaning apparatus. In the cleaning apparatus, two carriers are loaded and transported to a pickup stage. In each carrier, for example, twenty-six sheets of wafers before cleaning are accommodated. Then, at the pickup stage, it is executed to take twenty-six sheets of wafers out of one carrier collectively. Twenty-six wafers taken out of the carrier in the above way are moved to a wafer-group formation stage to form a group of wafers. Next, it is executed to take twenty-six sheets of wafers out of the other carrier collectively and move the wafers to the upside of twenty-six sheets of wafers standing on the wafer-group formation stage. Subsequently, the wafers taken out of the latter carrier are lowered and successively inserted between the respective wafers taken out of the former carrier, thereby forming a group of fifty-two sheets of wafers (equal to the number of sheets of two carriers). In this way, the resultant group of fifty-two sheets of wafers is transported to a cleaning-and-drying section for cleaning and drying the wafers in batch.

Hereat, before forming the wafer group, the positional adjustment is executed to position twenty-six sheets of wafers taken out of the latter carrier between twenty-six sheets of wafers taken out of the former carrier, respectively. During this insertion, it is noted that twenty-six sheets of wafers taken out of the former carrier do not come in touch with twenty-six sheets of wafers taken out of the latter carrier mutually.

However, the cleaning apparatus disclosed in Japanese Patent No. 2634350 is easy to cause a positional deviation since all the wafers taken out of both carriers are transferred from the pickup stage to the wafer-group formation stage and subjected to the positional adjustment while the wafers are exposed to the outside. Thus, in inserting the wafers of one group between the wafers of the other group, they may be brought into contact with each other for damage. In this way, the conventional cleaning apparatus is unstable in forming the wafer group of fifty-two sheets of wafers. Alternatively, in order to prevent the mutual contact of wafers, the wafer-group formation stage has to be equipped with a feedback mechanism for detecting and correcting the positional deviation in twenty-six wafers taken out of each carrier, thereby causing the apparatus to be complicated with waste of time. Additionally, since it takes a lot of time to move the wafers from the pickup stage to the wafer-group formation stage, the throughput of the apparatus is deteriorated. Due to the provision of the wafer-group formation stage different from the pickup stage, the apparatus is large-sized furthermore.

SUMMARY OF THE INVENTION

Accordingly, it is an object of the present invention to provide a substrate arraying method allowing a substrate group (a group of substrates) to be stably formed in a short time and a substrate arraying device suitable for performing the above substrate arraying method. Additionally, it is another object to provide a small-sized processing apparatus for processing the substrates.

The first feature of the invention resides in a substrate arraying method comprising the steps of: taking a first substrate group out of a first container, the first substrate group consisting of a plurality of substrates arranged at regular intervals in the first container; relatively moving the first substrate group upward of a second container having a second substrate group consisting of a plurality of substrates arranged at regular intervals in the second container, thereby positioning the substrates of the first substrate group between the respective substrates of the second group in plan view; inserting the respective substrates of the second substrate group between the respective substrates of the first substrate group arranged above the second container while raising the substrates of the second group from the inside of the second container, thereby forming a third substrate group consisting of the substrates in number of two containers, the substrates of the third substrate group being arranged at regular intervals being substantial half of the regular intervals of the substrates of the first and second substrate groups.

According to the invention, for example, it is executed on a stage to take a plurality of substrates out of one container. Subsequently, on the same stage, it is executed to take a plurality of substrates out of the other container and insert the plural substrates taken out of the latter container between the plural substrates taken out of the former container, respectively, thereby forming a group of substrates in number of two containers where the resultant substrates are arranged at substantial half of the regular intervals. In this way, owing to the formation of the group of substrates on the identical stage at the time of taking the plural substrates out of the other container, the same formation can be accomplished in a short time, stably. Moreover, as there is no need to prepare an additional stage or space to form the group of substrates, it is possible to miniaturize a processing apparatus for processing the group of substrates.

Again in the present invention, it is also executed to move the plural substrates taken out of the former container to the upside of the latter container relatively, thereby respectively positioning the substrates taken out of the former container between the substrates in the latter container in plan view. Especially, if moving the substrates right above the latter container, it is possible to just insert each one of the plural substrates being taken out of the latter container and also guided by grooves between adjoining ones of the substrates taken out of the former container. Then, with the prevention of contact between the respective substrates taken out of the former container and those taken out of the latter container, it is possible to accomplish the formation of the group of substrates stably. Further, since respective positions of the plural substrates are fixed in the latter container, it is possible to carry out the positioning of the respective substrates taken out of the former container, with ease. Accordingly, the present invention can dispense with a complicated mechanism for detecting and correcting positional differences of the respective substrates.

The second feature of the invention resides in a substrate arraying method further comprising the step of: reversing the respective substrates of the first substrate group, wherein the reversing step is carried out between the step of taking the first substrate group out of the first container and the step of inserting the respective substrates of the second substrate group between the respective substrates of the first substrate group arranged above the second container thereby to form the third substrate group consisting of the substrates in number of two containers, the substrates of the third substrate group being arranged at regular intervals being substantial half of the regular intervals of the substrates of the first and second substrate groups.

According to the above method, after reversing the respective substrates taken out of the former container, the insertion of the substrates is carried out to form the group of substrates. Thus, in such a group of substrates, both front and back faces of one substrate can be confronted by the front face and the back face of the adjoining substrate, respectively. Therefore, it is possible to prevent, for example, particles peeled off the back face of the substrate from sticking to the front face of the adjoining substrate.

The third feature of the invention resides in a substrate arraying method wherein the step of positioning the substrates of the first substrate group between the respective substrates of the second group in plan view, is carried out by relatively moving the first substrate group upward of the second container while supporting the first substrate group pushed upward; and the step of inserting the respective substrates of the second substrate group between the respective substrates of the first substrate group arranged above the second container thereby to forming the third substrate group while raising the substrates of the second group from the inside of the second container, is carried out by pushing up the substrates of the second substrate group while being guided by grooves in the second container.

The fourth feature of the invention resides in a substrate arraying apparatus comprising: a substrate supporting member capable of supporting the substrates at regular intervals of (1/2)L being half of substrate accommodating intervals of L in a container capable of accommodating N sheets of substrates therein, the substrate supporting member capable of both taking a substrate group consisting of N sheets of substrates being arranged in the container out of the container and supporting the substrate group at regular intervals of L as they are; and a substrate delivering member capable of both receiving the substrate group of N sheets of substrates arranged at regular intervals of L from the substrate supporting member and delivering the substrate group of N sheets of substrates to the substrate supporting member as they are; wherein the substrate arraying device carries out the steps of: taking a first substrate group of N sheets of substrates arranged at regular intervals of L, out of a first container and allowing the substrate supporting member to support the substrates at regular intervals of L; delivering the first substrate group supported by the substrate supporting member at regular intervals of L, to the substrate delivering member and allowing the substrate delivering member to support the substrates at regular intervals of L; taking a second substrate group of N sheets of substrates arranged at regular intervals of L, out of a second container and allowing the substrate supporting member to support the substrates at regular intervals of L; positioning the first substrate group of substrates, which are supported by the substrate delivering member at regular intervals of L, between the respective substrates of the second substrate group being supported on the substrate supporting member at regular intervals of L, respectively; and forming a third substrate group consisting of 2N sheets of substrates, in which the substrates of the first substrate group and the substrates of the second substrate group are alternately arranged in the substrate supporting member at intervals of (1/2)L.

According to this invention, for example, two containers are mounted on a stage. Thereafter, carrier means takes a plurality of substrates out of one container while arranging the substrates at regular intervals. Then, delivering means receives the plural substrates from the carrier means. Next, the carrier means takes a plurality of substrates out of the other container under condition that they are arranged at regular intervals and further inserts the respective substrates from the other container between the respective substrates carried by the delivering means, respectively. In this way, there is established, on the carrier means, a substrate group where the substrates in number of two containers are arranged at substantial half of the above regular intervals. Thus, on the identical stage, there are executed to take the plural substrates out of the containers and form the group of substrates.

In case of one mounting space for one container on the stage, the container on one side is firstly mounted on the stage. After taking out the plural substrates, the vacant container is withdrawn to ensure a space on the stage. Next, the container on the other hand is mounted on the stage and then, the plural substrates are taken out of the container, thereby establishing the group of substrates.

The fifth feature of the invention resides in a substrate arraying apparatus further comprising a stage for mounting the container and a transfer table supporting the container from its downside thereby to both loading and unloading the container to and from the stage.

The sixth feature of the invention resides in a substrate arraying apparatus wherein the transfer table is provided with a sensor for detecting a condition of the substrates being accommodated in the container.

The seventh feature of the invention resides in a substrate arraying apparatus further comprising a stock section for stocking the container, wherein the transfer table carries out both loading the container into the stock section and unloading the container from the stock section.

The eighth feature of the invention resides in a substrate arraying apparatus further comprising a first stage for mounting the first container thereon and a second stage for mounting the second container thereon; wherein the substrate supporting member is movable from the first stage to the second stage; and the substrate supporting member includes: a first substrate supporting member for taking the substrates of the first substrate group out of the first container and delivering the substrates of the first substrate group to the substrate delivering member, the first substrate supporting member being arranged below the first stage; and a second substrate supporting member for taking the substrates of the second group out of the second container and receiving the substrates of the first substrate group from the substrate delivering member, the second substrate supporting member being arranged below the second stage.

The ninth feature of the invention resides in a substrate arraying apparatus wherein either the substrate supporting member or the substrate delivering member is constructed so as to be rotatable.

The tenth feature of the invention resides in a substrate arraying method comprising the steps of: taking a substrate group out of a container, the substrate group consisting of a plurality of substrates vertically arranged in the container at regular intervals, thereby to divide the substrates into a first substrate group of substrates arranged at regular intervals and a second group of substrates arranged at regular intervals; relatively moving the first substrate group upward of the second substrate group, thereby positioning the respective substrates of the second substrate group between the respective substrates of the first substrate group in plan view; and relatively raising the substrates of the second substrate group against the first substrate group and inserting the substrates of the second substrate between the substrates of the first substrate group arranged above the second substrate group, thereby forming a third substrate group consisting of the substrates in number of one container, the substrates of the third substrate group being arranged at regular intervals being substantial half of the regular intervals of the substrates of the first and second substrate groups.

According to this method, the plural substrates in the container are divided into general halves: one group and the other group of substrates. Subsequently, it is executed to either insert the respective substrates of one group between the respective substrates of the other group or insert the latter substrates between the former substrates, thereby forming a group of substrates which are arranged at substantial half of the regular intervals. Thus, the so-completed group allows its width of the whole substrates to be reduced to half of the width of the whole substrates arranged at the regular intervals. Accordingly, with the reduction in width of the whole substrates to be processed, it is possible to reduce a size of the processing apparatus for processing the so-arranged substrates. Also, with the reduction in size of the apparatus, it is possible to reduce consumption of both processing liquid and processing gas in the apparatus.

The eleventh feature of the invention resides in a substrate arraying method further comprising the step of reversing the substrates of either the first substrate group or the second substrate group, wherein the reversing step is carried out between the step of taking the substrates out of the container thereby to divide the substrates into the first substrate group of substrates and the second substrate group of substrates arranged at regular intervals and the step of forming the third group of substrates where the substrates in number of one container are arranged at regular intervals being substantial half of the regular intervals of the substrates of the first and second substrate.

According to the above method, after reversing the respective substrates of either one group or the other group, it is executed to either insert the respective substrates of one group between the respective substrates of the other group or insert the latter substrates between the former substrates. Therefore, also in the group of substrates arranged at substantial half of the regular intervals, both front and back faces of one substrate can be confronted by the front face and the back face of the adjoining substrate, respectively. That is, it is possible to prevent, for example, a particle peeled off the back face of the substrates from sticking to the front face of the adjoining substrate.

The twelfth feature of the invention resides in a substrate arraying method wherein the reversing step is executed by rotating the substrates of the first substrate group or the substrates of the second substrate group about a vertical axis thereof.

The 13th feature of the invention resides in a substrate arraying method wherein the step of dividing the substrates into the first substrate group and the second substrate group is executed by relatively moving the substrates of the first substrate group to the substrates of the second substrate group up and down.

In this case, as for which of both groups is to be moved up and down, either one group or the other group will be done. Of course, both of groups may be moved up and down.

The 14th feature of the invention resides in a substrate arraying method wherein the step of dividing the substrates into the first substrate group and the second substrate group is executed by relatively moving the substrates of the first substrate group to the substrates of the second substrate group horizontally.

Also in this case, as for which of both groups is to be moved horizontally, either one group or the other group will be done. Of course, both of groups may be moved up and down.

The 15th feature of the invention resides in a substrate arraying method wherein the substrates taken out of the container and arranged at regular intervals are mounted on the substrate supporting member; substantial half of the substrates on one side of the substrate supporting member are supported as the first substrate group by the substrate delivering member; the remaining half of the substrates on the other side of the substrate supporting member are positioned as the second substrate group below the first substrate group of substrates; and the horizontal movement to position the respective substrates of the second substrate group between the respective substrates of the first substrate group in plan view, is carried out by rotating the substrate supporting member about a vertical axis passing through a position deviated from the center of the substrate supporting member.

The 16th feature of the invention resides in a substrate arraying method further comprising, after forming the third substrate group where the substrates in number of one container are arranged at regular intervals being substantial half of the regular intervals of the substrates of the first and second substrate, the steps of: forming a fourth substrate group where the substrates in number of one container are arranged at regular intervals being substantial half of the regular intervals of the substrates of the first and second substrate group, in the same way as forming the third group; and arranging the third substrate group adjacently to the fourth substrate group, in series.

According to the above method, for example, if two small groups each having a plurality of substrates arranged at substantial half of the regular intervals are arranged adjacently in series, then the resultant large group has a number of substrates corresponding to two containers while having the same width as the plural substrates (of one small group) are arranged at the regular intervals. Accordingly, in the processing apparatus to process such the substrates, an improvement in its throughput can be attained without being large-sized.

The 17th feature of the invention resides in a substrate arraying method comprising the steps of: moving a first container to a stage, the first container having a plurality of substrates arranged at regular intervals; taking the substrates at regular intervals out of the first container at the stage thereby forming a first substrate group where the substrates are arranged at regular intervals being substantial half of the regular intervals; moving a second container to the stage, the second container also having a plurality of substrates arranged at regular intervals; taking the substrates at regular intervals out of the second container at the stage thereby forming a second substrate group where the substrates are arranged at regular intervals being substantial half of the regular intervals; and arranging the first substrate group adjacently to the second substrate group in series, thereby forming a third group where a distance between the outermost substrate of the first substrate group and the outermost substrate of the second substrate group is also substantial half of the regular intervals.

The 18th feature of the invention resides in a substrate arraying method further comprising the steps of: allowing the first substrate group to waiting above the stage after the first substrate group has been formed; and allowing the first substrate group waiting above the stage to descend against the second substrate group after the second substrate group has been formed, thereby forming the third substrate group.

The 19th feature of the invention resides in a substrate arraying apparatus comprising: a substrate supporting member capable of supporting substrates at regular intervals of (1/2)L being half length of substrate accommodating intervals in a carrier; a first substrate delivering member capable of receiving substrates in substantial-half number of substrates supported by the substrate supporting member and accommodated in the container at regular intervals of L, from the substrate supporting member thereby to support the substrates; and a second substrate delivering member capable of receiving all number of substrates accommodated in the container, at regular intervals of (1/2)L from the substrate supporting member thereby to support the substrates.

The 20th feature of the invention resides in a substrate arraying apparatus further comprising a stage for mounting the container and a transfer table supporting the container from its downside thereby to both loading and unloading the container to and from the stage.

The 21th feature of the invention resides in a substrate arraying apparatus further comprising a stock section for stocking the container, wherein the transfer table carries out both loading the container into the stock section and unloading the container from the stock section.

The 22th feature of the invention resides in a substrate arraying apparatus wherein the transfer table is provided with a sensor for detecting a condition of the substrates being accommodated in the container.

The 23th feature of the invention resides in a substrate arraying apparatus wherein the substrate supporting member is adapted so as to be relatively movable to the container up and down; and at least either the substrate supporting member or the first substrate delivering member, or at least either the substrate supporting member or the second substrate delivering member, is adapted so as to be rotatable in a horizontal plane.

The 24th feature of the invention resides in a substrate arraying apparatus wherein the second substrate delivering member is arranged above the first substrate delivering member; and the first substrate delivering member and the second substrate delivering member are adapted so as to be relatively movable to the substrate supporting member up and down.

The 25th feature of the invention resides in a substrate arraying apparatus wherein the first substrate delivering member and the second substrate delivering member are adapted so as to be relatively movable to the substrate supporting member horizontally.

BRIEF DESCRIPTION OF THE DRAWINGS

FIG. 1 is a perspective view of a cleaning apparatus equipped with a wafer arraying device in accordance with one embodiment of the present invention;

FIG. 15 is an explanatory diagram of the third process to array the wafers in the wafer arraying device of FIG. 8;

FIG. 16 is an explanatory diagram of the fourth process to array the wafers in the wafer arraying device of FIG. 8;

FIG. 21 is an explanatory diagram of the ninth process to array the wafers in the wafer arraying device of FIG. 8;

FIG. 22 is an explanatory diagram of the tenth process to array the wafers in the wafer arraying device of FIG. 8;

FIG. 27 is an explanatory diagram of the wafer arraying device in accordance with the second embodiment of the invention, viewed from the front side of the cleaning device;

FIG. 32A is an explanatory diagram of the third process to array the wafers in the cleaning apparatus of FIG. 28;

FIG. 32B is a diagram viewed in a direction A of FIG. 32A;

FIG. 35A is an explanatory diagram of the sixth process to array the wafers in the cleaning apparatus of FIG. 28;

FIG. 35B is a diagram viewed in a direction A of FIG. 35A;

FIG. 37A is an explanatory diagram of the eighth process to array the wafers in the cleaning apparatus of FIG. 28;

FIG. 37B is a diagram viewed in a direction A of FIG. 37A;

FIG. 41 is an explanatory diagram of the wafer arraying device in accordance with the fourth embodiment of the invention, viewed from the front side of the cleaning device;

FIG. 43A is an explanatory diagram showing the wafer hand in its plan view;

FIG. 43B is an explanatory diagram showing the wafer hand in its side view;

FIG. 48 is an explanatory diagram of the third process to array the wafers in the wafer arraying device of FIG. 41;

FIG. 49 is an explanatory diagram of the fourth process to array the wafers in the wafer arraying device of FIG. 41;

FIG. 52 is an explanatory diagram of the seventh process to array the wafers in the wafer arraying device of FIG. 41;

FIG. 53 is an explanatory diagram of the eighth process to array the wafers in the wafer arraying device of FIG. 41;

FIG. 76 is an explanatory diagram of the third process to array the wafers in the wafer arraying device of FIG. 73;

FIG. 77 is an explanatory diagram of the fourth process to array the wafers in the wafer arraying device of FIG. 73;

DESCRIPTION OF THE PREFERRED EMBODIMENT

Figure 2:
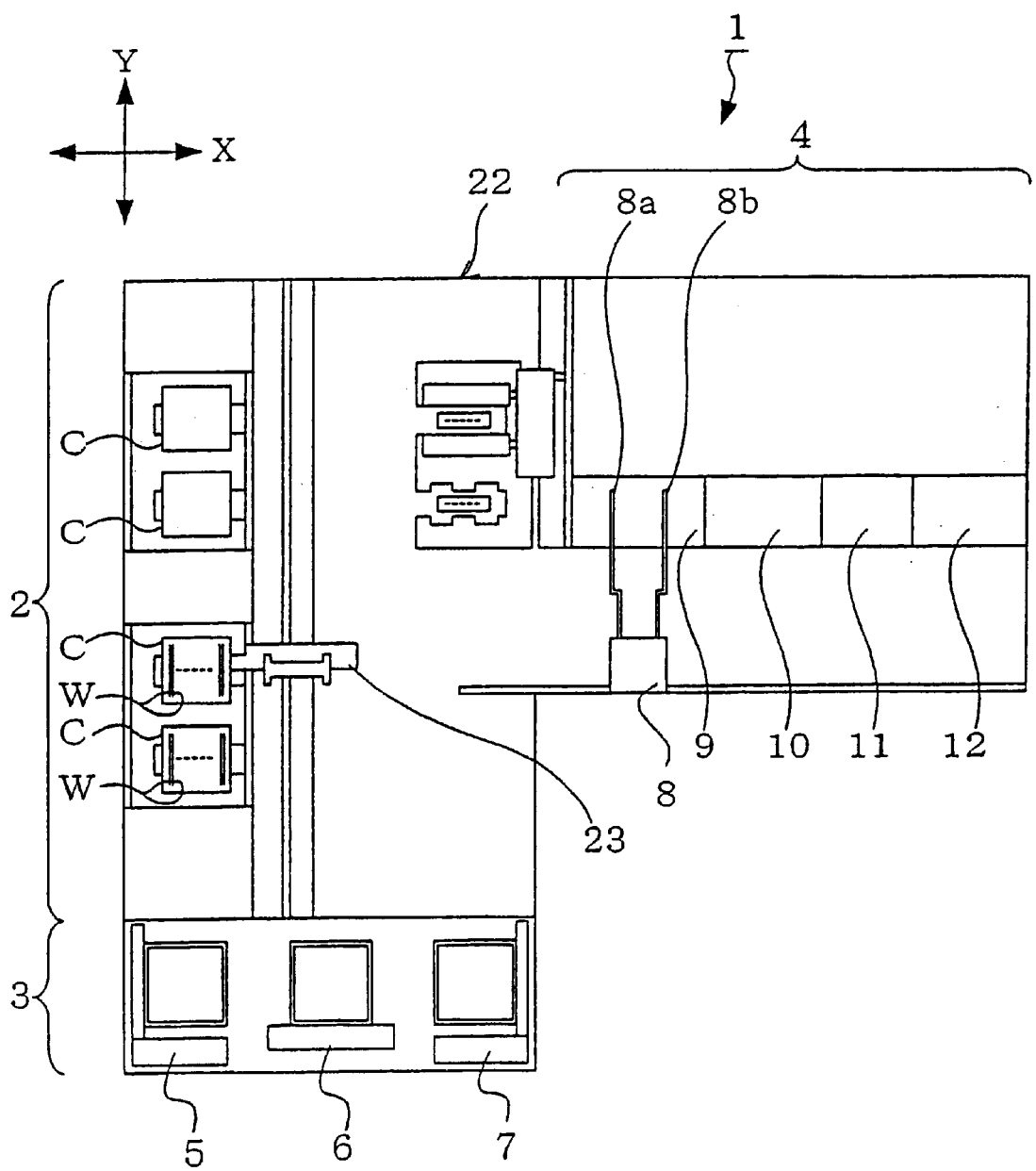
FIG. 2 is a plan view of the cleaning apparatus of FIG. 1.

Embodiments of the present invention will be described below, with reference to figures. In a cleaning apparatus constructed so as to carry out a loading process for a batch of wafers, a cleaning process, a drying process and an unloading process consistently, this first embodiment relates to a wafer arraying device as a constituent of the cleaning apparatus. FIG. 1 is a perspective view of the cleaning apparatus 1 equipped with the wafer arraying device 22 of the first embodiment. FIG. 2 is a plan view of the cleaning apparatus 1.

The cleaning apparatus 1 includes a carrier loading-and-unloading section 2 to carry out the loading-and-unloading operation for containers, for example, carriers C, a stock section 3 to store the carriers C and a cleaning-and-drying section 4 to apply a designated cleaning process on wafers W.

The carrier loading-and-unloading section 2 is constructed so as to perform a series of actions from the loading of each carrier C accommodating the not-cleaned wafers W until the wafers W are taken out of each carrier C and also a series of actions from the accommodation of the cleaned wafers W in the carrier C until it is discharged.

In the stock section 3, there are arranged a stock unit 5 to store the carriers C vertically, an elevating mechanism 6 to move the carriers C up and down and a stock unit 7 in a row. In this case, the elevating mechanism 6 is constructed so as to receive the carrier C from a movable table 23 mentioned later; further move the so-brought carrier C up and down thereby to load it into a vacant position of the left stock unit 5 or the same of the right stock unit 7; and also unload the carrier C from the stock unit 5 or the stock unit 7 to deliver the carrier C to the movable table 23. Further, the stock units 5, 7 may be adapted so as to move the carrier C up and down whereby the carrier C can be transferred between the stock units 5, 7 and the elevating mechanism 6, freely.

The cleaning-and-drying section 4 is equipped with a transfer arm 8 for transferring the wafers W to and from the carrier loading-and-unloading section 2. The transfer arm 8 can open and close and also includes two wafer chucks 8a, 8b which are expandable in the direction Y of FIG. 2. Further in the cleaning-and-drying section 4, there are arranged, in order from the carrier loading-and-unloading section 2, a drying device 9 for drying the wafers W by using e.g. IPA (isopropyl alcohol) vapor, a chemical-and-rinse cleaning device 10 that carries out a chemical cleaning (chemical treatment) against the wafers W while using a cleaning liquid mainly composed of chemical components and a subsequent rinse cleaning (rinsing treatment) against the wafer W while using the demineralized water, a wafer chuck cleaning-and-drying device 11 for cleaning and drying the wafer chucks 8a, 8b of the transfer arm 8 and a chemical-and-rinse cleaning device 12 that carries out a chemical cleaning (chemical treatment) against the wafers W while using a cleaning liquid mainly composed of chemical components different from that of the above device 10 and a subsequent rinse cleaning (rinsing treatment) against the wafer W while using the demineralized water.

Figure 3:
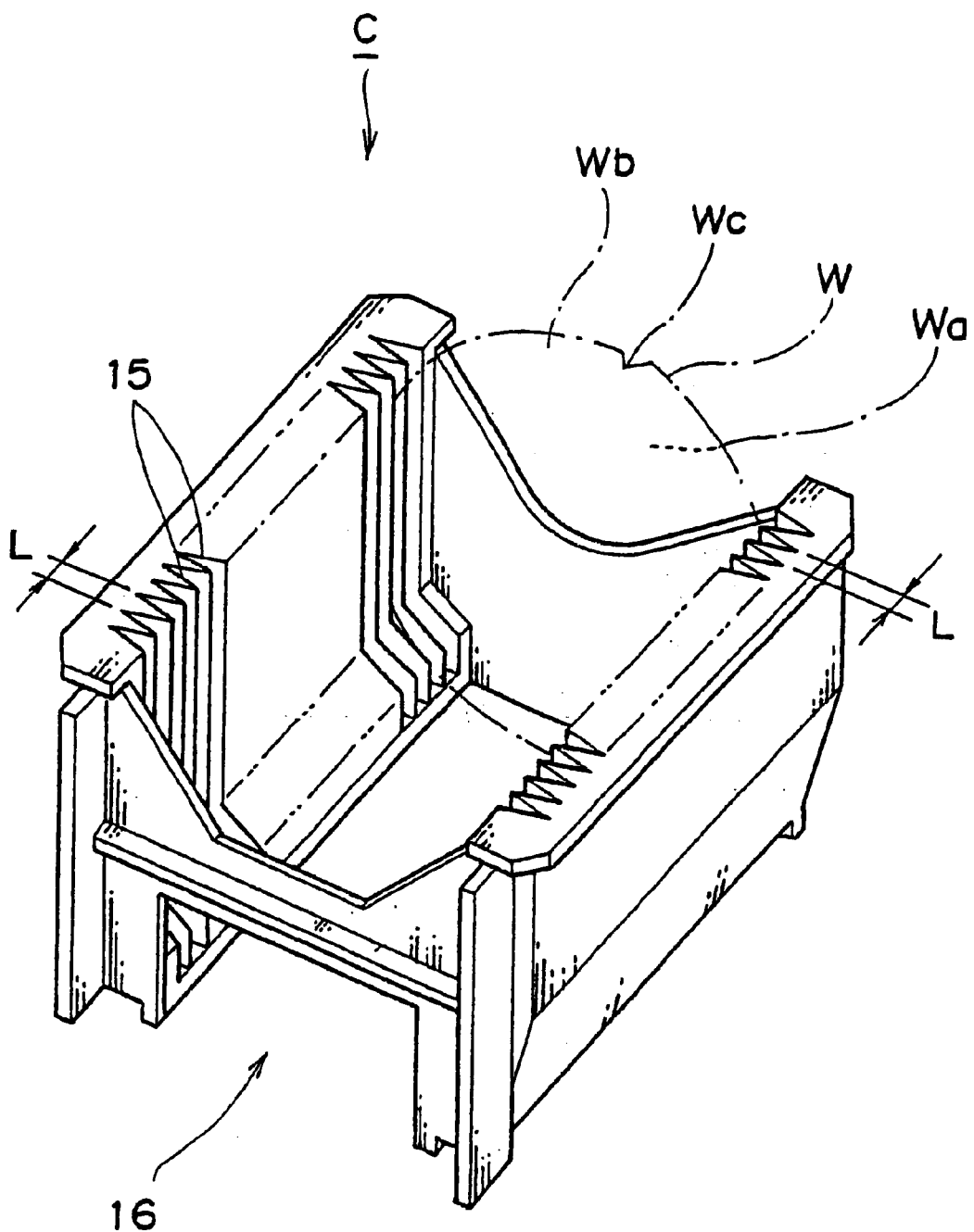
FIG. 3 is a perspective view of a carrier.

FIG. 3 is a perspective view of the carrier C. The carrier C is provided, on each side thereof syrmmetrically, with twenty-six grooves 15 for holding the wafers W in their upright conditions. These grooves 16 are arranged at regular intervals of L (e.g. 6.35 mm in case of holding the "8-inches" wafers). Thus, the carrier C allows twenty-six sheets of wafers W to be accommodated therein at regular intervals L. Respective surface Wa of the wafers W accommodated in the carrier C all look in the same direction. In the state shown in FIG. 3, the surfaces Wa of the wafers W all look back (rear side of FIG. 3), while back faces Wb of the wafers W look forward (front side of FIG. 3). An opening 16 is defined on the bottom side of the carrier C. On a stage, for example, a pickup-and-accommodation stage 24 mentioned later, when a rising wafer hand 74 enters into the carrier C through the opening 16, twenty-six sheets of wafers W are collectively projected from the carrier C upward. Note, each wafer W is circular-shaped and provided, partially in the circumference, with a cutout called "notch Wc".

Figure 4:
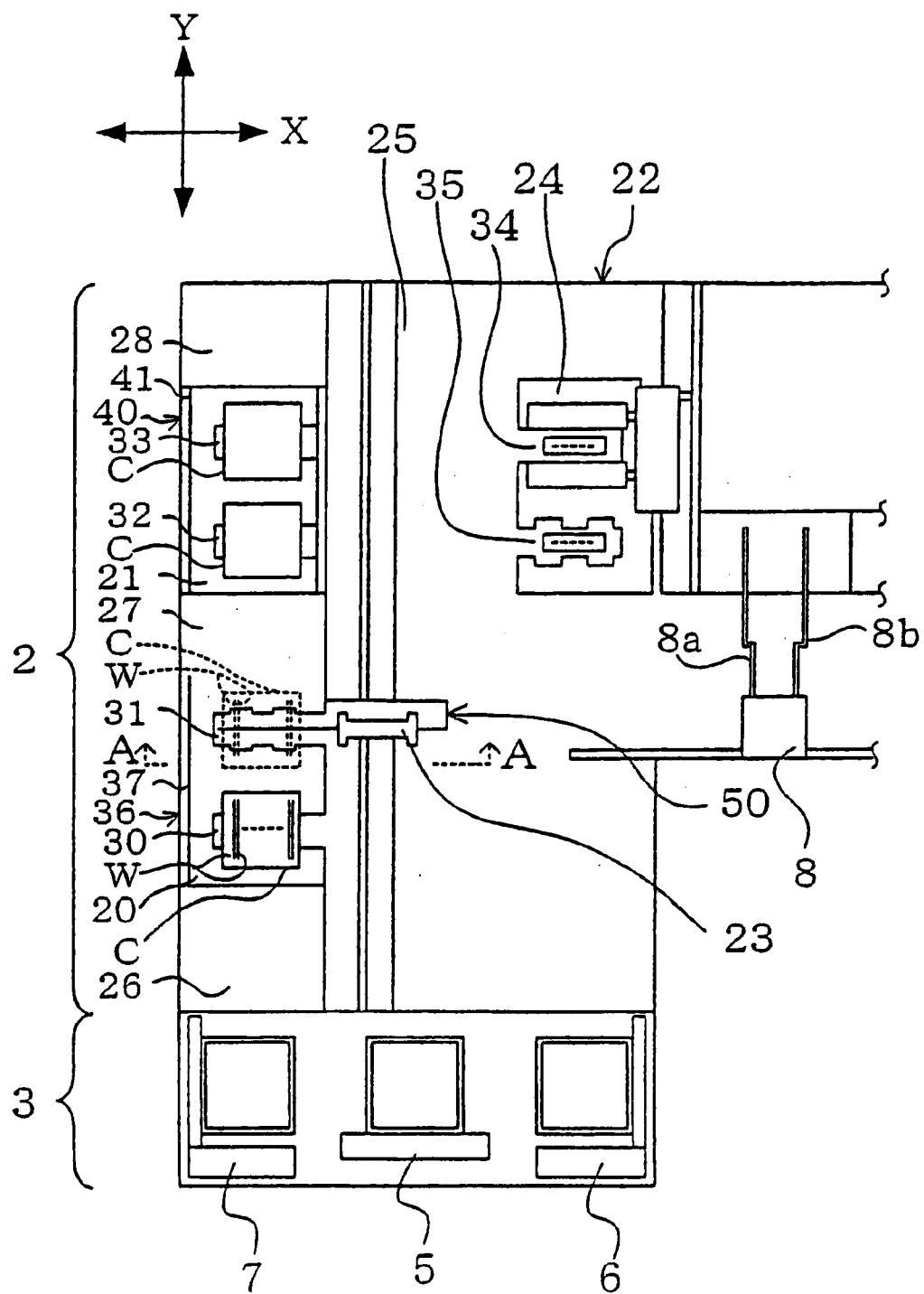
FIG. 4 is an enlarged plan view of an essential part of the cleaning apparatus of FIG. 1.

As shown in FIG. 4, the carrier loading-and-unloading section 2 includes a loading stage 20 for loading the carriers C thereinto, an unloading stage 21 for unloading the carriers C therefrom, a wafer arraying device 22 of the first embodiment and a transfer table 23 for moving the carriers C among the loading stage 20, the unloading stage 21 and the wafer arraying device 22. In the wafer arraying device 22, the pickup-and-accommodation stage 24 is provided to take the wafers W before cleaning out of the carrier C and also accommodate the cleaned wafer W into the carrier C. Between the pickup-and-accommodation stage 24 and the loading stage 20 and also between the stage 24 and the unloading stage 21, there is provided a transfer passage 25 on which the transfer table 23 moves horizontally.

Figure 5:
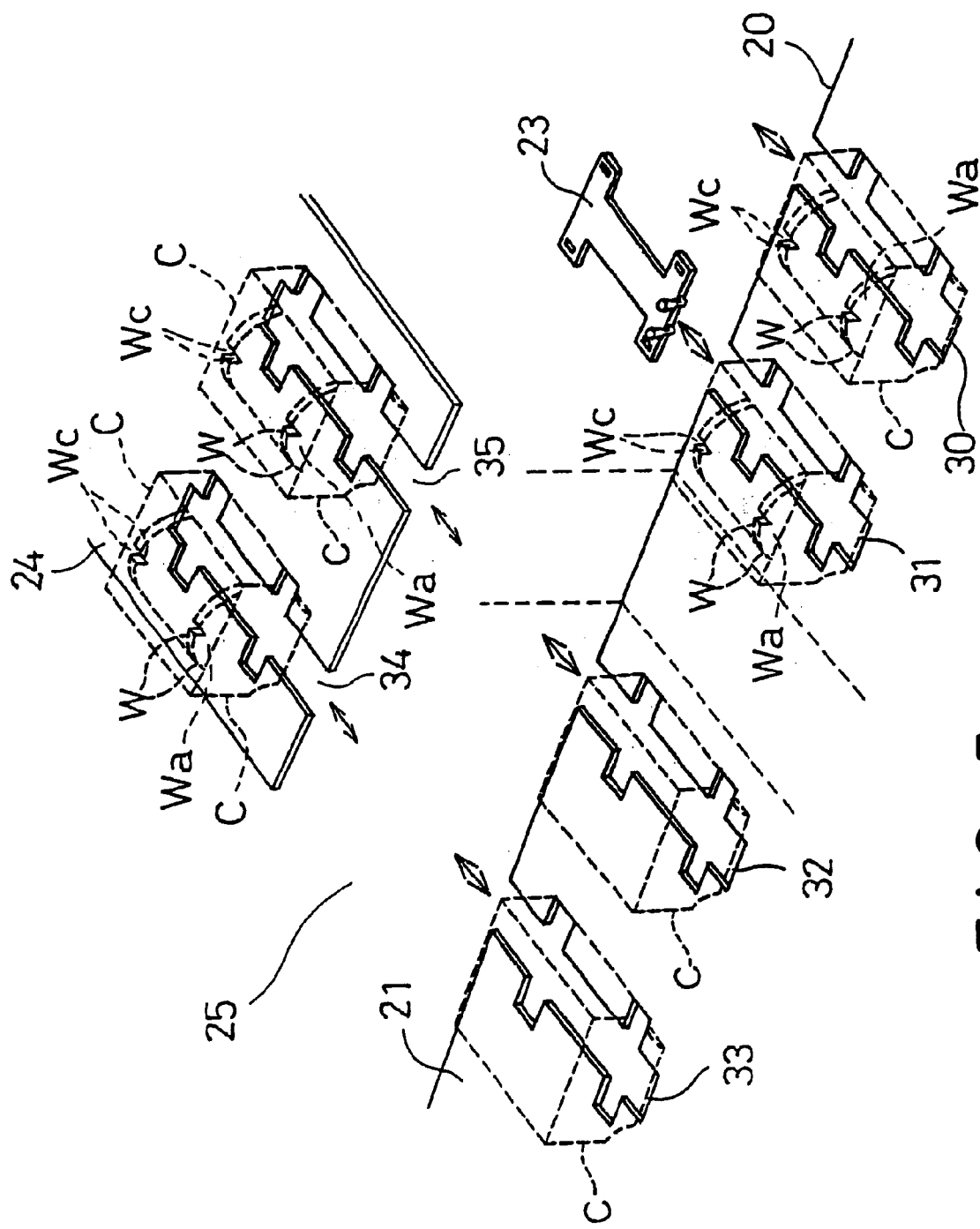
FIG. 5 is a perspective view of a loading stage, an unloading stage, a pickup-and-accommodating stage and a moving table, showing a state to move the carrier.

The loading stage 20 is fixed on sidewalls 26, 27, while the unloading stage 21 is fixed on sidewalls 27, 28. As shown in FIG. 5, the loading stage 20 is provided, on its top face, with opened stations 30, 31. Similarly, respective stations 32, 33 are formed on a top face of the unloading stage 21. Respective stations 34, 35 are formed on a top face of the pickup-and-accommodation stage 24. The carrier C is adapted, through its under face, to ride on respective peripheries of the opened stations 30–35. Then, once the carrier C is mounted on e.g. the loading stage 20, the wafers W in the carrier C are arranged so as to direct the notches Wc upward, by an alignment unit (not shown). By way of example shown in FIG. 5, the surfaces Wa of the respective wafers W in the carriers C mounted on the loading stage 20 and the pickup-and-accommodation stage 24 have their surfaces Wa directing to the front of the cleaning apparatus 1 (i.e. front side of FIG. 5).

Figure 6:
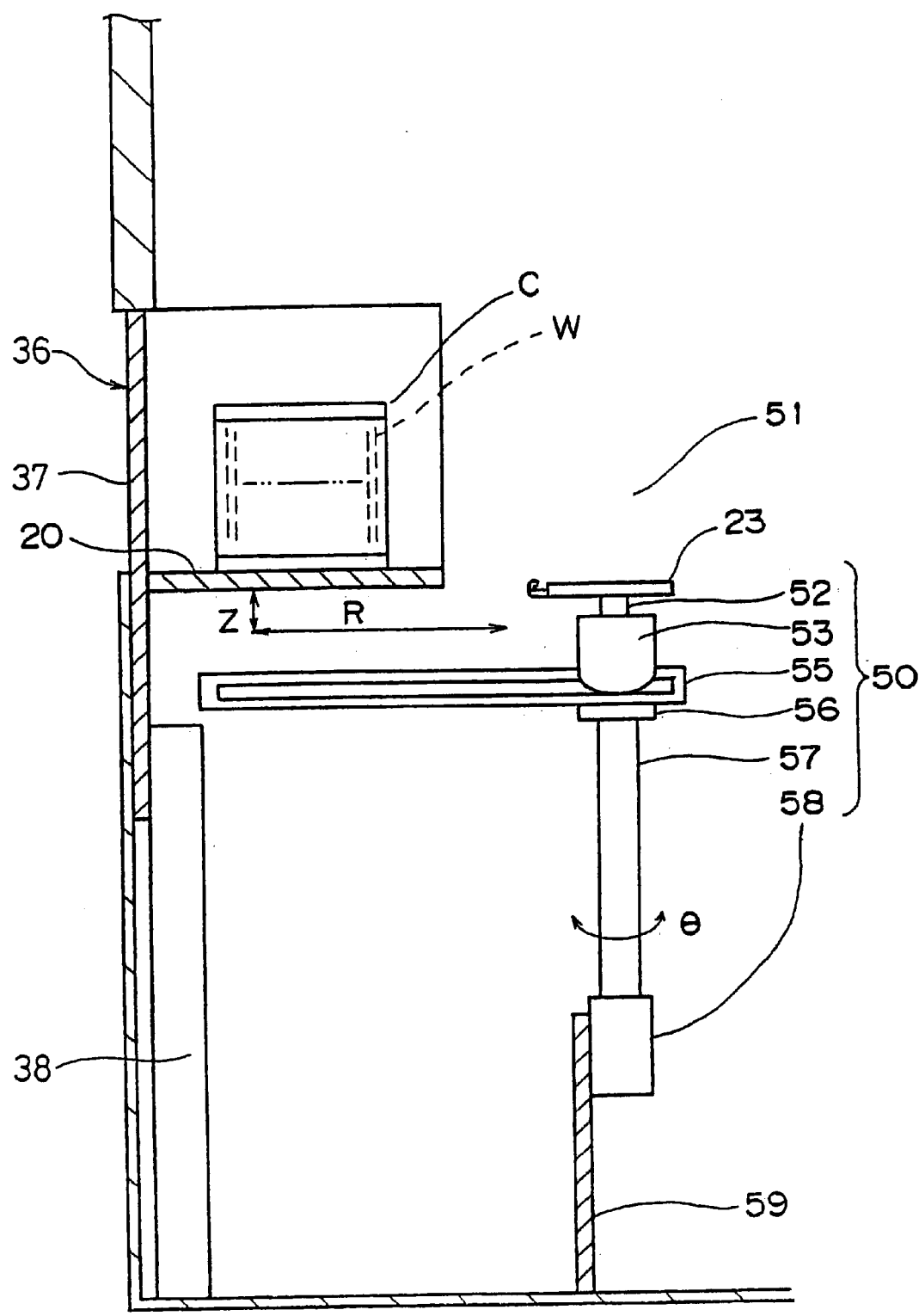
FIG. 6 is a longitudinal sectional view taken along a line A—A of FIG. 4.

FIG. 6 is a longitudinal sectional view taken along a line A—A of FIG. 4. As shown in the figure, an elevating mechanism 38 is arranged below a loading port 36 for loading the carriers C at the loading stage 20, to move a shutter 37 up and down. As shown in FIG. 4, an elevating mechanism (not shown) is arranged below an unloading port 40 for unloading the carriers C at the unloading stage 21, to move the shutter 37 up and down.

Figure 7:
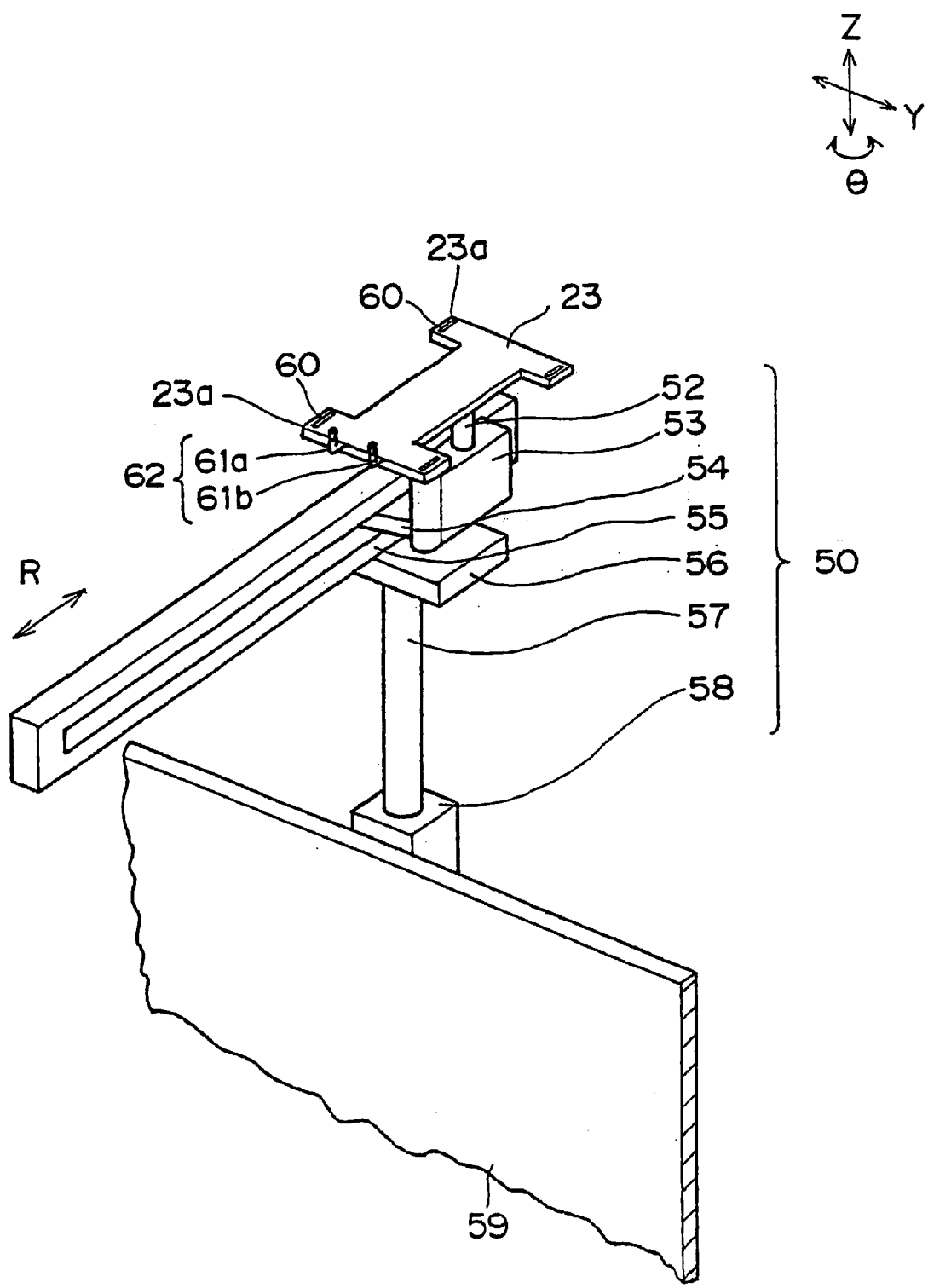
FIG. 7 is a perspective view of moving means.

As shown in FIGS. 6 and 7, moving means 50 for moving the transfer table 23 is disposed below any one of the loading stage 20, the unloading stage 21 and the pickup-and-accommodation stage 24. This moving means 50 comprises an elevating mechanism 53 for carrying the transfer table 23 through an elevating shaft 52 and moving the table 23 up and down (Z-direction in FIGS. 6 and 7), a guide rail 55 equipped with the elevating mechanism 53 through a slide member 54, for sliding the mechanism 53 to the longitudinal direction (R-direction in FIGS. 6 and 7), a base 56 having the guide rail 55 fixed thereon and a rotating mechanism 58 that carries the base 56 through a rotating shaft 57 thereby to rotate the transfer table 23 and the guide rail 55 in a horizontal plane (θ-direction in FIGS. 6 and 7). The rotating mechanism 58 is slidably mounted on a base 58. Thus the moving means 50 is constructed so as to be movable along the arraying direction of the stations 30, 31, 32, 33 (Y-direction in FIGS. 2, 4 and 7) horizontally.

For example, the transfer table 23 is substantial-H shaped in plan view, provided with respective projections 23a having grooves 60 for receiving the lower periphery of the carrier C. Therefore, owing to elevating, horizontal moving and rotating by the moving means 50, the transfer table 23 is capable of receiving the respective carriers C mounted on the stations 30–35. Consequently, the carriers C can be transferred from e.g. the loading stage 20 to the pickup-and-accommodation stage 24 and also from the state 24 to the unloading stage 21. Note that the transfer table 23 is equipped with a wafer counter 62 having a pair of optical sensors 61a, 61b allowing both the number of wafers W and jump slots to be inspected in receiving the carrier C.

Figure 8:
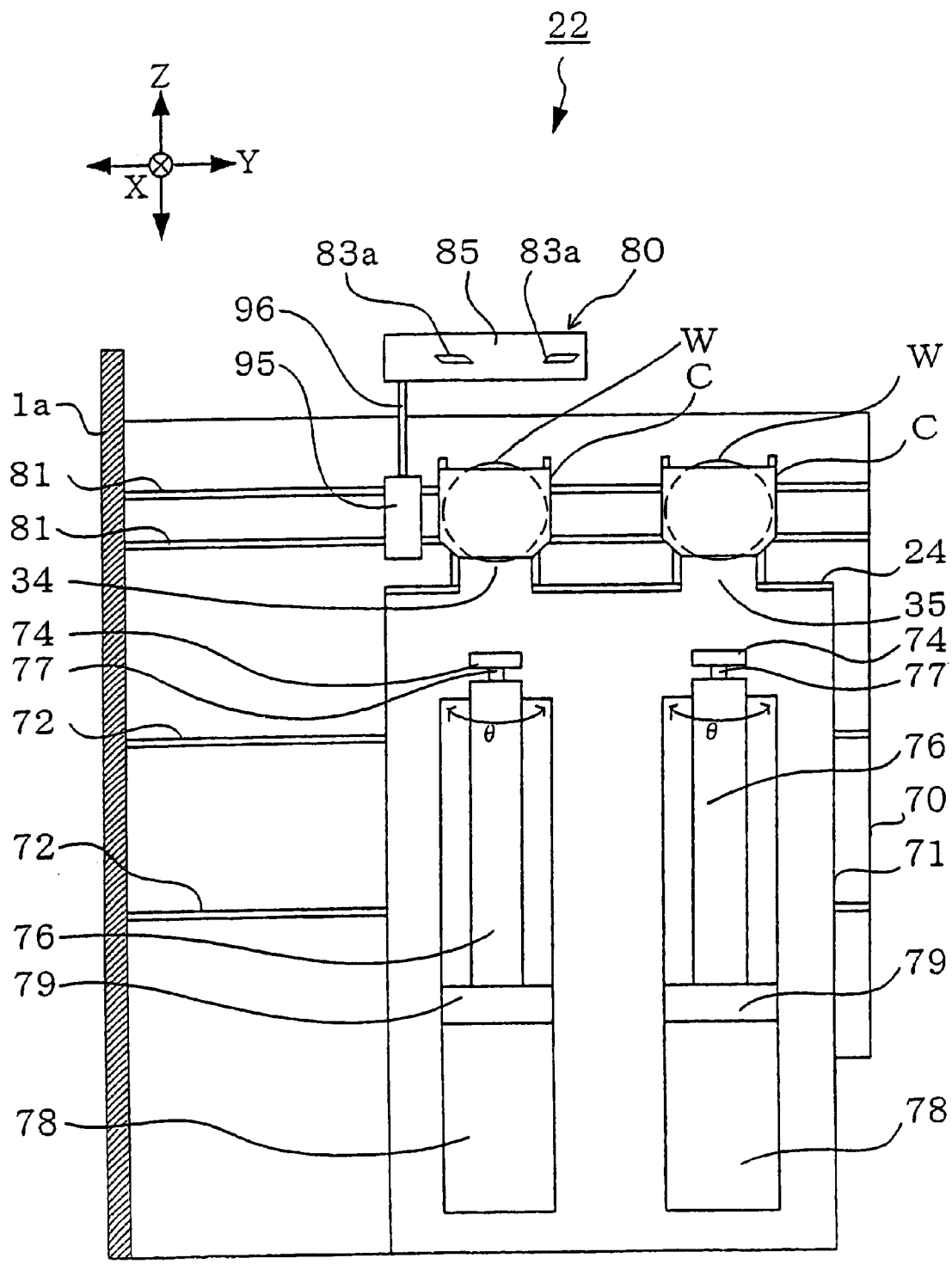
FIG. 8 is an explanatory diagram of the wafer arraying device in accordance with the first embodiment of the invention, viewed from the front side of the cleaning device.
Figure 9:
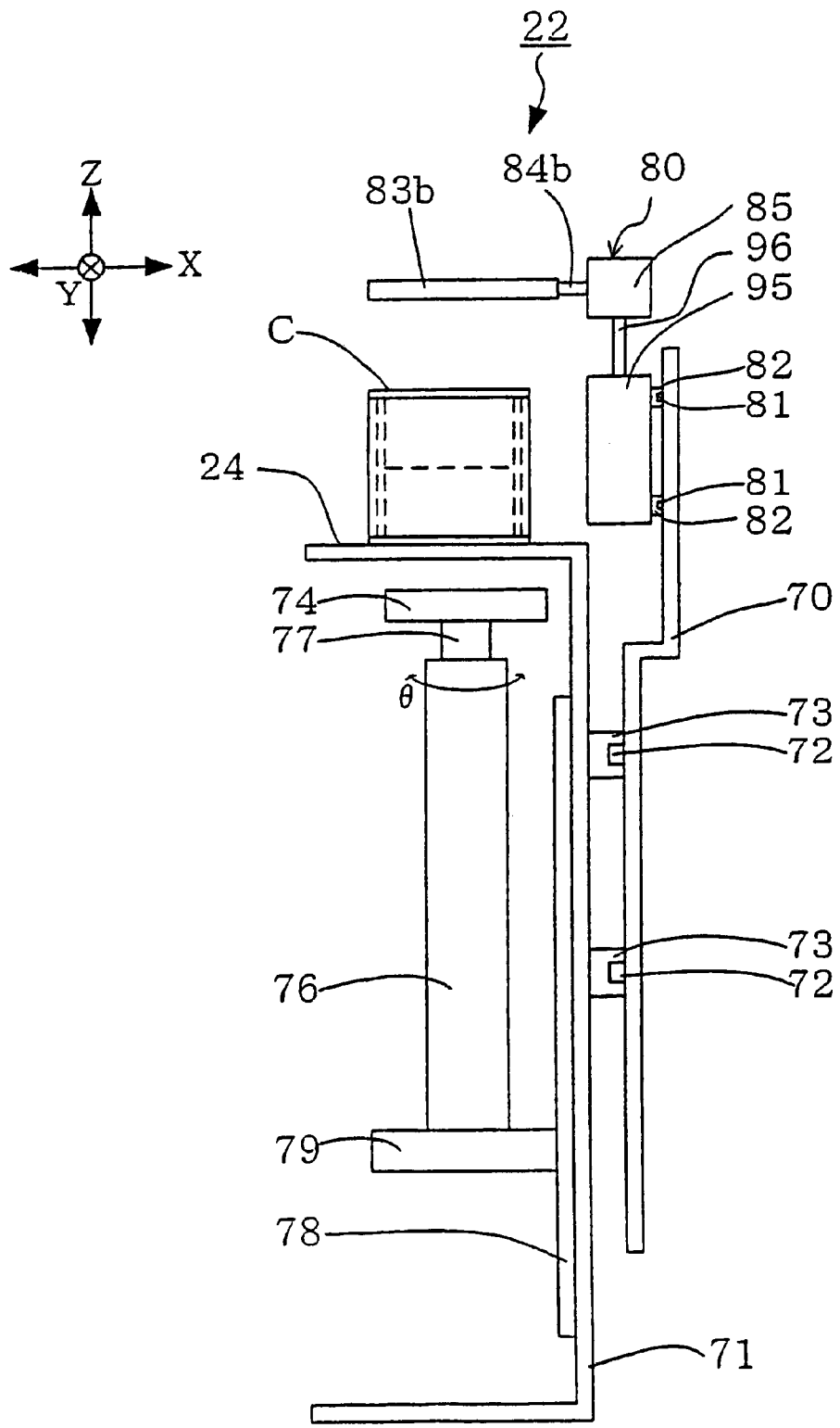
FIG. 9 is a side view of the wafer arraying device of FIG. 8.
Figure 10:
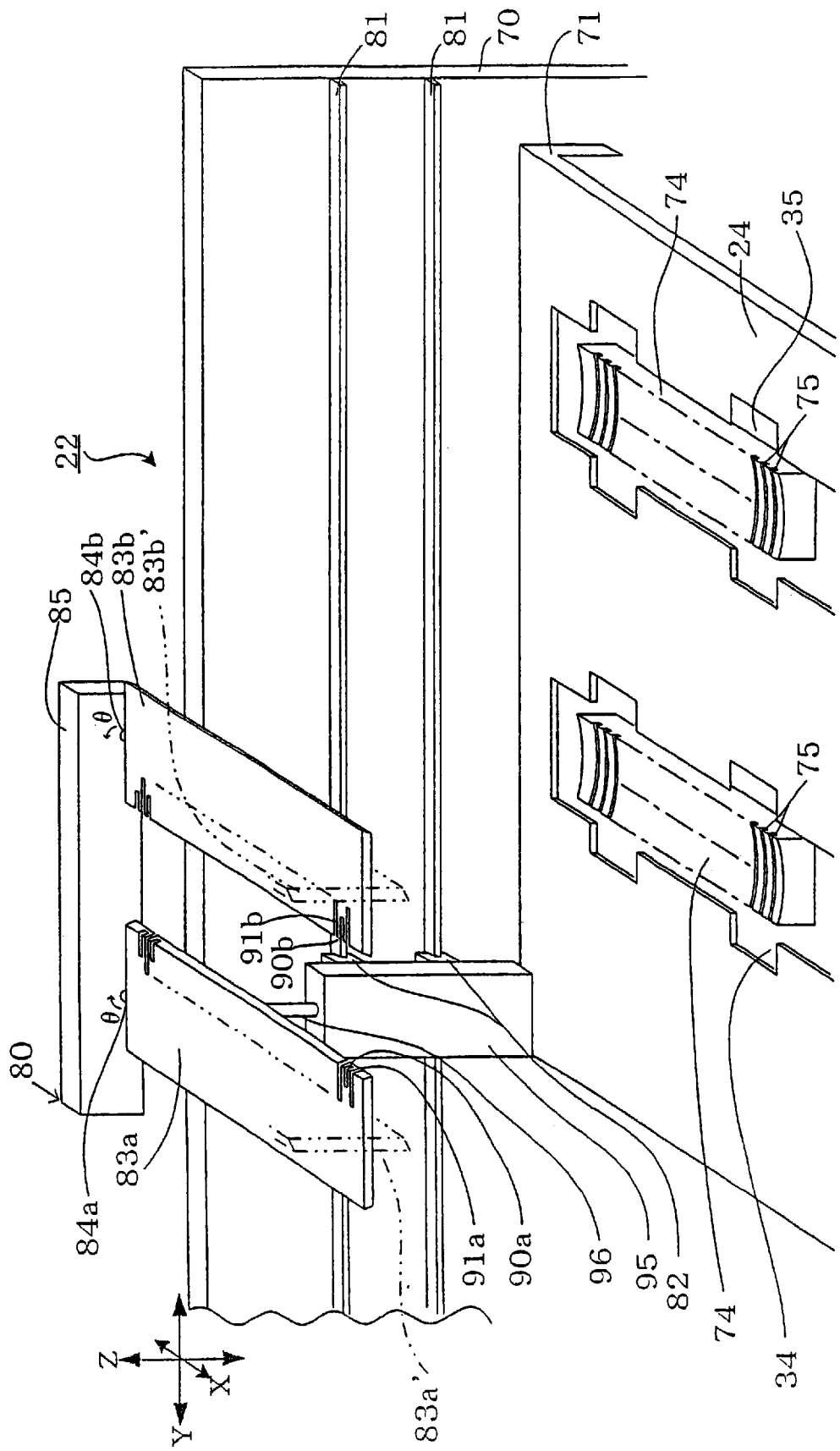
FIG. 10 is a perspective view of a pitch changer and a wafer hand.

The so-constructed cleaning apparatus 1 is provided with the wafer arraying device 22 of the first embodiment. As shown in FIGS. 8 to 10, the wafer arraying device 22 includes a plate 70 secured on the sidewall la of the cleaning apparatus 1, and a casing 71. Guide rails 72, 72 are attached to the lower part of the plate 70 and also slidably engaged with slide members 73, 73 attached on the back face of the casing 71. Therefore, the casing 71 is constructed so as to be movable horizontally (Y-direction in FIGS. 8 to 10). The top face of the casing 71 constitutes the pickup-and-accommodation stage 24. Below the pickup-and-accommodation stage 24, there is provided carrying means, such as wafer hands 74, 74. Each wafer hand 74 is constructed so as to allow twenty-six sheets of wafers W to be taken in and out of the carrier C while they are arranged at regular intervals of L. Also, the wafer hand 74 is capable of carrying fifty-two sheets of wafers W while being arranged at even intervals of L/2 equal to substantial half of the above intervals L. With such the constitution of the wafer hand 74 being a substrate carrier, there is no need to provide another place with either a space or an arrangement for mounting the wafers W thereon at regular intervals of L/2. Further, it is possible to shorten the device's operational time in comparison with that in case of mounting the wafers W on the other place.

Figure 11:
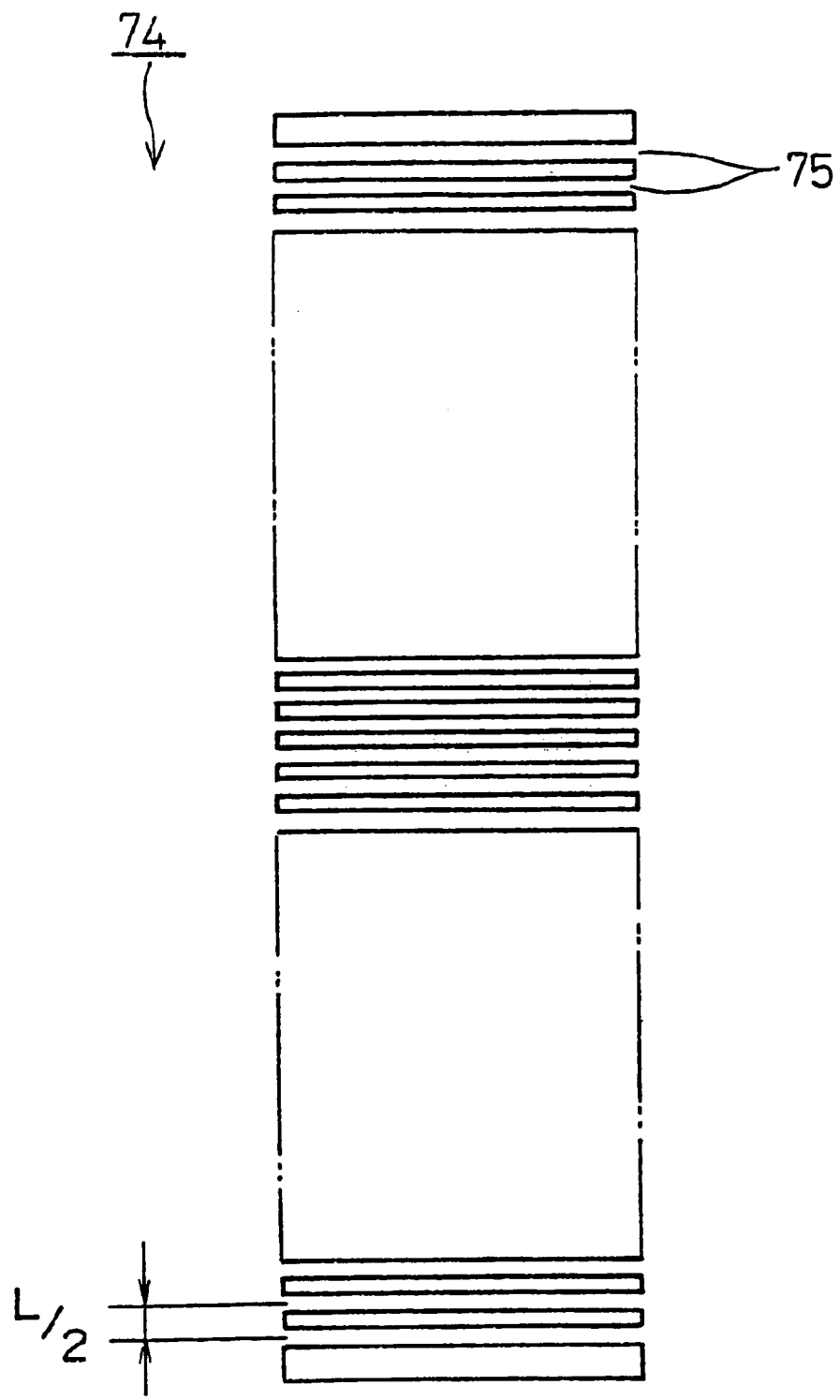
FIG. 11 is a plan view of the wafer hand.

As shown in FIG. 11, fifty-two grooves 75 are formed on the wafer hand 74, at regular intervals of L/2. As shown in FIGS. 8 and 9, each wafer hand 74 is carried by a rotatable elevating shaft 77 of a rotational elevating mechanism 76. The rotational elevating mechanism 76 is fixed on an elevating member 79 moving along a guide rail 78 up and down. Thus, the wafer hand 74 can rotate about the rotatable elevating shaft 77 in a horizontal plate (θ-direction in FIGS. 8 and 9) and also move up and down (Z-direction in FIGS. 8 and 9). Under condition of mounting the carrier C, in which twenty-six sheets of wafers W are accommodated therein, on the side of the station 34 of the pickup-and-accommodation stage 24, when the wafer hand 74 of the same side is raised to project twenty-six sheets of wafers W from the interior of the carrier C, the lower peripheries of the wafer W are inserted into fifty-two grooves 75 on alternate grooves.

Above the pickup-and-accommodation stage 24, there is provided a pitch changing unit alias pitch changer 80 as delivering means for giving and receiving the wafers W in relation to the wafer hand 74. The pitch changer 80 has slide members 82, 82 attached to the back face of an elevating mechanism 95 mentioned later. These slide members 82, 82 are slidably engaged with guide rails 81, 81 fixed on the upper part of the plate 70. Consequently, the pitch changer 80 can move horizontally (Y-direction in FIGS. 8 to 10). The pitch changer 80 is equipped with a pair of left/right carrying members 83a, 83b for carrying the wafers W.

The carrying members 83a, 83b are connected to a support 85 through support shafts 84a, 84b, respectively. A not-shown motor is installed in the support 85 to rotate the carrying member 83a about the support shaft 84a (θ-direction in FIG. 10) and also the carrying member 83b about the support shaft 84b (θ-direction in FIG. 10). The carrying members 83a, 83b shown with solid lines of FIG. 10 represent their horizontal postures brought by the operation of the motor, respectively. The carrying members 83a, 83b are adapted so as to carry the wafers W in their horizontal postures. Additionally, the pitch changer 80 is adapted so as to release the so-carried wafers W from the carrying members 83a, 83b when they are respectively rotated at an angle of 90 degrees by the motor and brought to their vertical positions shown with two-dot chain lines 83a', 83b' (FIG. 10). Owing to the expansion and contraction of the support shafts 84a, 84b, the carrying members 83a, 83b can move horizontally in front and behind (X-direction in FIG. 10), respectively.

Figure 12:
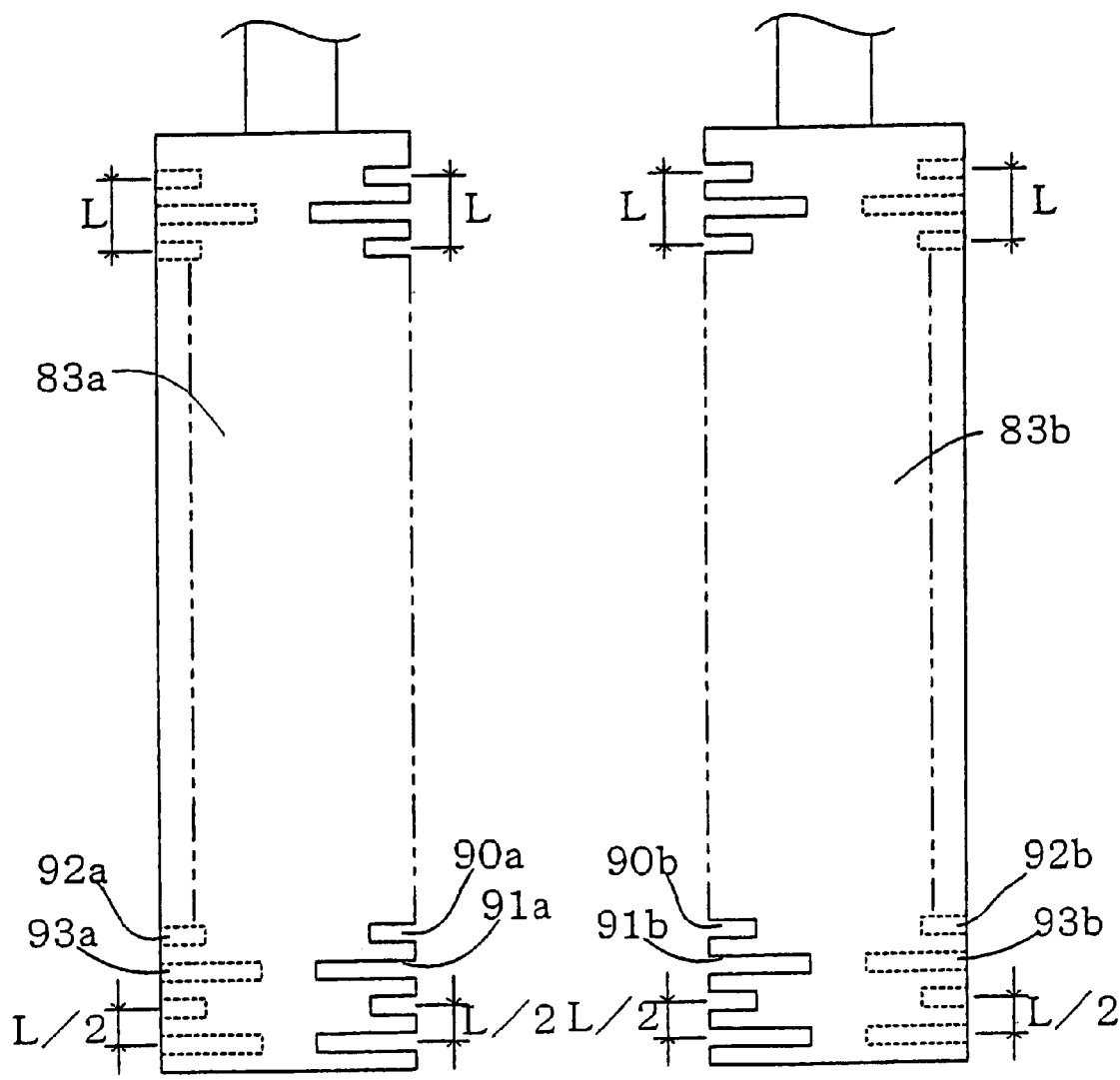
FIG. 12 is a plan view of carrying means.

As shown in FIG. 12, in the carrying member 83a, grooves 90a and gaps 91a are formed in the circumference of the right side (on the same member's right side in FIG. 12) on the top face, alternately at regular intervals of L/2 and similarly, grooves 92a and gaps 93a are formed in the circumference of the left side (on the same member's left side in FIG. 12) on the under face, alternately at regular intervals of L/2. These grooves 90a, 92a and the gaps 91a, 93a are formed in twenty-six places, respectively. The grooves 90a are arranged at regular intervals of L and the other grooves 92a are also arranged at regular intervals of L. The gaps 91a, 93a are respectively provided with sufficient widths (lengths) by which the peripheries of the wafers W carried by the wafer hand 74 could pass through the gaps 91a, 93a if rising and falling the carrying member 83a in the horizontal posture. Also in the carrying member 83b, grooves 90b and gaps 91b are formed in the circumference of the left side (on the same member's left side in FIG. 12) on the top face, alternately at regular intervals of L/2 and similarly, grooves 92b and gaps 93b are formed in the circumference of the right side (on the same member's right side in FIG. 12) on the under face, alternately at regular intervals of L/2. These grooves 90b, 92b and the gaps 91b, 93b are formed in twenty-six places, respectively. The grooves 90b are arranged at regular intervals of L and the other grooves 92b are also arranged at regular intervals of L. The gaps 91b, 93b are also provided with sufficient widths (lengths) by which the peripheries of the wafers W carried by the wafer hand 74 could pass through the gaps 91a, 93a if rising and falling the carrying member 83b in the horizontal posture.

In the example of FIG. 10, the grooves 90a and the grooves 90b are arranged to face each other and also adapted so as to carry twenty-six sheets of wafers W before cleaning at regular intervals of L. On the other hand, when the carrying members 83a, 83b are rotated with an angle of 180 degrees, then the grooves 92a and the grooves 92b face each other, so that twenty-six sheets of wafers W after cleaning can be carried by the grooves 92a, 92b at regular intervals of L. Thus, even if the particles separated from the wafers W before cleaning stick to the grooves 90a, 90b disadvantageously, it is possible to prevent the particles on the grooves 90a, 90b from sticking to the cleaned wafers W since they are carried by the grooves 92a, 92b.

The support 85 is connected with an elevating shaft 96 of the aforementioned elevating mechanism 95. By expanding-and-contracting or sliding the elevating shaft 96 up and down (Z-direction of FIGS. 8 to 10) owing to the elevating mechanism 95, the support 85 and the carrying members 83a, 83b can move up and down (Z-direction of FIGS. 8 to 10).

Next, we describe both operation and effect of the above-constructed wafer arraying device 22 of the first embodiment, on the ground of a designated cleaning process for the wafers W in the cleaning apparatus 1. First of all, for example, a worker in a factory loads two carriers C each having e.g. twenty-six sheets of wafers W accommodated therein, to the loading stage 20. Then, the transfer table 23 moves the carriers C mounted on the stations 31, 30 to the wafer arraying device 22 in sequence and places the carriers C on the pickup-and-accommodation stage 24.

Figure 13:
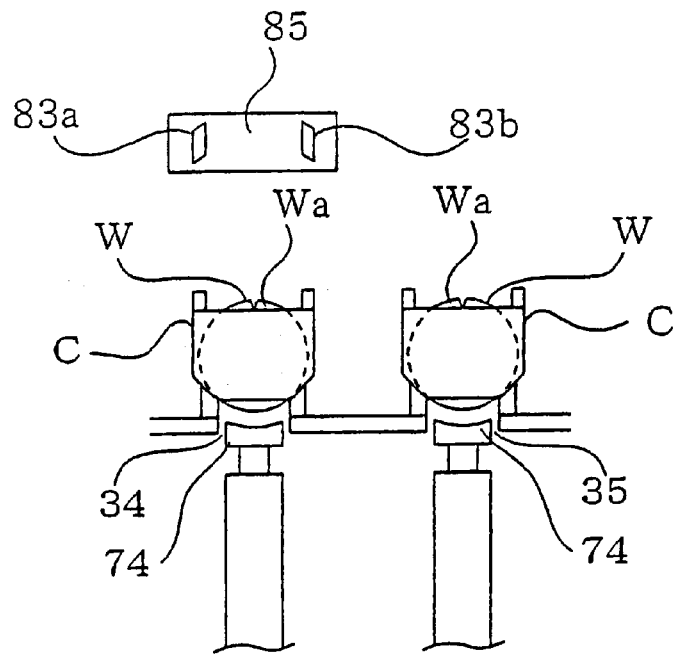
FIG. 13 is an explanatory diagram of the first process to array the wafers in the wafer arraying device of FIG. 8.
Figure 14:
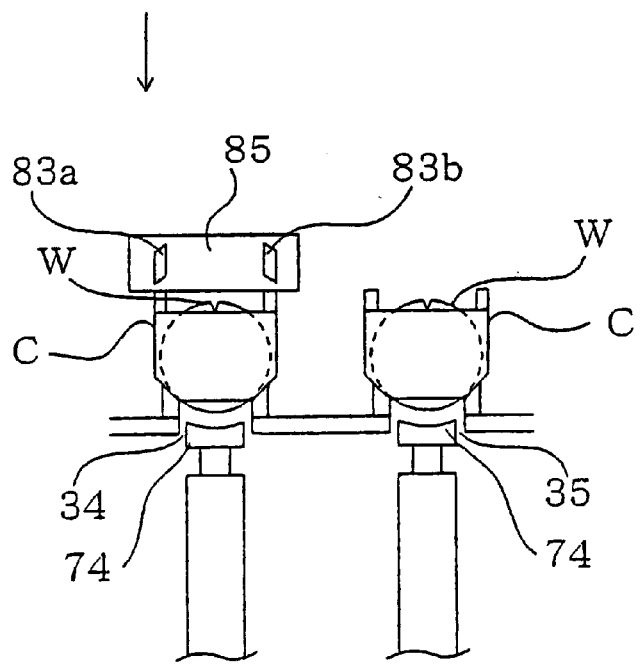
FIG. 14 is an explanatory diagram of the second process to array the wafers in the wafer arraying device of FIG. 8.

Now, we describe the arraying method to be performed in the wafer arraying device 22, with reference to the explanatory diagrams of the 1st. to 19th. process shown in FIGS. 13 to 22. First, put one carrier C on the side of the station 34 (on the left side in FIGS. 12 to 22) of the pickup-and-accommodation stage 24 and also put the other carrier C on the side of the station 35 (on the right side in FIGS. 12 to 22) of the pickup-and-accommodation stage 24. As shown in FIG. 13, one wafer hand 74 is elevated to enter into the station 34, while the other wafer hand 74 is also elevated to enter into the station 35. The carrying members 83*a*, 83*b* stand ready above the carrier C on one side. In the carrier C, twenty-six sheets of wafers W are accommodated and arrayed at regular intervals of L. The respective wafers W have their surfaces Wa directing the front of the cleaning apparatus 1 (the right side of space of FIG. 13). Subsequently, as shown in FIG. 14, the carrying members 83*a*, 83*b* descend to position just above the carrier C on one side. Thereafter, as shown in FIG. 15, the wafer hand 74 on the side of the station 34 rises to take twenty-six sheets of wafers W out of the carrier C on one side. At this time, the wafer hand 74 on the side of the station 34 projects twenty-six sheets of wafers W to a height where they would not obstruct the movements of the carrier members 83*a*, 83*b* from their vertical postures to the horizontal postures. Then, in the wafer hand 74 of the side of the station 34, the lower peripheries of the wafers W are inserted into fifty-two grooves 75 on every other groove, so that twenty-six sheets of wafers W taken out of the carrier C on one side are arranged at regular intervals of L. While, the carrying members 83*a*, 83*b* are rotated from the vertical postures to the horizontal postures with an angle of 90 degrees.

Figure 17:
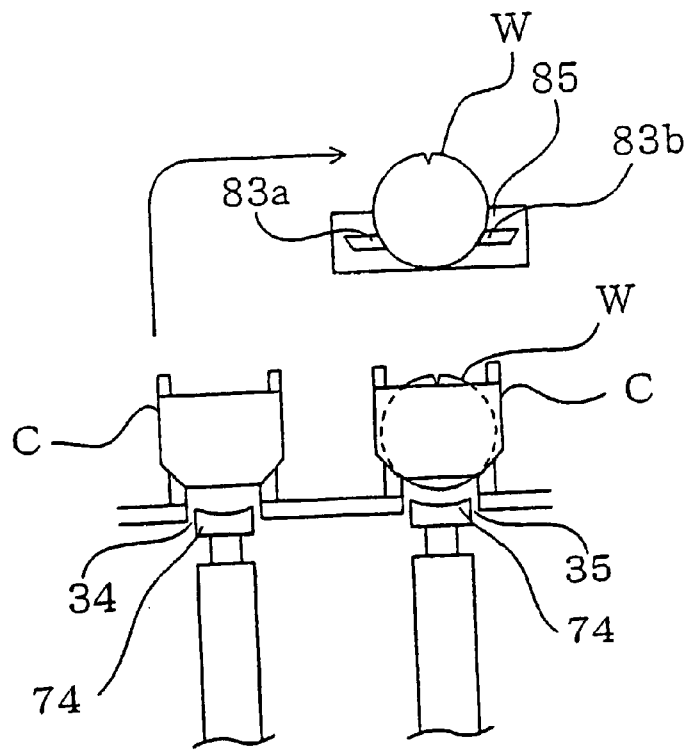
FIG. 17 is an explanatory diagram of the fifth process to array the wafers in the wafer arraying device of FIG. 8.
Figure 23:
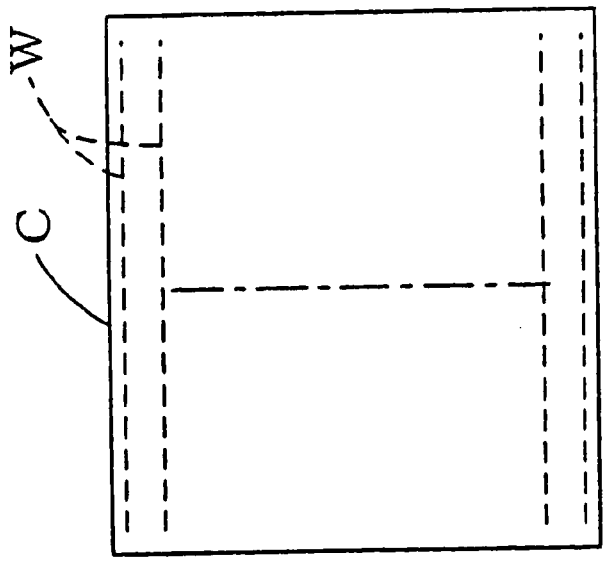
FIG. 23 is a plan view showing a situation of FIG. 16.
Figure 23:
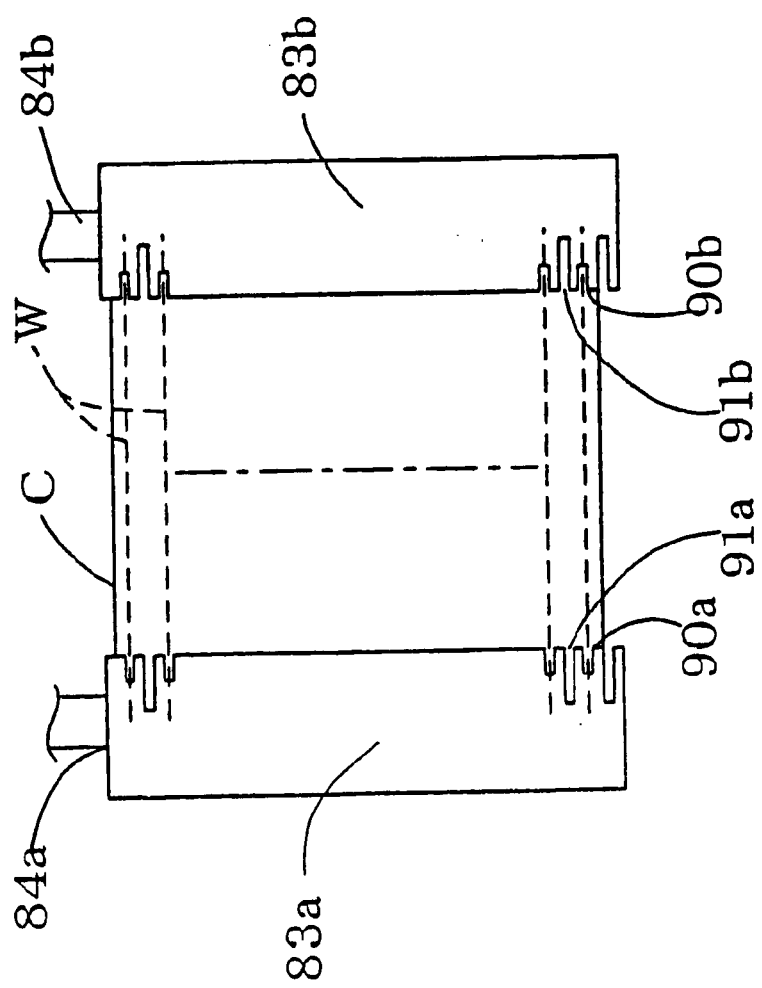
Figure 24:
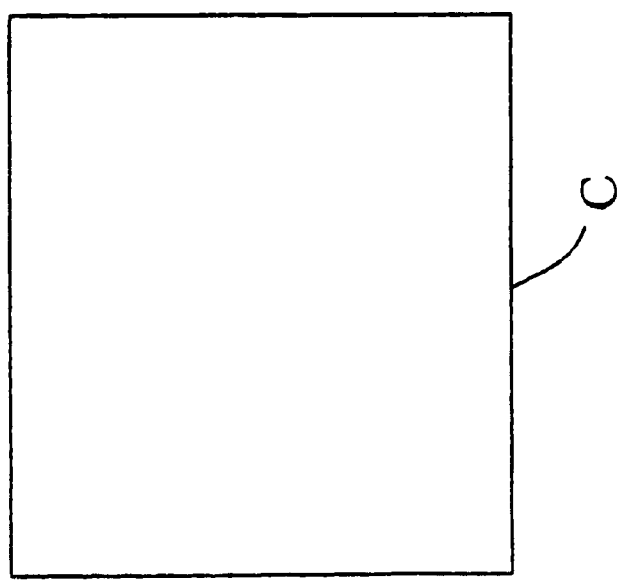
FIG. 24 is a plan view showing a situation of FIG. 17.
Figure 24:
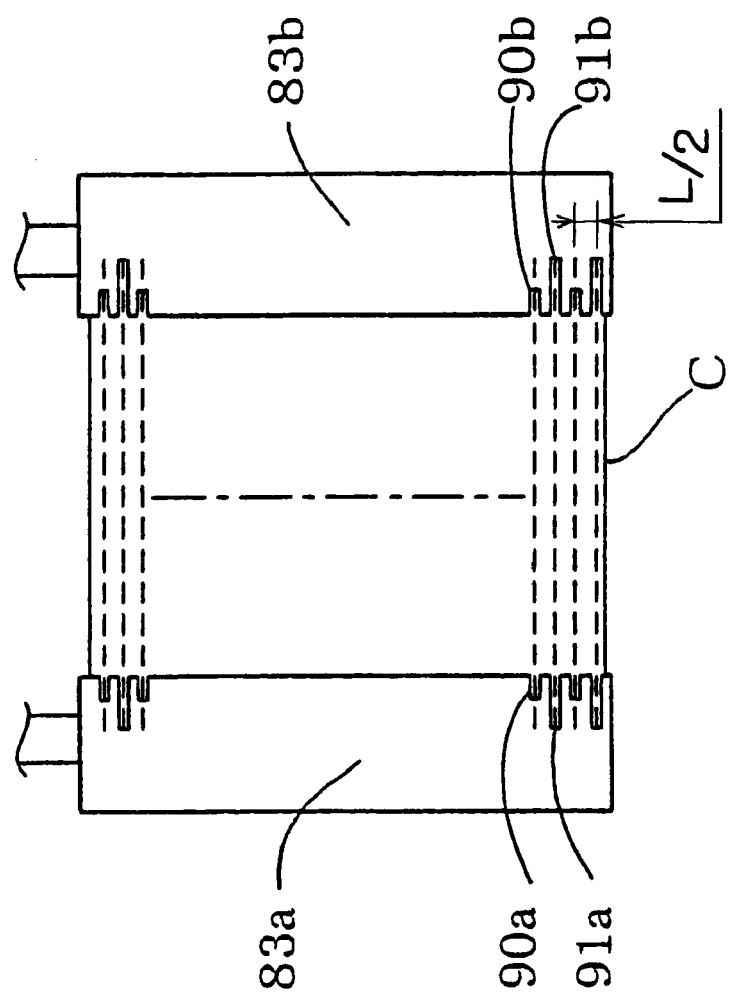

Thereafter, as shown in FIG. 16, the wafer hand 74 on the side of the station 34 descends and delivers twenty-six sheets of wafers W, which have been taken out of the carrier C on one side, to the carrying members 83*a*, 83*b* during the plan view. In FIG. 23, the carrying members 83*a*, 83*b* carry twenty-six sheets of wafers W taken out of the carrier C on one side while the peripheries of the respective wafers W are inserted into the grooves 90*a*, 90*b*. Thereafter, as shown in FIG. 17, the carrying members 83*a*, 83*b* move to the upside of the carrier C on the other side. Then, the support shafts 84*a*, 84*b* are slightly shrunk to withdraw the carrying members 83*a*, 83*b*. FIG. 24 illustrates the wafers' situation at this time, in plan view. In FIG. 24, the retreating distances of the carrying members 83*a*, 83*b* are established so as to, in its plan view, allow the respective wafers W (twenty-six sheets), which have been taken out of the carrier C on one side, to be positioned between the respective (twenty-six sheets) wafers W in the carrier C on the other side, at even intervals L/2 which is substantially half of the above intervals L. Thus, the twenty-six sheets of wafers W taken out of the carrier C on one side and the twenty-six sheets of wafers W in the other carrier C are arranged alternately at even intervals L/2 which is substantially half of the above intervals L.

Figure 18:
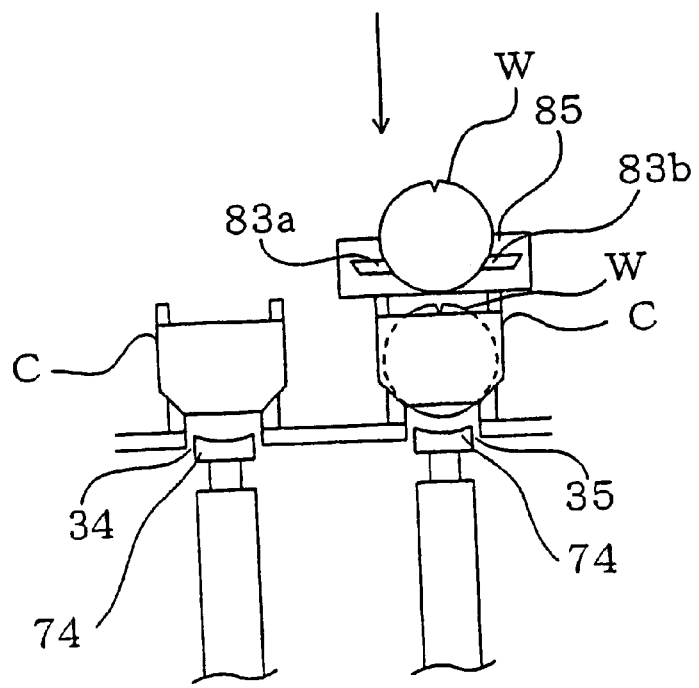
FIG. 18 is an explanatory diagram of the sixth process to array the wafers in the wafer arraying device of FIG. 8.

Subsequently, as shown in FIG. 18, the carrying members 83*a*, 83*b* descend to position just above the other carrier C.

Figure 19:
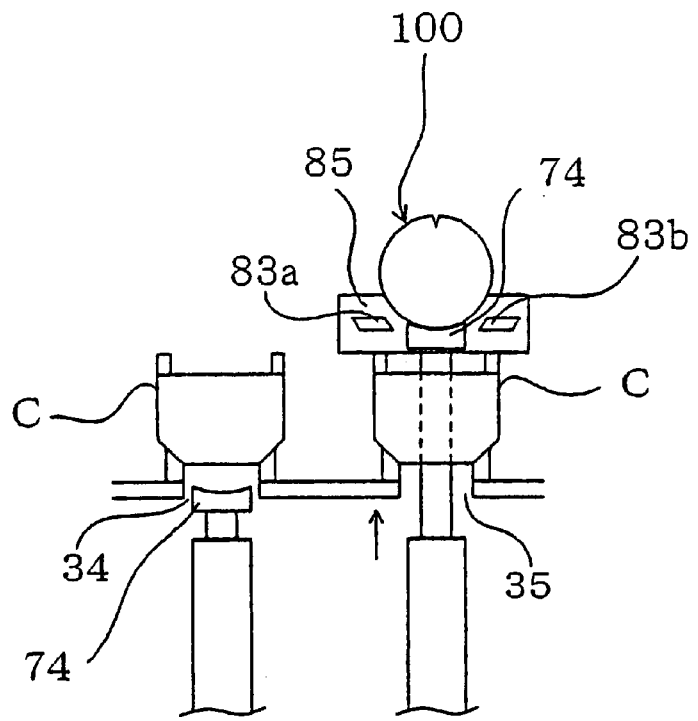
FIG. 19 is an explanatory diagram of the seventh process to array the wafers in the wafer arraying device of FIG. 8.

In this case, the height of the support 85 is lowered to the utmost. For example, the support's height may be established so that, in front view, the lowermost parts of the wafers W carried by the carrying members 83*a*, 83*b* either touch or partially overlap with the uppermost parts of the wafers W in the carrier C. Alternatively, the support may be in the lowest position where the carrying members 83*a*, 83*b* do not interfere with the carrier C at least. After that, as shown in FIG. 19, the wafer hand 74 on the side of the station 35 rises to take the twenty-six sheets of wafers W out of the other carrier C on the other side and inserts the wafers W between the respective (twenty-six sheets of) wafers W taken out of the carrier C on one side, thereby forming a wafer group 100 where fifty-two (equal to the number of wafers for two carriers C) sheets of wafers W are arranged at regular intervals of L/2 which is substantially half of the intervals L. Consequently, no sooner is the wafers W elevated from the carrier C than the wafers W carried by the carrying members 83*a*, 83*b* overlap with the wafers W being elevated from the carrier C in front view. Thus, almost all the operation to insert the wafers W (twenty-six sheets) into the other wafers W (twenty-six sheets) is carried out while the wafers W are guided by the grooves 91*a*, 91*b* of the carrying members 83*a*, 83*b* and also the grooves 15 on the carrier C. At this time, the left and right peripheries of the wafers W taken out of the other carrier C pass through the gaps 91*a*, 91*b* of the carrying members 83*a*, 83*b* with no interference. In this state, the wafer group 100 has a width which is generally equal to a width of the carrier C having twenty-six sheets of wafers W arranged at regular intervals of L.

In this way, there are carried out the following steps (processes) of: pushing up the twenty-six sheets of wafers W arranged at regular intervals of L in one carrier C thereby to carry the wafers W as they are; holding the so-carried wafers W while being arranged at regular intervals of L; and pushing up the twenty-six sheets of wafers W arranged at regular intervals of L in the other carrier C so as to insert the so-pushed wafers W between the former wafers W taken out of the former carrier C thereby to carry the fifty-two sheets of wafers W while being arranged at regular intervals of L/2.

Further, between the above step of holding the so-carried wafers W while being arranged at regular intervals of L and the other step of carrying the fifty-two sheets of wafers W while being arranged at regular intervals of L/2, it is executed to move the so-carried wafers W just above the other carrier C thereby position the respective wafers W between the other wafers W in the other carrier C in plan view. Owing to the completion of this positioning, it is possible to insert each of the twenty-six sheets of wafers W taken out of the other carrier C through the grooves 15 between the respective twenty-six sheets of wafers W taken out of the carrier C on one side. Consequently, the wafers W taken out of the carrier C on one side can be prevented from contact with the other wafers W taken out of the other carrier C certainly, whereby the formation of the wafer group 100 can be completed stably. Note that if the wafers W are taken out of both carriers C to position the wafers W as in the conventional method, the positional deviation among the wafers W is apt to occur because any wafer W is exposed to the outside. While, according to the embodiment, since the alignment of the wafers W is carried out by moving the twenty-six sheets of wafers W taken out of the carrier C on one side against the wafers W accommodated in the other carrier C, the alignment stability and accuracy can be improved to carry out the alignment of the wafer W with ease. Therefore, it is possible to prevent the occurrence of positional deviation for the wafers and a variety of complicated mechanisms for detecting and correcting the positional deviation become useless.

Figure 20:
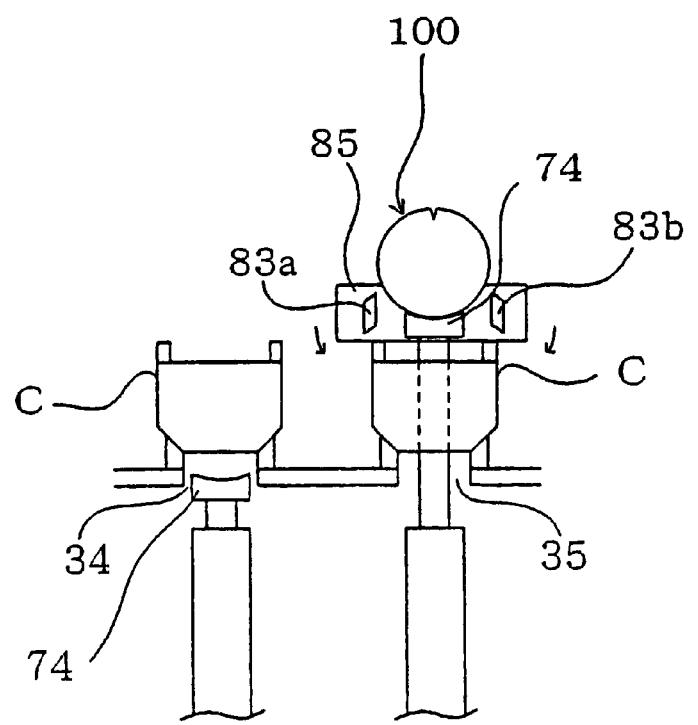
FIG. 20 is an explanatory diagram of the eighth process to array the wafers in the wafer arraying device of FIG. 8.

Thereafter, as shown in FIG. 20, the carrying members 83a, 83b rotate with an angle of 90 degrees from the horizontal postures to the vertical postures. Next, as shown in FIG. 21, the carrying members 83a, 83b rise upward of the wafer group 100 and continuously, as shown in FIG. 22, the same members 83a, 83b move toward the station 34, while the wafer hand 74 on the side of the station 35 rotates with an angle of 90 degrees, so that the arraying direction of the wafers W in the wafer group 100 is changed so as to direct the side of the stock section 3 (the right side of space of FIG. 22).

Subsequently, the transfer arm 8 holds and carries the wafer group 100 established on the wafer hand 74 on the side of the station 35, toward the cleaning-and-drying section 4. In the section 4, it is executed to wash and dry the wafer group 100 in succession. Note that the wafer group 100 includes fifty-two sheets of wafers W in spite of the width for one carrier C. Therefore, in each chemical-and-rinse cleaning device 10, 12 for cleaning the wafer group 10, the number of wafers that the device can process for one cleaning becomes twice as many as that of the conventional device, without enlarging the size of device and furthermore, it is possible to save the consumption of the cleaning liquid.

At last, the wafer group 100 is dried by the drying device 9 and returned to the wafer arraying device 22 again. After completing the above-mentioned processes in substantially reverse order while using the wafer hands 74, 74 and the pitch changer 80, the wafers W are accommodated in two carriers C. Next, it is executed to unload and move the carriers C to the stage 21.

According to the above-mentioned wafer arraying method and device 22, since the wafer group 100 is formed in picking up the twenty-six sheets of wafers W from the other carrier C at the pickup-and-accommodation stage 24, it is possible to save the conventional work to move the wafers W to the stage for forming the wafer group 100, whereby the formation of the wafer group 100 can be completed in a short time, stably. Moreover, as there is no need to prepare an additional stage or space to form the wafer group 100 except the pickup-and-accommodation stage 24, it is possible to miniaturize the cleaning apparatus 1 for cleaning the group 100.

Figure 25:
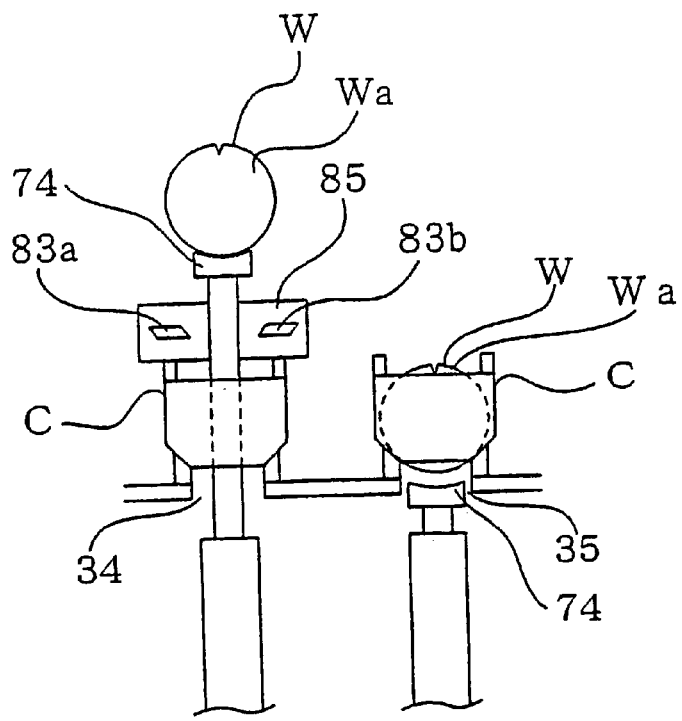
FIG. 25 is an explanatory diagram of the first process to reverse each of twenty-six wafers taken out of a carrier on one hand.
Figure 26:
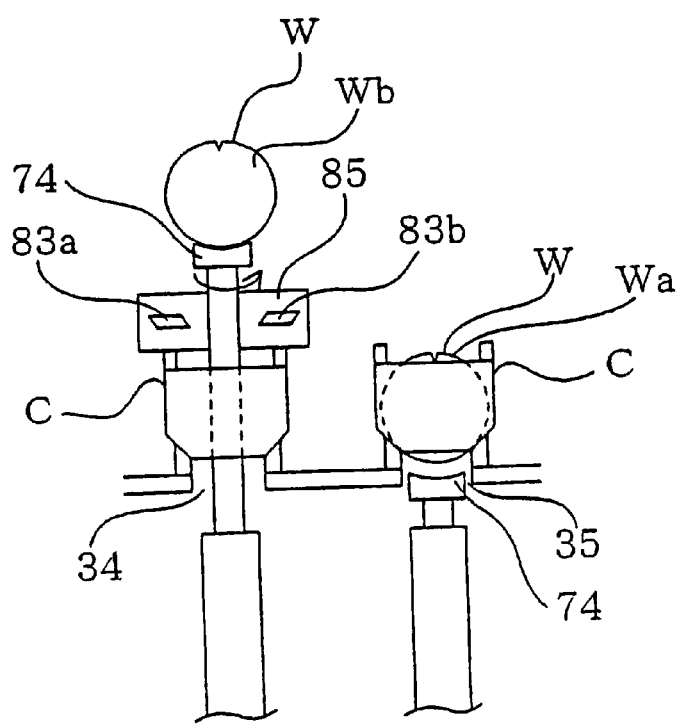
FIG. 26 is an explanatory diagram of the second process to reverse each of twenty-six wafers taken out of a carrier on one hand.

In the wafer arraying method, it may be provided, between one step of taking the twenty-six sheets of wafers W out of the carrier C on one side and the other step of forming the wafer group 100 where the fifty-two sheets of wafers W are arranged at regular intervals of L/2, with a new step of reversing the respective wafers W taken out of the above carrier C. That is, in the arraying method performed by the wafer arraying device 22, the wafer hand 74 on the side of the station 34 is elevated to take the twenty-six sheets of wafers W out of the carrier C (see FIG. 25) after the carrying members 83a, 83b have descended just above the carrier on one side as shown in FIG. 14. At this time, the wafer hand 74 on the side of the station 34 pushes up the twenty-six sheets of wafers W to a level where they would not interfere with the support 85 in rotating them. Thereafter, as shown in FIG. 26, the wafer hand 74 on the side of the station 34 rotates with an angle of 180 degrees in order to turn over each front face Wa and each back face Wb of the twenty-six sheets of wafers W picked up from the carrier C on one side. Consequently, the back faces Wb of the respective wafers W look toward the front of the cleaning apparatus 1 (the front side of space of FIG. 26). Thereafter, the processes of FIGS. 16 to 22 are carried out.

According to the above-mentioned method, after reversing the front faces Wa and the back faces Wb of the twenty-six sheets of wafers W taken out of the carrier C on one side, the wafers are inserted to form the wafer group 100. In such the wafer group 100, both front face Wa and back face Wb of one wafer W can be confronted by the front face Wa and the back face Wb of the adjoining wafer W, respectively. Therefore, it is possible to prevent, for example, particles peeled off the back face Wb of one wafer W from sticking to the front face Wa of the adjoining wafer W.

Next, we describe a wafer arraying device 110 of the second embodiment of the invention. As shown in FIG. 27, the wafer arraying device 110 is provided with a pickup-and-accommodation stage 111 having a mount space for a single carrier C. The pickup-and-accommodation stage 111 includes only the station 34 while reducing respective lateral widths of a casing 112 and a plate 113. The casing 112 is equipped with the single wafer hand 74. The constitution of the wafer arraying device 110 is identical to that of the afore-mentioned wafer arraying device 22 except for the mount space for one carrier C. Therefore, constituents similar to those of the device 22 in structure and function are indicated with the same reference numerals, respectively and their overlapping descriptions are eliminated.

Next, we describe the arraying method performed by the wafer arraying device 110. First of all, move one carrier C mounted on e.g. the station 31 to the pickup-and-accommodation stage 111. Thereafter, on completion of the steps similar to those of FIGS. 14 to 16, twenty-six sheets of wafers W are taken out of the above carrier C at the pickup-and-accommodation stage 111 and continuously delivered to the carrying members 83a, 83b. Next, the carrying members 83a, 83b rise to allow the twenty-six sheets of wafers W, which have been picked up from the carrier C, to stand ready at the pickup-and-accommodation stage 111. Further, withdraw the vacant carrier C from the pickup-and-accommodation stage 111 thereby to form a space thereon. Continuously, move the other carrier C mounted on the station 30 to the pickup-and-accommodation stage 111. Thereafter, on completion of the steps similar to those of FIGS. 17 to 22, twenty-six sheets of wafers W are taken out of the other carrier C and furthermore, it is executed to establish the wafer group 100 where the former wafers W (of twenty-six sheets) from the carrier C on one side and the latter wafers W (of twenty-six sheets) from the carrier C on the other side are arranged alternately at even intervals of L/2, that is, substantial half of the above intervals L.

Also in the above-mentioned wafer arraying method, it is possible to stabilize the formation of the wafer group 100. Moreover, according to the wafer arraying device 110, it is possible to reduce a size of the device owing to only the necessity of ensuring a mounting space for one carrier C. Note, similarly to the first embodiment, the above arraying method may include an additional step of reversing the front faces Wa and the back faces Wb of the twenty-six sheets of wafers W taken out of the carrier C on one side.

Figure 28:
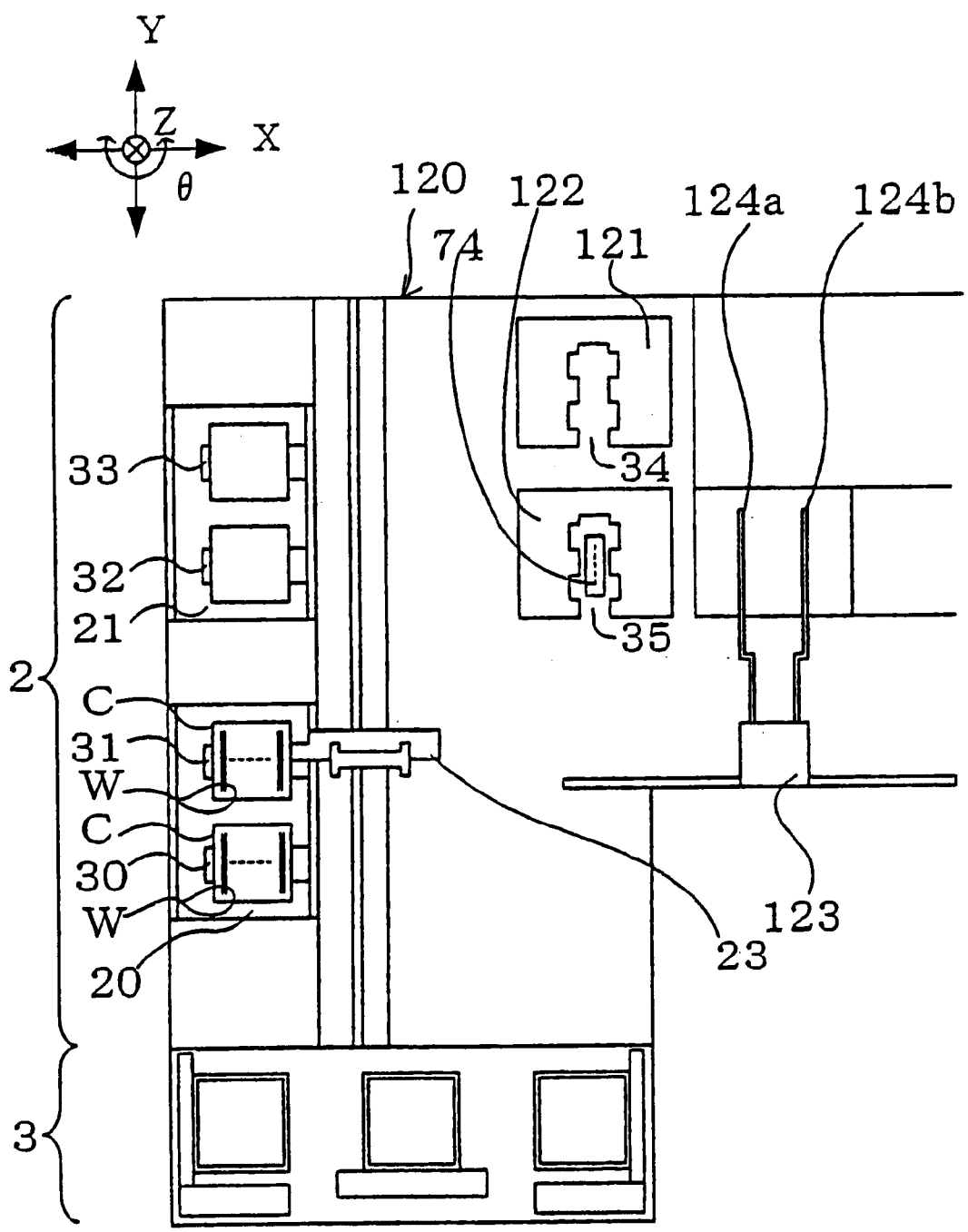
FIG. 28 is an enlarged plan view of an essential part of the cleaning apparatus equipped with the wafer arraying device in accordance with the third embodiment of the invention.

We now describe the wafer arraying device 120 in accordance with the third embodiment of the invention. As shown in FIG. 28, the wafer arraying device 120 has pickup-and-accommodation stages 121, 122 each having the only mounting space for one carrier C. The station 34 is defined on the pickup-and-accommodation stage 121, while the station 35 is defined on the pickup-and-accommodation stage 122. These pickup-and-accommodation stages 121, 122 can move horizontally (Y-direction), up and down (Z-direction) and also rotate in the horizontal plane (θ-direction in FIG. 28) by a not-shown driving mechanism.

The wafer arraying device 120 is provided with the single wafer hand 74. A transfer arm 123 is constructed so as to give and receive the wafers W to and from the wafer hand 74, respectively.

Figure 29:
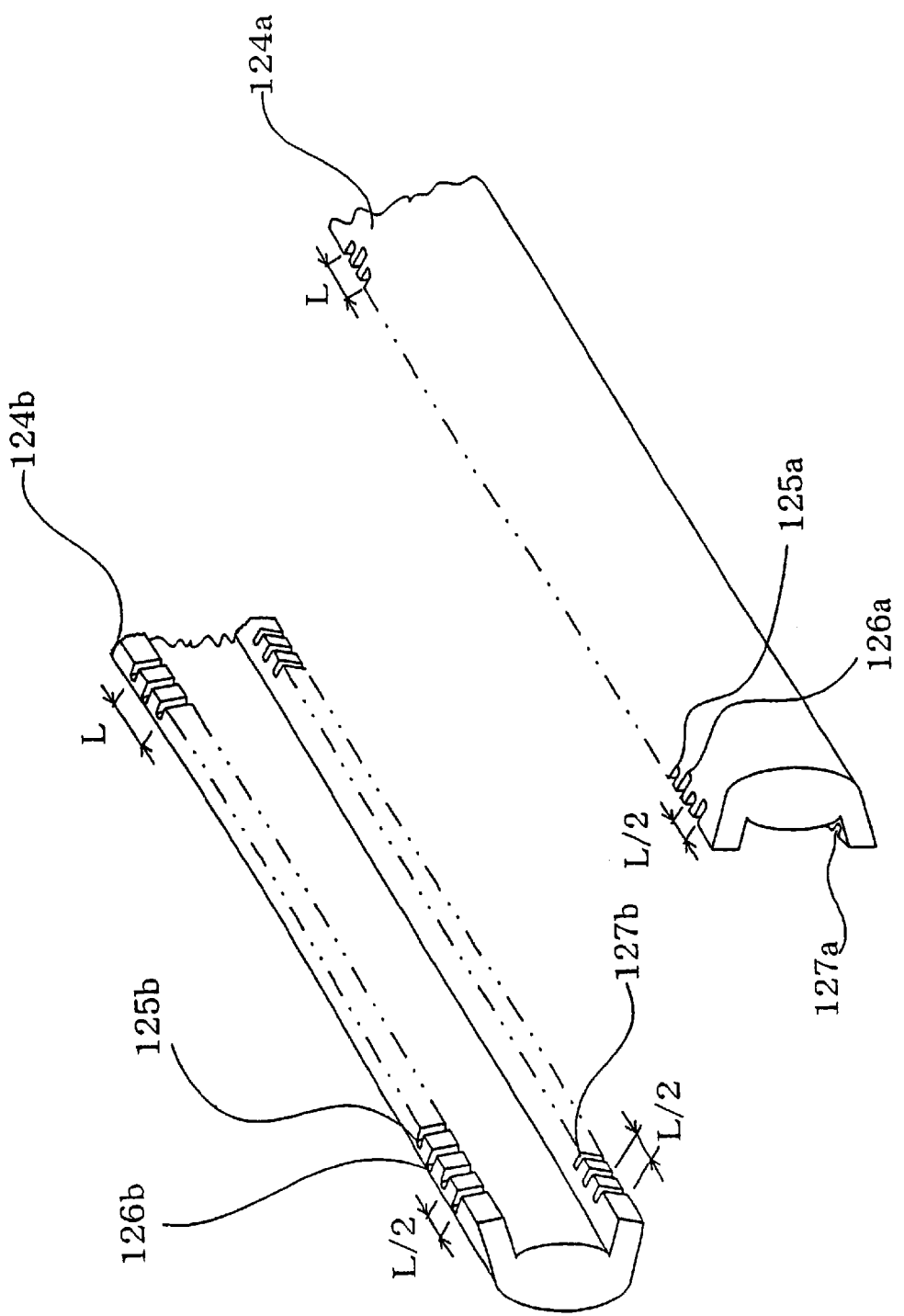
FIG. 29 is a perspective view of a wafer chuck of a transfer arm on the cleaning apparatus of FIG. 28.

The transfer arm 123 is equipped with wafer chucks 124a, 124b capable of opening, closing, expanding and contracting. These wafer chucks 124a, 124b are constructed so as to carry twenty-six sheets of wafers W at regular intervals of L and also carry fifty-two sheets of wafers W at regular intervals of about L/2. In detail, as shown in FIG. 29, the wafer chuck 124a has grooves 125a and gaps 126a alternately formed on the upper part at regular intervals of L/2, while the wafer chuck 124b has grooves 125b and gaps 126b alternately formed on the upper part at regular intervals of L/2, too. These grooves 125a, 125b and the gaps 126a, 126b are formed in twenty-six places, respectively. Both interval between the adjoining grooves 125a and interval between the adjoining gaps 125b are identical to the regular intervals of L, respectively. Additionally, the wafer chuck 124a has fifty-two grooves 127a formed on the lower part at regular intervals of L/2, while the wafer chuck 124b has fifty-two grooves 127b formed on the lower part at regular intervals of L/2, too.

Figure 30A:
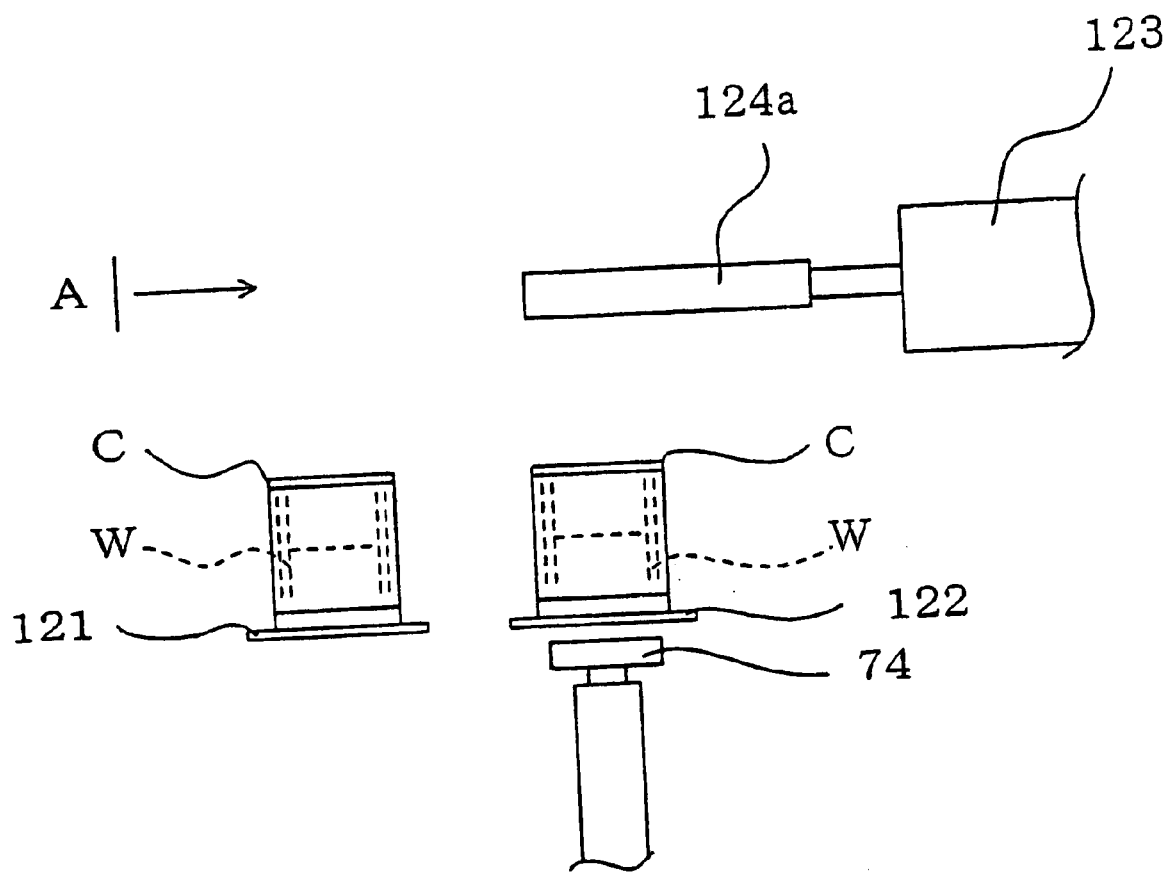
FIG. 30A is an explanatory diagram of the first process to array the wafers in the cleaning apparatus of FIG. 28.
Figure 30B:
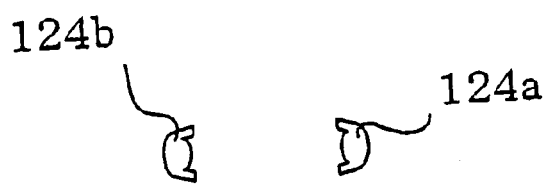
FIG. 30B is a diagram viewed in a direction A of FIG. 30A.

Next, the arraying method performed by the wafer arraying device 120 will be described with reference to the 1st. to 9th. process diagrams shown in FIGS. 30A, 30B to 38A, 38B. Note that FIGS. 30B to 38B illustrate the wafer chucks 124a, 124b viewed from A-directions of FIGS. 30A to 38A, respectively. First, the pickup-and-accommodation stages 121, 122 rotate with an angle of 90 degrees to direct the stations 34, 35 toward the unloading stage 21. Subsequently, on completion of moving the carriers C mounted on the stations 30, 31 to the stations 34, 35 respectively, the pickup-and-accommodation stages 121, 122 rotate with an angle of 90 degrees again to direct the stations 34, 35 toward the stock section 3. Next, as shown in FIGS. 30A and 30B, the transfer arm 123 moves to the side of the wafer arraying device 120 and further transfers the wafer chucks 124a, 124b upward of the pickup-and-accommodation stage 122. Note that, in this wafer arraying device 120, the carrier C mounted on the side of the pickup-and-accommodation stage 122 (i.e. on the right side in FIGS. 30A to 38A) is defined as a carrier C on one side, while the carrier C mounted on the side of the pickup-and-accommodation stage 121 (i.e. on the left side in FIGS. 30A to 38A) is defined as another carrier C on the other side.

Figure 31A:
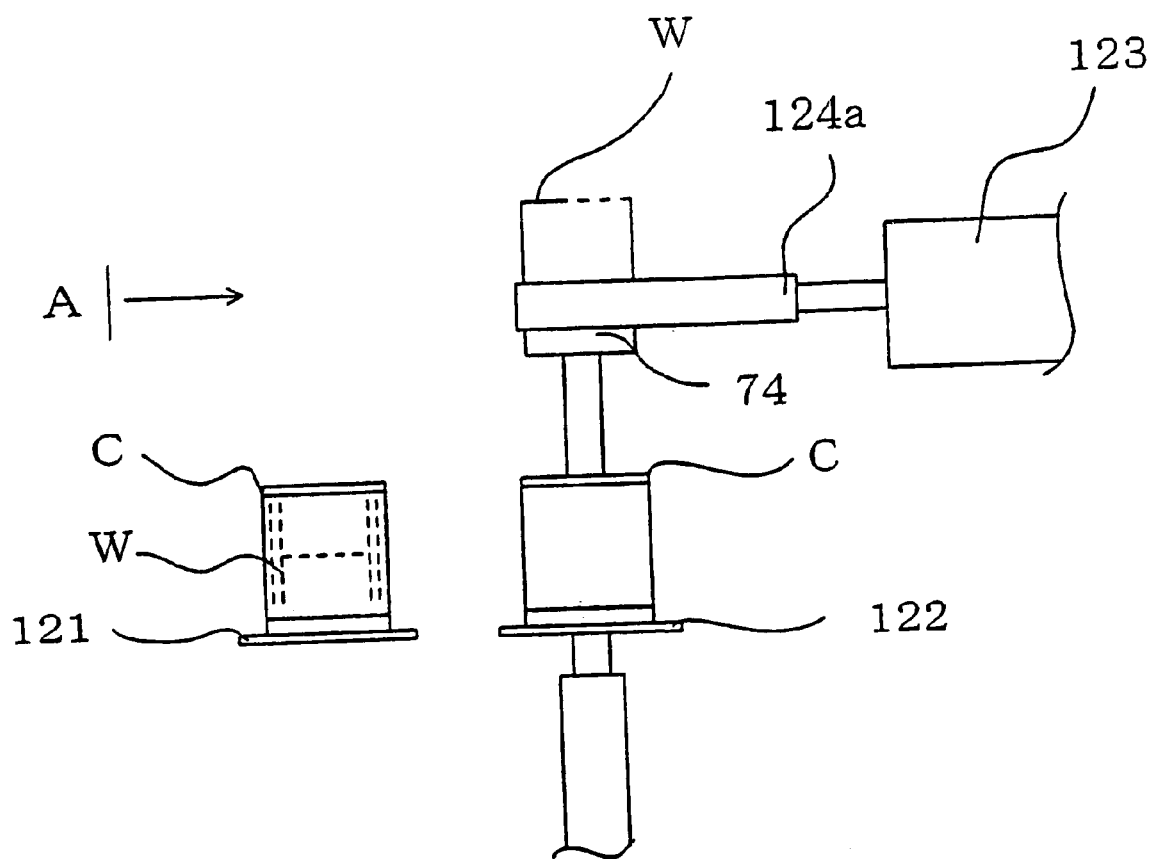
FIG. 31A is an explanatory diagram of the second process to array the wafers in the cleaning apparatus of FIG. 28.
Figure 31B:
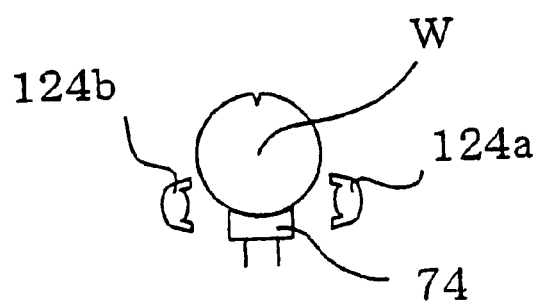
FIG. 31B is a diagram viewed in a direction A of FIG. 31A.
Figure 33A:
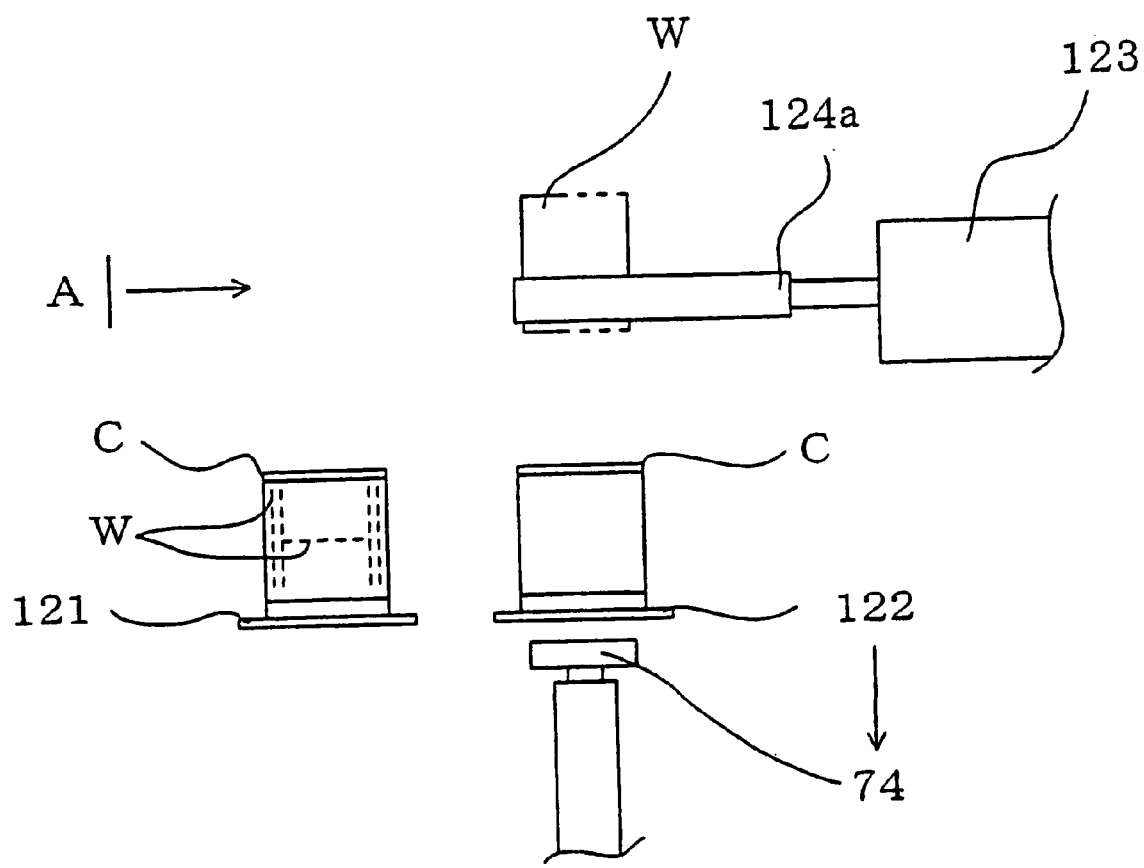
FIG. 33A is an explanatory diagram of the fourth process to array the wafers in the cleaning apparatus of FIG. 28.
Figure 33B:
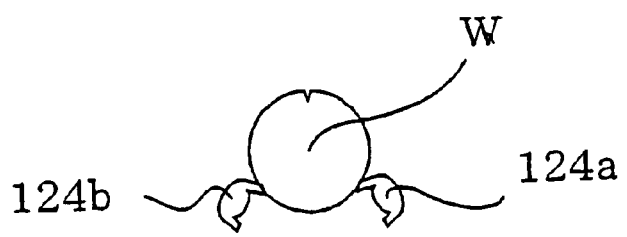
FIG. 33B is a diagram viewed in a direction A of FIG. 33A.
Figure 34A:
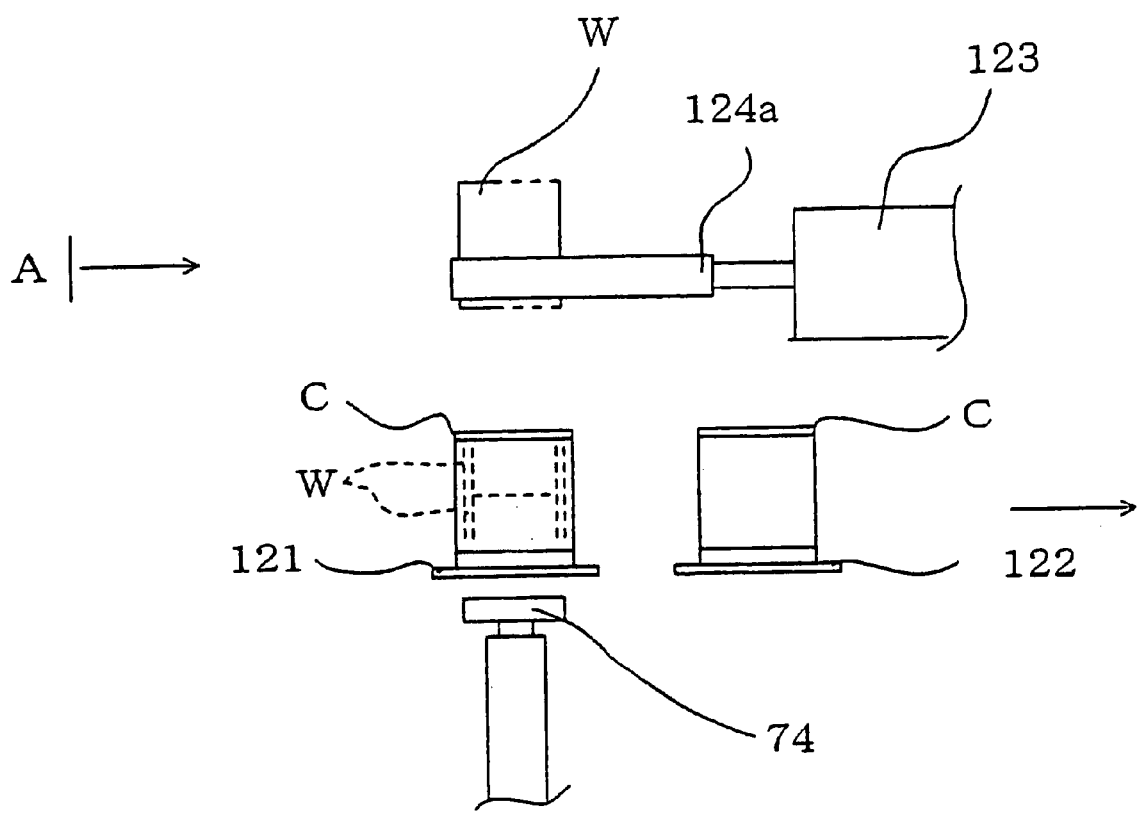
FIG. 34A is an explanatory diagram of the fifth process to array the wafers in the cleaning apparatus of FIG. 28.
Figure 34B:
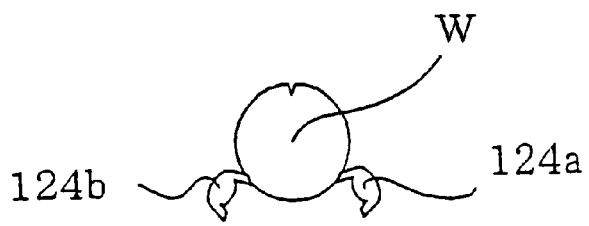
FIG. 34B is a diagram viewed in a direction A of FIG. 34A.

Next, as shown in FIGS. 31A and 31B, the wafer hand 74 on the side of the pickup-and-accommodation stage 121 rises to pick up the twenty-six sheets of wafers W from the carrier C on one side. Subsequently, as shown in FIGS. 32A and 32B, the wafer chucks 124a, 124b close on their upper sides and hold the above wafers W through the grooves 125a, 125b. Next, as shown in FIGS. 33A and 33B, the wafer hand 74 descends to deliver the twenty-six sheets of wafers W picked up from the carrier C to the wafer chucks 124a, 124b. Thereafter, as shown in FIGS. 34A and 34B, both of the pickup-and-accommodation stages 121, 122 move to the side of the stock section 3 (right side in FIG. 34A) to transfer the other carrier C downward of the wafer chucks 124a, 124b. Then, similarly to the descriptions of FIG. 24, the movement of the pickup-and-accommodation stages 121, 122 is established so that when moving the other carrier C downward of the wafer chucks 124a, 124b, then the twenty-six sheets of wafers W from the carrier C are respectively positioned between the respective wafers W from the other carrier C and the intervals between the adjoining wafers W are respectively equal to about L/2, in plan view.

Figure 36A:
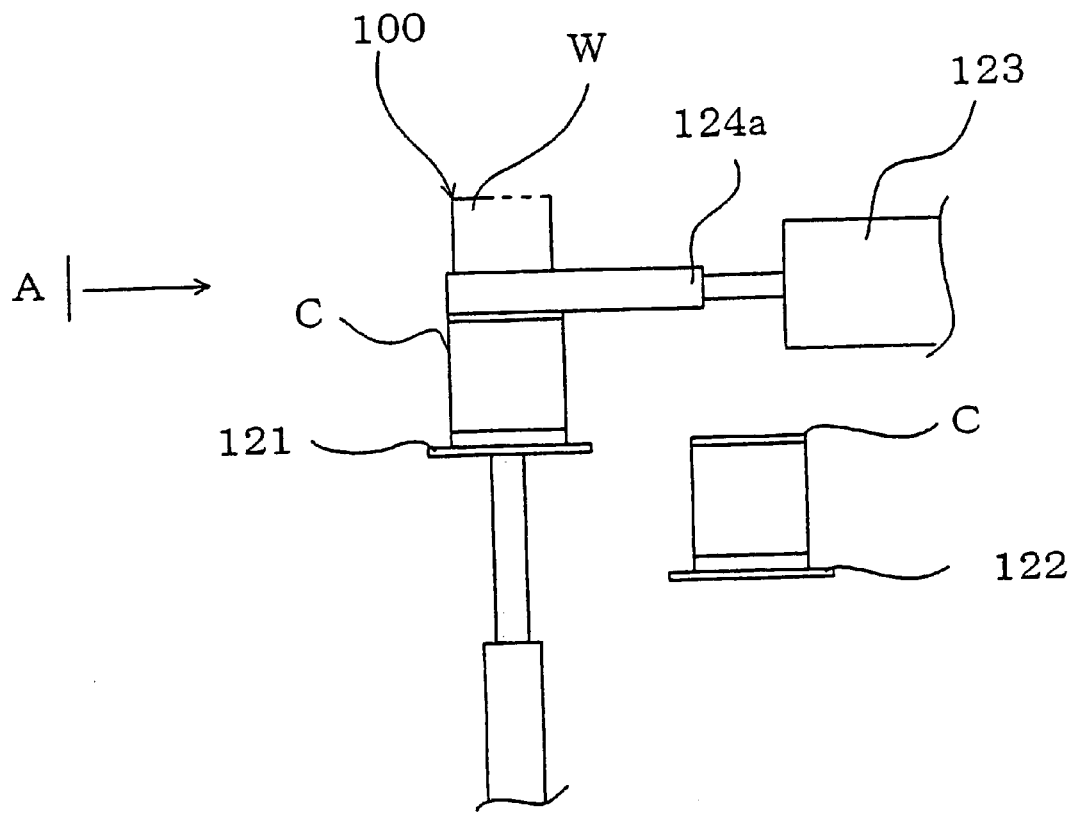
FIG. 36A is an explanatory diagram of the seventh process to array the wafers in the cleaning apparatus of FIG. 28.
Figure 36B:
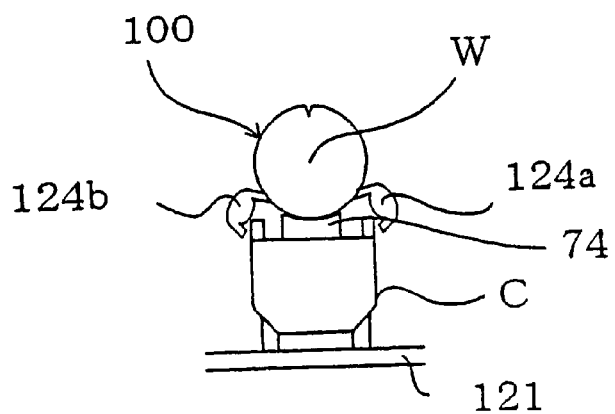
FIG. 36B is a diagram viewed in a direction A of FIG. 36A.
Figure 38A:
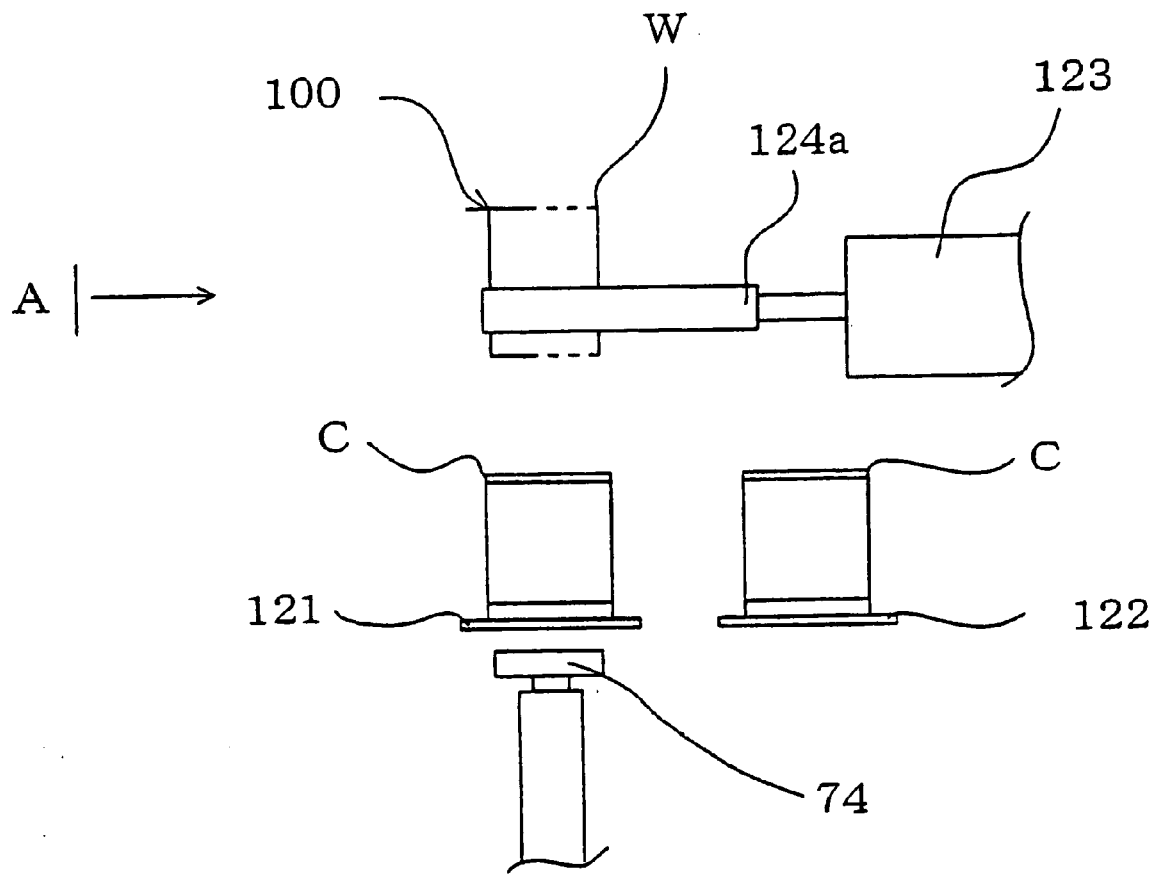
FIG. 38A is an explanatory diagram of the ninth process to array the wafers in the cleaning apparatus of FIG. 28.
Figure 38B:
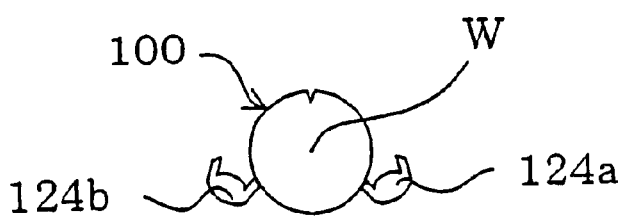
FIG. 38B is a diagram viewed in a direction A of FIG. 38A.

Next, as shown in FIGS. 35A and 35B, the pickup-and-accommodation stage 121 is elevated so as to move the wafers W, which have been picked up from the carrier C on one side, just above the other carrier C relatively. Next, as shown in FIGS. 36A and 36B, the wafer hand 74 rises to take the twenty-six sheets of wafers W out of the other carrier C and form the wafer group 100. Subsequently, as shown in FIGS. 37A and 37B, the wafer chucks 124a, 124b close on their lower sides and hold the fifty-two sheets of wafers W through the grooves 127a, 127b at even intervals of L/2 (about half of intervals L). Thereafter, as shown in FIGS. 38A and 38B, the pickup-and-accommodation stage 121 is lowered. Then, since the transfer arm 123 has already carried the wafer group 100, it can be transported to the cleaning-and-drying section 4 immediately.

According to the above-mentioned arraying method and device 120, as the transfer arm 123 also functions as the afore-mentioned pitch changer 80, it is possible to shorten a period from the formation of the wafer group 100 till the drying process at the cleaning-and-drying section 4. Accordingly, the throughout of the device 120 can be improved in comparison with that of the wafer arraying devices 22, 110. Further, the device itself can be simplified more. As similar to the first and second embodiments, the above arraying method may include an additional step of reversing the front faces Wa and the back faces Wb of the twenty-six sheets of wafers W taken out of the carrier C on one side.

Note that the present invention is not limited to only the above-mentioned embodiments and therefore, it may be applicable in various modifications. In the first and second embodiments, the pitch changer may be constructed so as to reverse each front face and each back face of the twenty-six sheets of wafers W taken out of the carrier C on one side. In the third embodiment, the transfer arm may be constructed so as to reverse each front face and each back face of the twenty-six sheets of wafers W taken out of the carrier C.

Although the above-mentioned embodiments have been described with reference to the cleaning apparatus for cleaning the wafers in batches, the invention is not limited to the above apparatus but it is applicable to the other apparatus for performing a designated treatment, for example, an apparatus for applying a designated treatment liquid on the wafers. Additionally, although the wafers have been referred as the substrates throughout the embodiments, the present invention is not limited to such the embodiments but applicable to the other substrates, for example, LCD substrates etc.

A wafer arraying device 222 of the fourth embodiment will be described below. As similar to the wafer arraying device 22 of the first embodiment, the wafer arraying device 222 is applied to the cleaning apparatus 1 of FIGS. 1 and 2, also using the carrier C as shown in FIG. 3.

Figure 39:
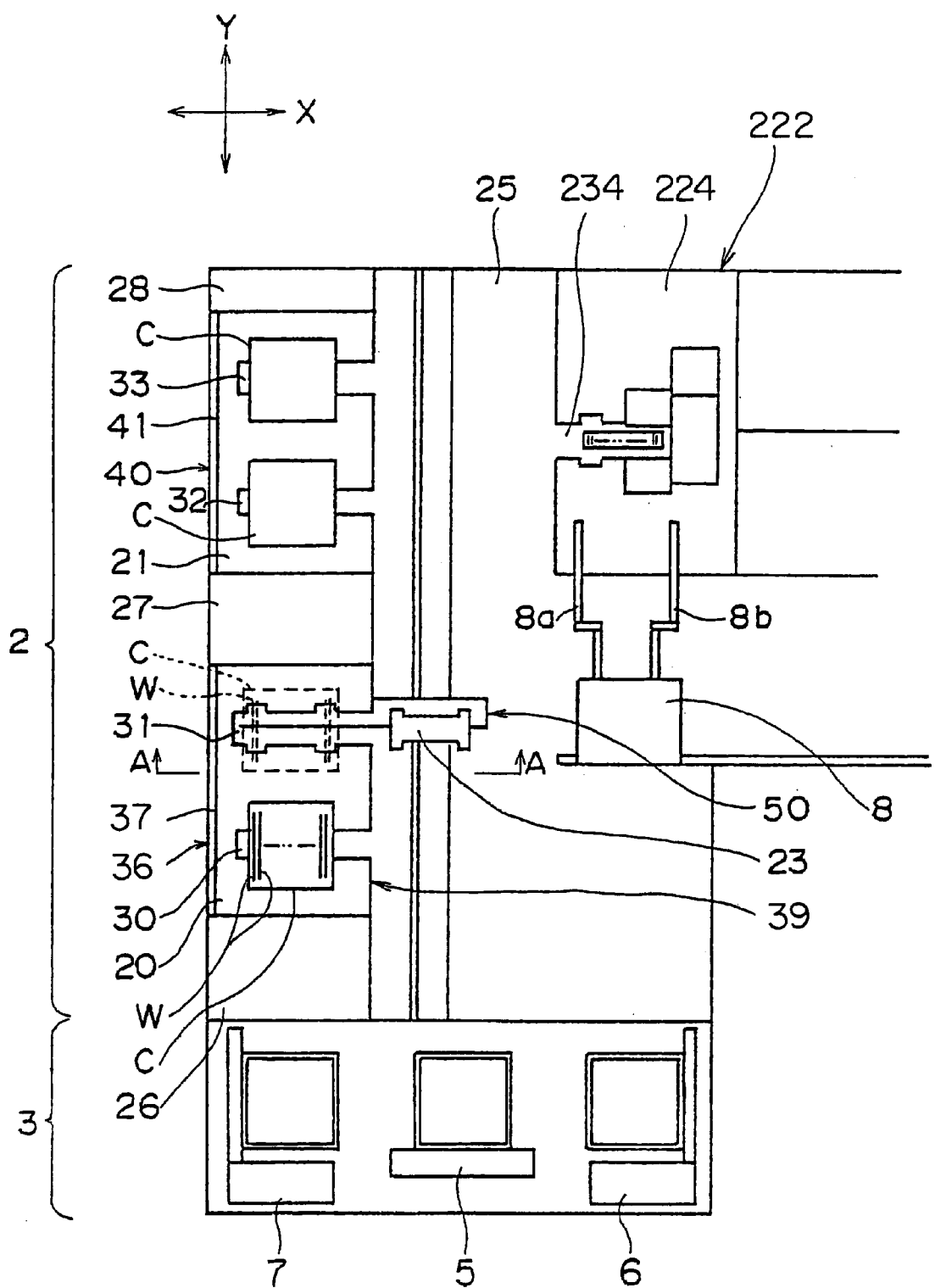
FIG. 39 is an enlarged plan view of an essential part of the cleaning apparatus in the application of the wafer arraying device in accordance with the fourth embodiment of the invention.
Figure 40:
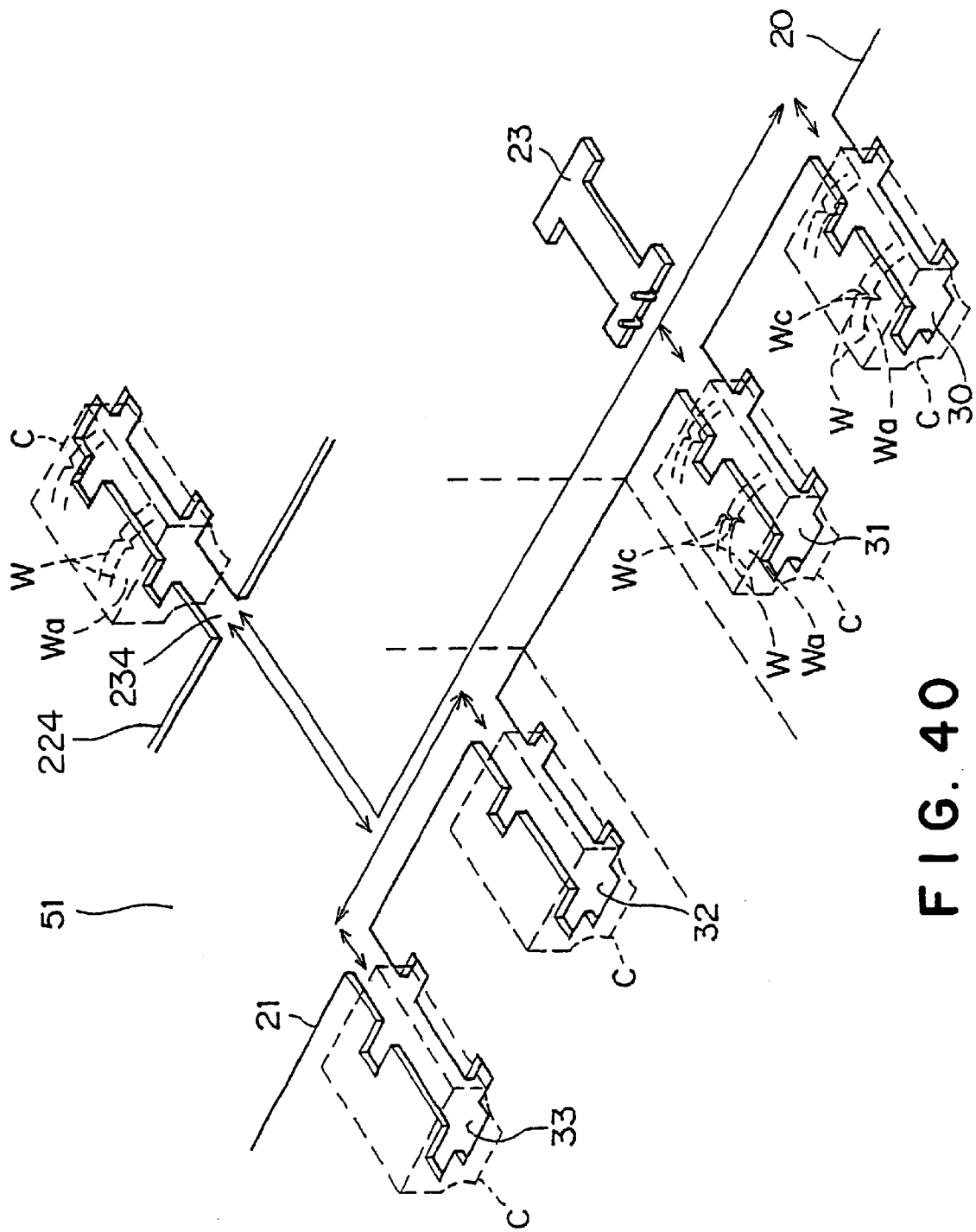
FIG. 40 is a perspective view of the loading stage, the unloading stage, the pickup-and-accommodating stage and the moving table, showing a state to move the carrier.

Different from the wafer arraying device 22 provided with two stations on the pickup-and-accommodation stage 24, the wafer arraying device 222 has a single station 234 on a pickup-and-accommodation stage 224, as shown in FIGS. 39 and 40. In arrangement, the carrier C is mounted on the periphery of an opening of the station 234, through the margin of the carrier's lower face. Note that there are also employed the moving means 50, the transfer table 23, etc. of FIGS. 6 and 7 in this embodiment.

Figure 42:
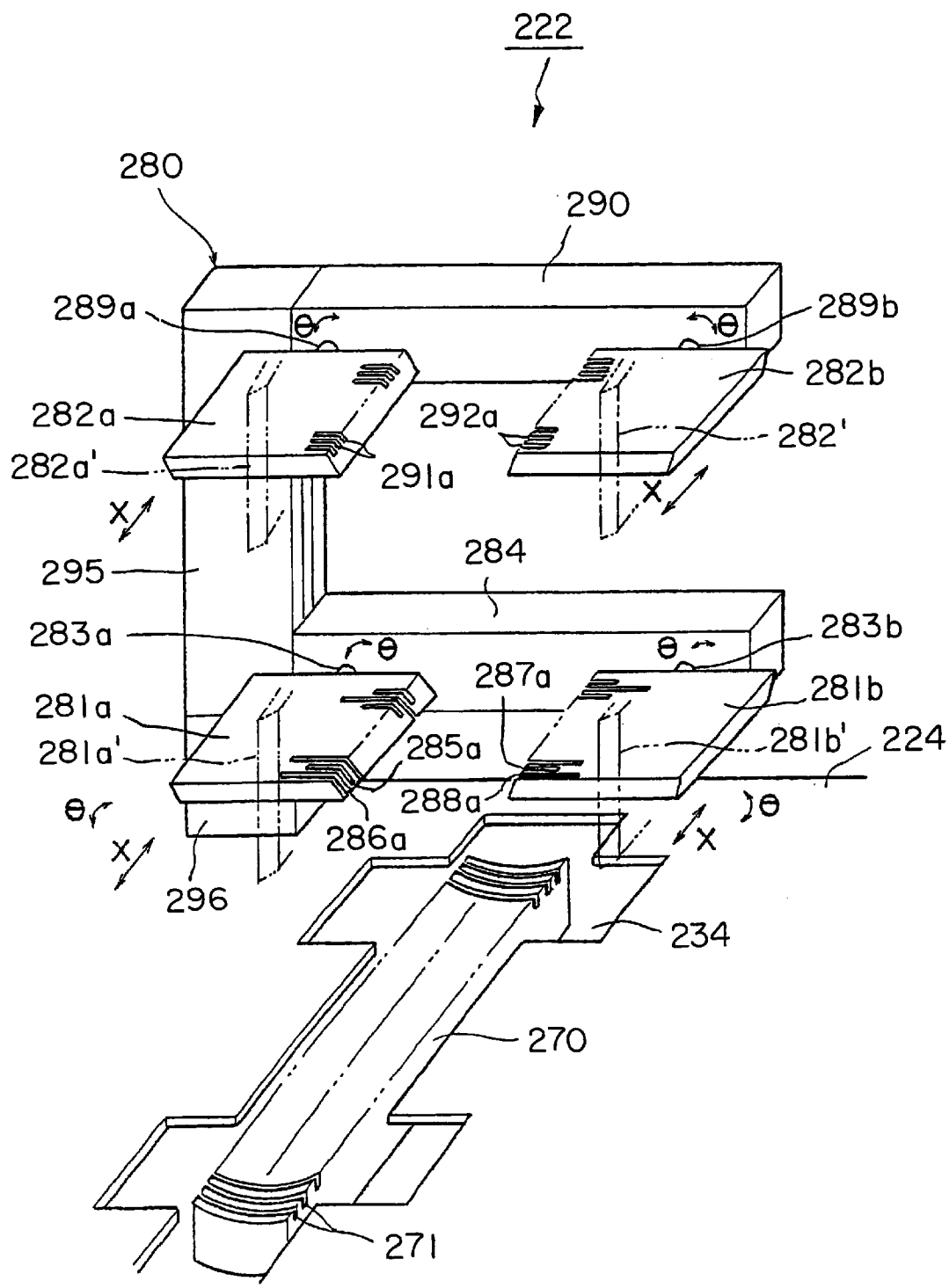
FIG. 42 is a perspective view of the pitch changer and the wafer hand.

FIGS. 41 and 42 show the wafer arraying device 222 provided, below the pickup-and-accommodation stage 224, with a wafer hand 270. The wafer hand 270 is constructed so as to allow twenty-six sheets of wafers W to be taken into and out of the carrier C while they are arranged at regular intervals of L. Further, the wafer hand 270 is adapted so as to allow fifty-two sheets of wafers W to be carried while they are arranged at regular intervals of L/2.

As shown in FIG. 43A, the wafer hand 270 has fifty-two grooves 271 formed at regular intervals of L/2. In FIGS. 41 and 43B, a rotational elevating shaft 273 of a rotational elevating mechanism 272 supports the wafer hand 270. The rotational elevating shaft 273 is connected with the wafer hand 270 eccentrically. The wafer hand 270 is constructed so as to be rotatable about the rotational elevating shaft 273 in a horizontal plane (θ-direction in FIG. 43B) owing to the rotational elevating mechanism 272. Further, as shown in FIG. 41, the rotational elevating mechanism 272 is fixed on a top face of an elevating member 275 moving up and down along a first guide rail 274. The first guide rail 274 has its lower part slidably mounted on a second guide rail 276 laid along a front-and-behind direction (X-direction) of the cleaning apparatus 1. Thus, the wafer hand 270 can move along an upward-and-downward direction (Z-direction in FIG. 41) and also the front-and-behind direction (X-direction in FIG. 41). With the above arrangement, when the carrier C having twenty-six sheets of wafers W accommodated therein is mounted on the pickup-and-accommodation stage 224 and if the wafer hand 270 is raised to project the wafers W from the carrier C by the rotational elevating mechanism 272 and the elevating member 275, then the lower peripheries of the wafers W are inserted into the fifty-two grooves 271 alternately.

As shown in FIG. 42, on the pickup-and-accommodation stage 224, there is provided a pitch changer 280 as deliver means that gives and receives the wafers W to and from the wafer hand 270, respectively. The pitch changer 280 is provided with left/right first carrying members 281a, 281b in pairs and left/right second carrying members 282a, 282b in pairs, for carrying the wafers W The first carrying member 281a and the first carrying member 281b are together connected with a first support 284 through a support shaft 283a and a support shaft 283b, respectively. The first support 284 is provided, therein, with a drive mechanism (not shown) which allows the first carrying member 281a and the first carrying member 281b to rotate about the support shaft 283a and the support shaft 283b, respectively (θ-direction in FIG. 43B). The first carrying members 281a, 281b shown with solid lines in FIG. 42 represent their horizontal postures brought by the operation of the drive mechanism, respectively. The wafers W are carried by the first carrying members 281a, 281b in their horizontal postures. Due to the operation of the drive mechanism, when the first carrying members 281a, 281b are respectively rotated for their vertical postures with an angle of 90 degrees to respective positions 281a', 281b' shown with two-dot chain lines, then the resultant arrangement allows the wafers W to be released from the first carrying members 281a, 281b and to pass between the second carrying members 282a, 282b. Further, by expanding and contracting the support shaft 283a, the first carrying member 281a can move in a front-and-behind direction (X-direction in FIG. 42) horizontally. Similarly, by expanding and contracting the support shaft 283b, the first carrying member 281b can move in a front-and-behind direction (X-direction in FIG. 42) horizontally.

Figure 44:
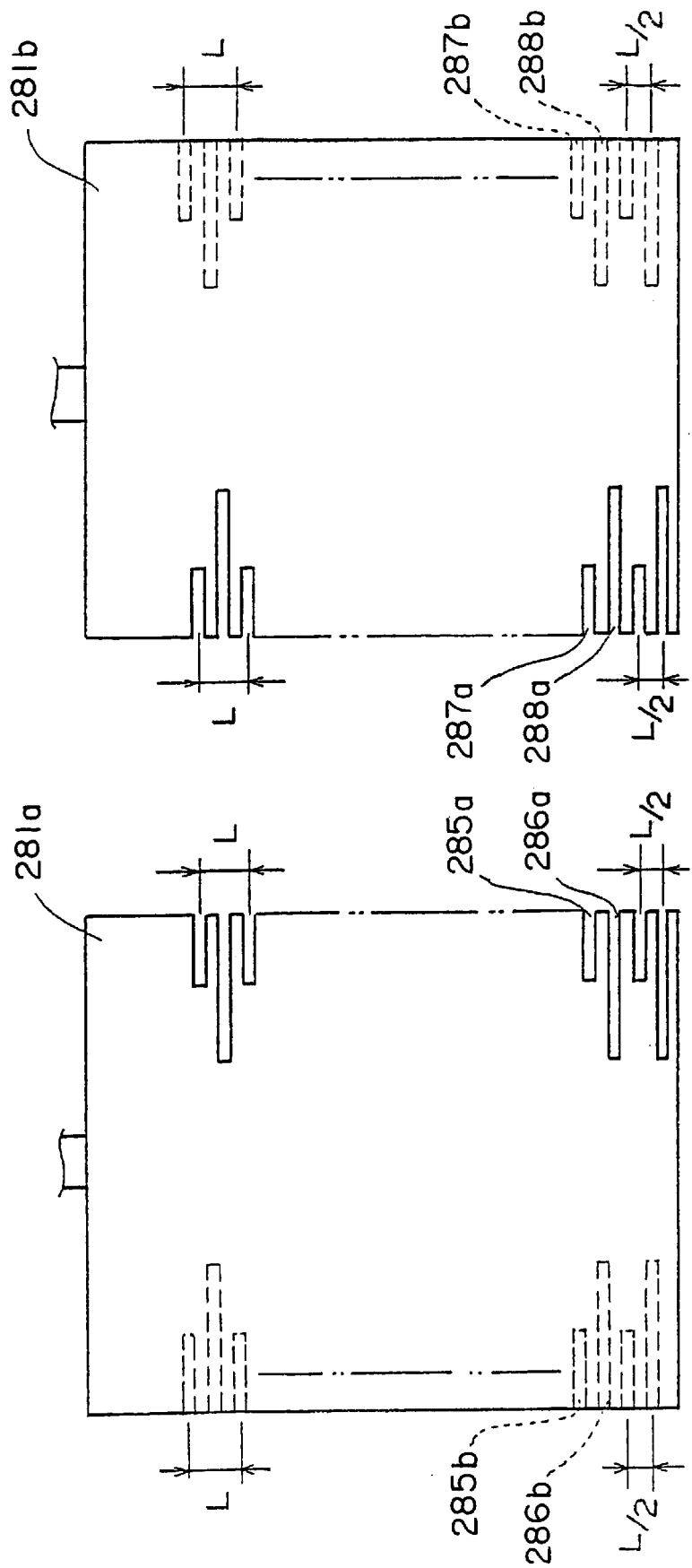
FIG. 44 is a plan view of a first carrying member.

As shown in FIG. 44, in the first carrying member 281a, grooves 285a and gaps 286a are formed in the circumference of the right side (on the same member's right side in FIG. 44) on the top face, alternately at regular intervals of L/2 and similarly, grooves 285b and gaps 286b are formed in the circumference of the left side (on the same member's left side in FIG. 44) on the under face, alternately at regular intervals of L/2. These grooves 285a, 285b and the gaps 286a, 286b are formed in thirteen places, respectively. The grooves 285a are arranged at regular intervals of L and the other grooves 285b are also arranged at regular intervals of L The gaps 286a, 286b are respectively provided with sufficient widths (lengths) by which the peripheries of the wafers W carried by the wafer hand 270 could pass through the gaps 286a, 286b if rising and falling the carrying member 281a in the horizontal posture. Also in the first carrying member 281b, grooves 287a and gaps 288a are formed in the circumference of the left side (on the same member's left side in FIG. 44) on the top face, alternately at regular intervals of L/2 and similarly, grooves 287b and gaps 288b are formed in the circumference of the right side (on the same member's right side in FIG. 44) on the under face, alternately at regular intervals of L/2. These grooves 287a, 287b and the gaps 288a, 288b are formed in thirteen places, respectively. The grooves 288a are arranged at regular intervals of L and the other grooves 288b are also arranged at regular intervals of L. The gaps 288a, 288b are also provided with sufficient widths (lengths) by which the peripheries of the wafers W carried by the wafer hand 270 could pass through the gaps 288a, 288b if rising and falling the carrying member 281b in the horizontal posture.

In the example of FIG. 42, the grooves 285a and the grooves 287a are arranged to face each other and also adapted so as to carry thirteen sheets of wafers W before cleaning at regular intervals of L. On the other hand, when the fist carrying members 281a, 281b are rotated with an angle of 180 degrees, then the grooves 285b and the grooves 287b face each other, so that thirteen sheets of wafers W after cleaning can be carried by the grooves 285b, 287b at regular intervals of L. Thus, even if the particles separated from the wafers W before cleaning stick to the grooves 285a, 287a disadvantageously, it is possible to prevent the particles on the grooves 285a, 287a from sticking to the cleaned wafers W since they are carried by the grooves 285a, 287a.

The second carrying member 282a and the second carrying member 282b are together connected with a second support 290 through a support shaft 289a and a support shaft 289b, respectively. Similarly to the first carrying members 281a, 281b, the second carrying members 282a, 282b are constructed so as to be rotatable (θ-direction in FIG. 42) and movable in a front-and-behind direction (X-direction in FIG. 42) horizontally. The second carrying members 282a, 282b shown with solid lines in FIG. 42 represent their horizontal postures, while the same members 282a, 282b shown with two-dot chain lines in FIG. 42 represent their vertical postures.

Figure 45:
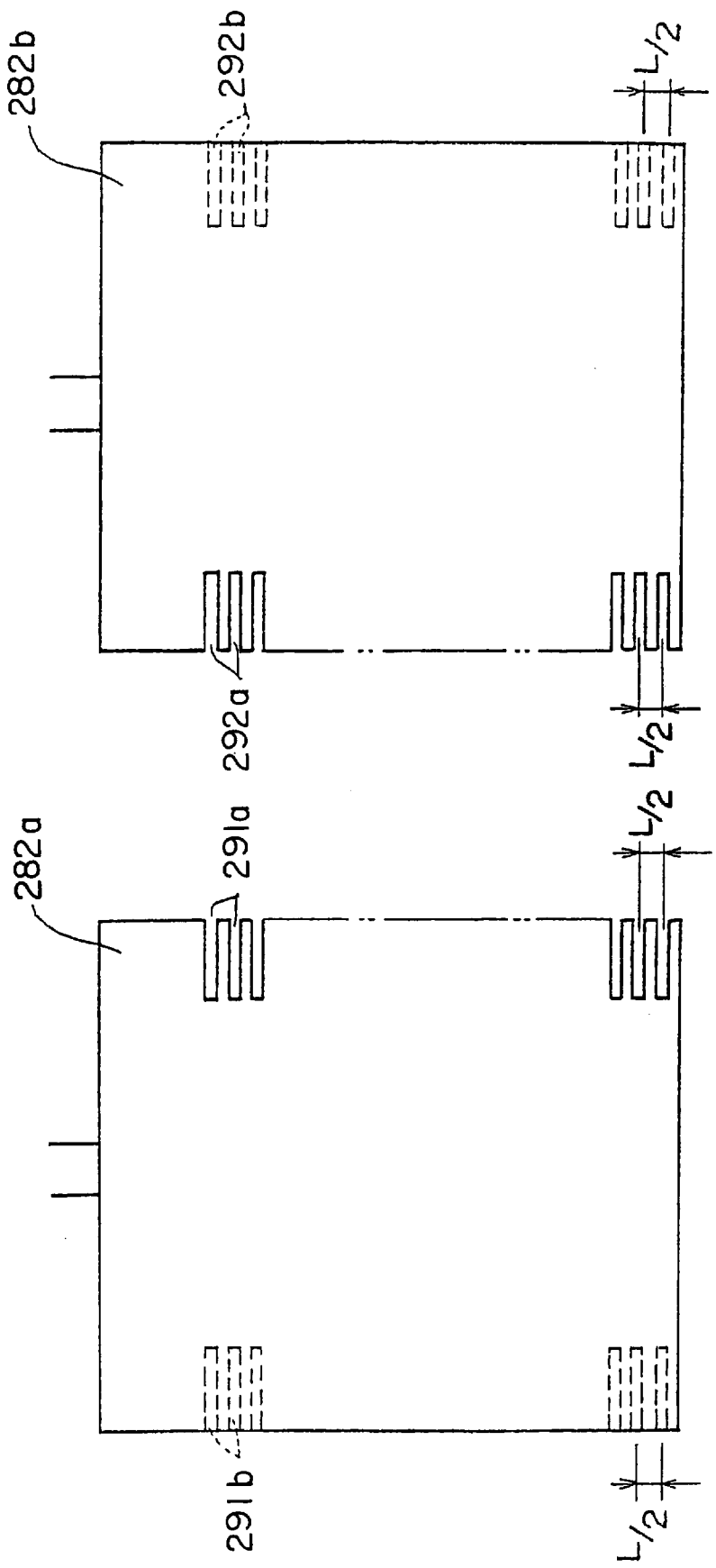
FIG. 45 is a plan view of a second carrying member.

As shown in FIG. 45, in the second carrying member 282a, twenty-six grooves 291a are formed in the circumference of the right side (on the same member's right side in FIG. 45) on the top face, at regular intervals of L/2. Similarly, twenty-six grooves 291b are formed in the circumference of the left side (on the same member's left side in FIG. 45) on the under face, at regular intervals of L/2. Further, in the second carrying member 282b, twenty-six grooves 292a are formed in the circumference of the left side (on the same member's left side in FIG. 45) on the top face, at regular intervals of L/2. Similarly, twenty-six grooves 292b are formed in the circumference of the right side (on the same member's right side in FIG. 45) on the under face, at regular intervals of L/2.

In the example of FIG. 42, the grooves 291a of the second carrying member 282a and the grooves 292a of the second carrying member 282b are arranged to face each other and also adapted so as to carry twenty-six sheets of wafers W before cleaning at regular intervals of L/2. As similar to the first carrying members 281a, 281b, the second carrying members 282a, 282b are adapted so as to carry twenty-six sheets of wafers W after cleaning by the grooves 289b, 291b, at regular intervals of L/2. Therefore, it is possible to prevent the particles from sticking to the cleaned wafers W.

Both of the first support 284 and the second support 290 are attached to a guide rail 295 so as to be movable up and down (Z-direction in FIG. 42). The guide rail 295 is supported by a support 296 fixed on the top face of the pickup-and-accommodation stage 224. Therefore, the first carrying members 281a, 281b and the second carrying members 282a, 282b are all constructed so as to be movable up and down.

Next, we describe both operation and effects of the above-constructed wafer arraying device 222 in accordance with the fourth embodiment, on the ground of the designated cleaning process of the wafers W in the cleaning apparatus 1. For example, by a worker in a factory, it is carried out to load two carriers C each having e.g. twenty-six sheets of wafers W accommodated therein, into the loading stage 20. At first, the transfer table 23 moves the carrier C mounted on the station 31 to the wafer arraying device 222 and places the carrier C on the pickup-and-accommodation stage 224.

Hereat, we describe the arraying method performed in the wafer arraying device 222, with reference to the explanatory process diagrams of the 1st. to 19th. process shown in FIGS. 46 to 64.

Figure 46:
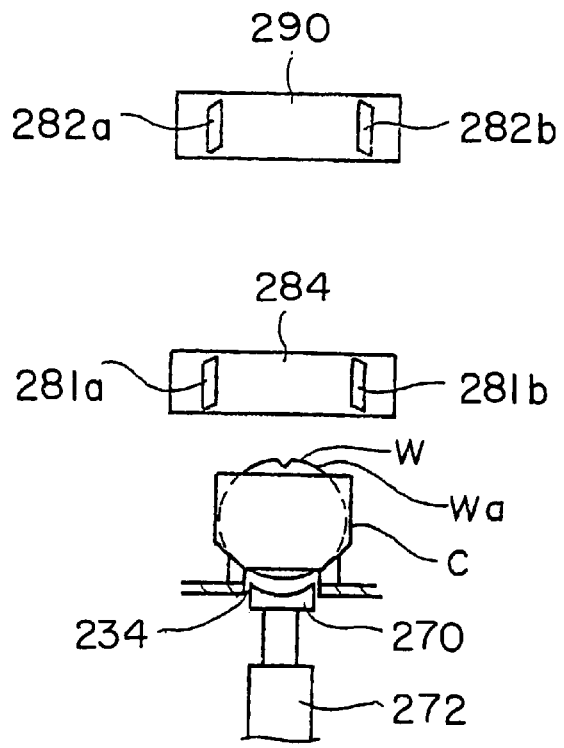
FIG. 46 is an explanatory diagram of the first process to array the wafers in the wafer arraying device of FIG. 41.
Figure 47:
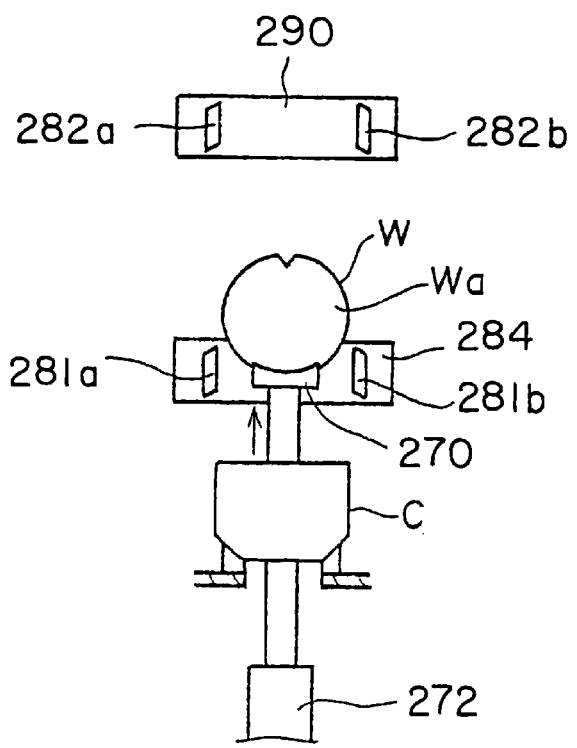
FIG. 47 is an explanatory diagram of the second process to array the wafers in the wafer arraying device of FIG. 41.

As shown in FIG. 46, all the first carrying members 281a, 281b and the second carrying members 282a, 282b occupy their vertical postures, at first. In the carrier C, twenty-six sheets of wafers W are accommodated at regular intervals of L while directing their front faces Wa ahead of the cleaning apparatus 1 (the front side of space of FIG. 46). The wafer hand 270 enters into the station 234 with the ascent of the rotational elevating mechanism 272. Subsequently, as shown in FIG. 47, the drive of the rotational elevating mechanism 272 causes the wafer hand 270 to be elevated, so that the wafers W are taken out of the carrier C. Then, the wafer hand 270 projects the wafers W to a height where they would not interrupt the movements of the first carrier members 281a, 281b from their vertical postures to the horizontal postures. At this time, since the lower peripheries of the wafers W are alternately inserted into fifty-two grooves 271 formed on the wafer hand 270, twenty-six sheets of wafers W are arranged on the wafer hand 270 at regular intervals of L. Thereafter, as shown in FIG. 48, the first carrying members 281a, 281b are rotated from the vertical postures to the horizontal postures, with an angle of 90 degrees.

Figure 50:
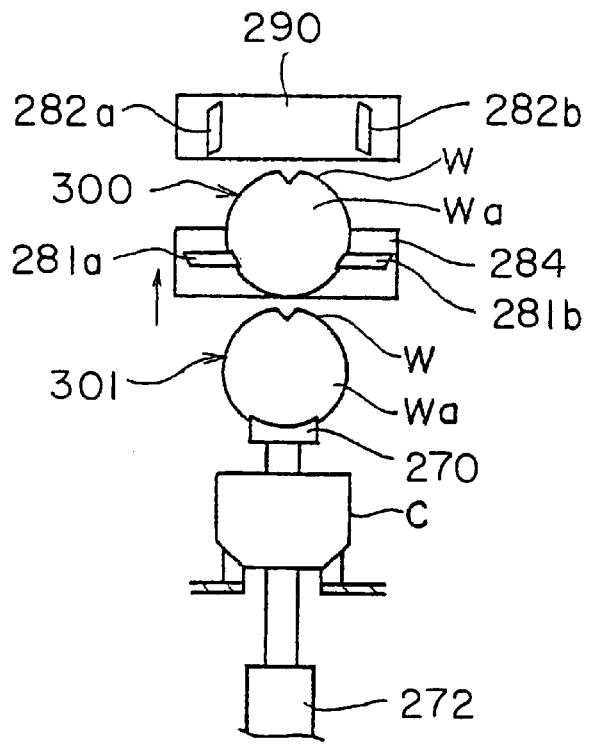
FIG. 50 is an explanatory diagram of the fifth process to array the wafers in the wafer arraying device of FIG. 41.
Figure 65:
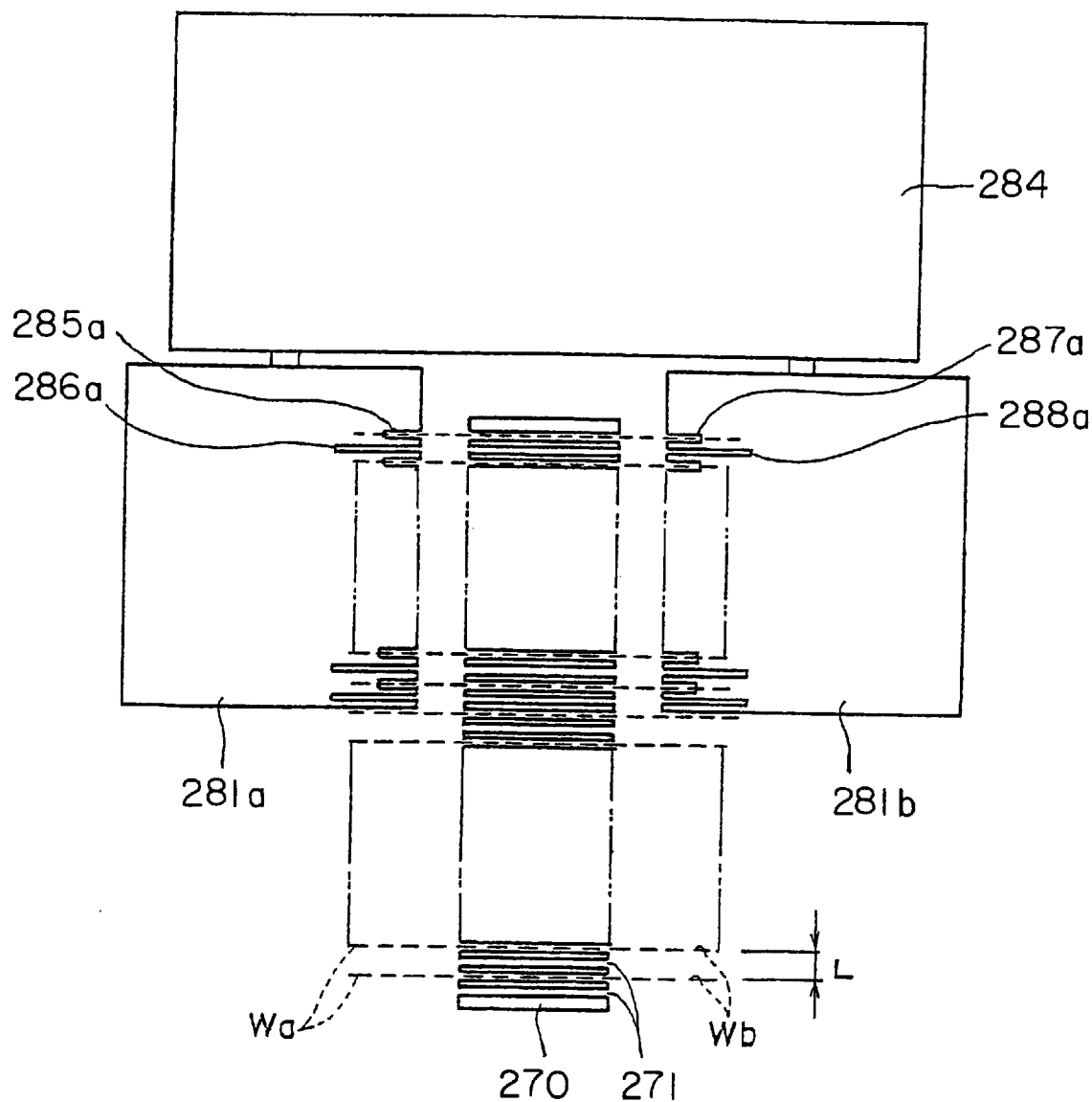
FIG. 65 is a plan view showing a situation of FIG. 49.
Figure 66:
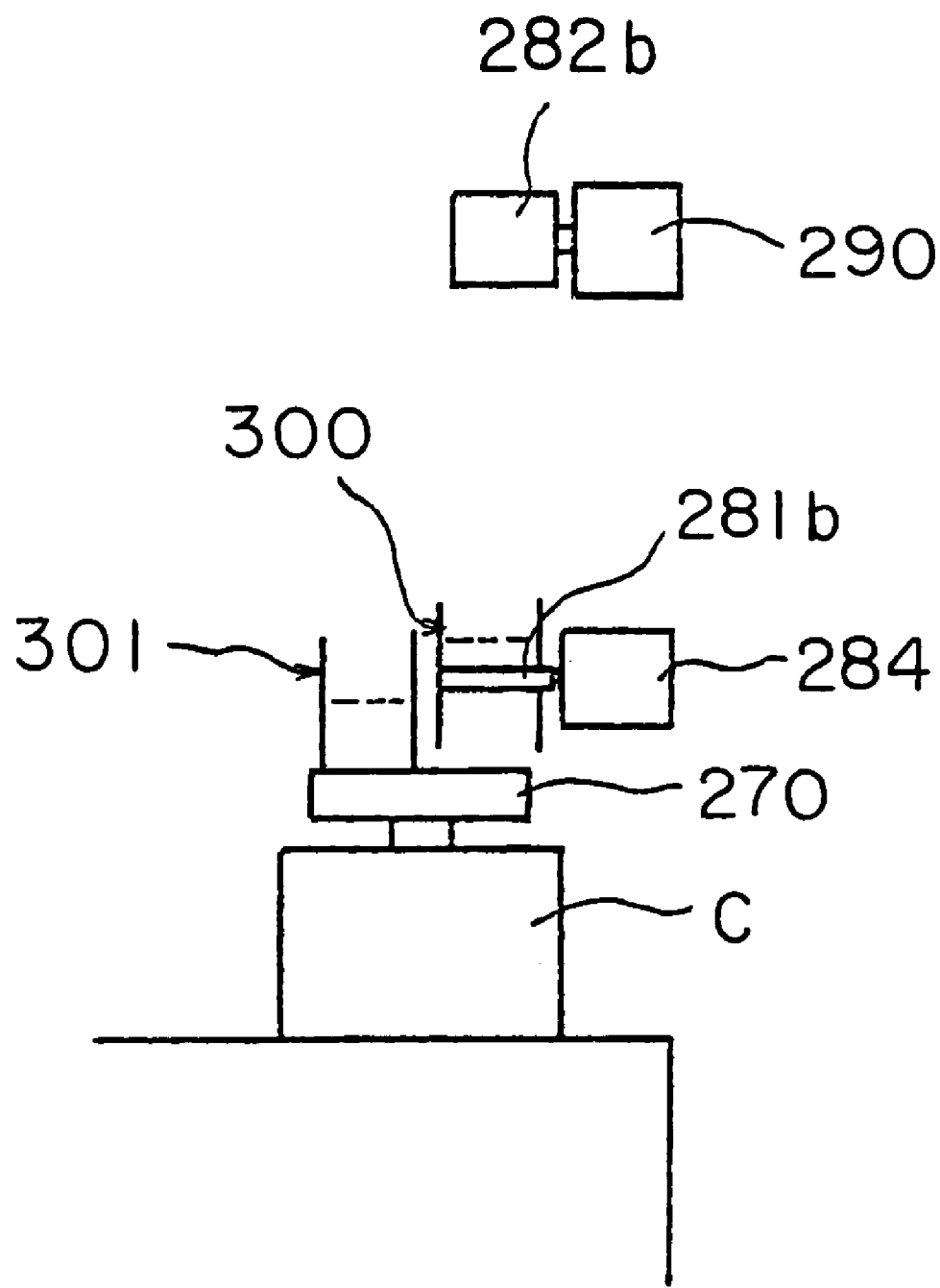
FIG. 66 is a side view showing the situation of FIG. 49.

After that, as shown in FIG. 49, the wafer hand 270 is slightly lowered by the operation of the rotational elevating mechanism 272 to deliver thirteen sheets of wafers W, which correspond to the back half of twenty-six sheets of wafers W, to the first carrying members 281a, 281b. FIG. 65 illustrates a situation at that time, in plan view. FIG. 66 illustrates the situation at that time, in side view. Thus, as shown in FIGS. 65 and 66, the thirteen sheets of wafers W of the back half have their peripheries inserted into the grooves 285a, 287a, so that the first carrying members 281a, 281b carry the wafers W. As shown in FIG. 50, with the ascent of the first support 284, the first carrying members 281a, 281b rise to divide the twenty-six sheets of wafers W taken out of the carrier C into the first wafer group 300 (on one hand) where thirteen sheets of wafers W carried by the pitch changer 280 are arranged at regular intervals of L and the second wafer group 301 (on the other hand) where thirteen sheets of wafers W carried by the wafer hand 270 are arranged at regular intervals of L.

Figure 51:
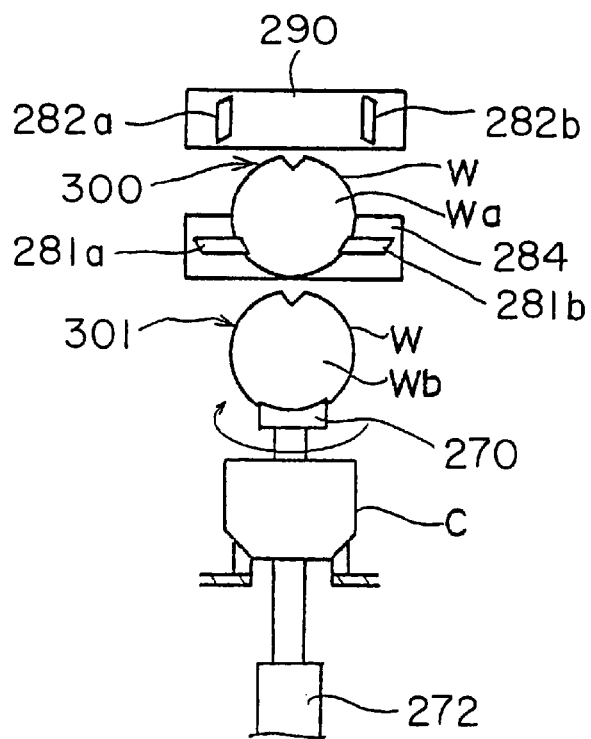
FIG. 51 is an explanatory diagram of the sixth process to array the wafers in the wafer arraying device of FIG. 41.
Figure 67:
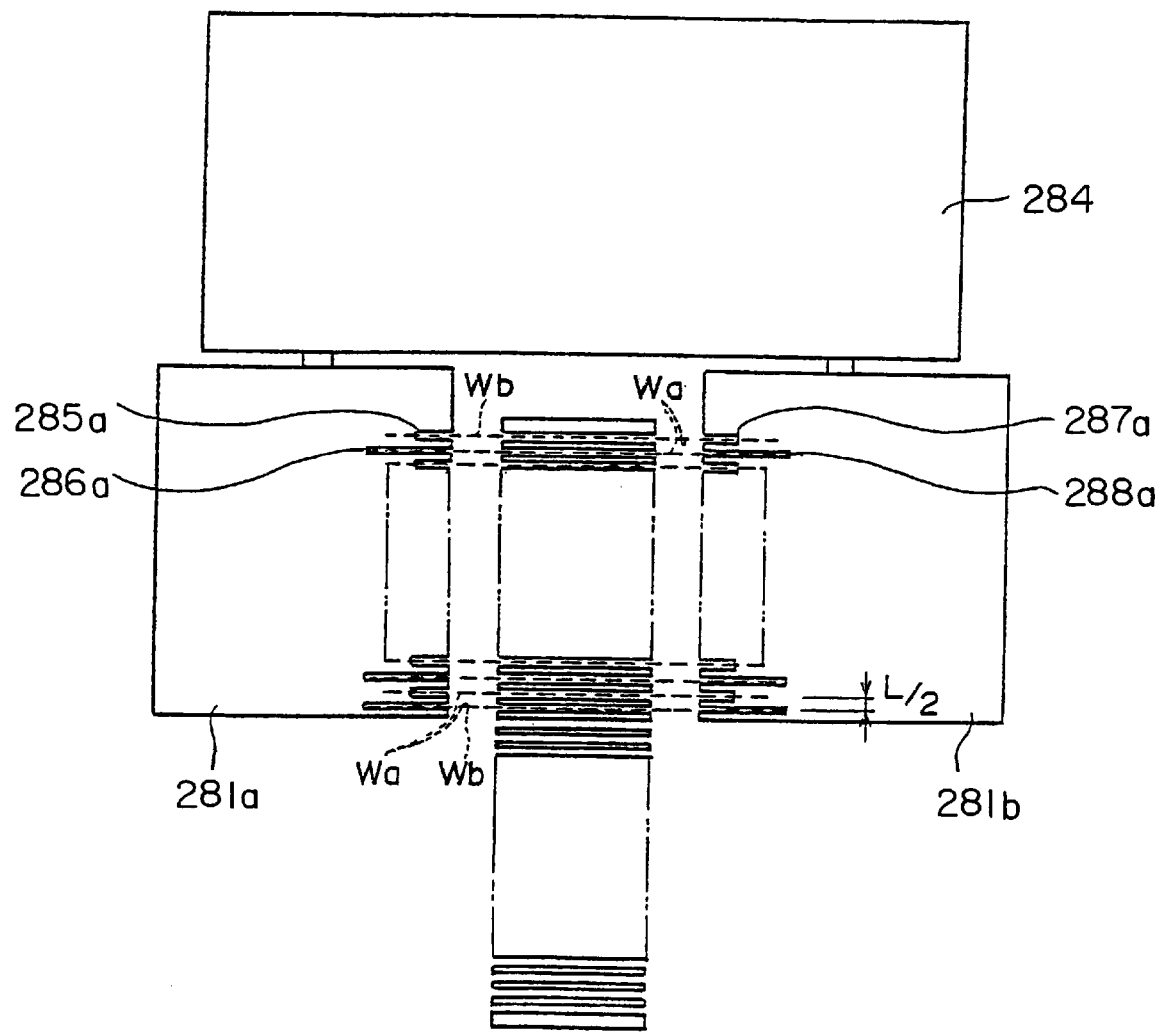
FIG. 67 is a plan view showing a situation of FIG. 51.
Figure 68:
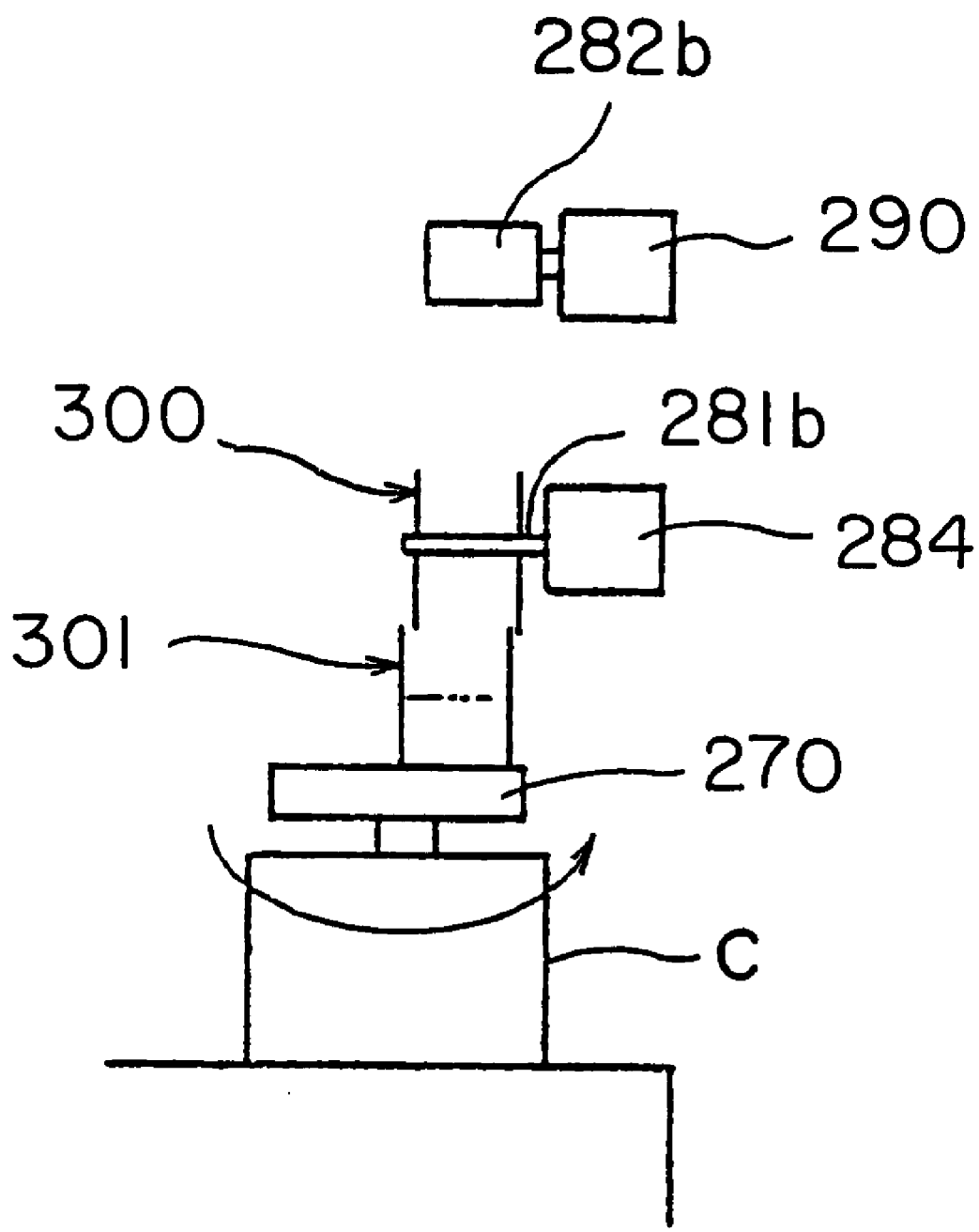
FIG. 68 is a side view showing the situation of FIG. 51.

Thereafter, as shown in FIG. 51, the wafer hand 270 rotates with an angle of 180 degrees to reverse the front faces Wa and the back faces Wb of the wafers W of the second wafer group 301. Consequently, the wafers W of the second wafer group 301 direct their back faces Wb ahead of the cleaning apparatus 1 (the front side of space of FIG. 51). With this reverse, the second wafer group 301 moves downward of the first wafer group 300. Such reverse and movement are accomplished by turning the second wafer group 301 about the rotational elevating shaft 273 (vertical axis) passing through a position deviated from the center of the wafer hand 270 (corresponding to these wafers' center in case arranging twenty-six sheets of wafers W on the wafer hand 270 at regular intervals). FIG. 67 illustrates a situation at that time, in plan view. FIG. 68 illustrates the situation at that time, in side view. Hereat, the eccentricity of the rotational elevating shaft 273 is so designated that if the second wafer group 301 moves downward of the first wafer group 300, then the respective wafers W of the first wafer group 300 are positioned between the respective wafers W of the second wafer group 301 in plan view and the intervals of the wafers W adjoining in plan view are equal to L/2 being substantial half of the intervals of L. Consequently, the respective wafers W of the second wafer group 301 and the wafers W of the first wafer group 300 are alternately arranged at regular intervals of L/2 being substantial half of the intervals of L.

Thereafter, as shown in FIG. 52, the first carrying members 281a, 281b descend with the descent of the first support 284 thereby to insert the respective wafers W of the first wafer group 300 into the respective wafers W of the second group 301. At this time, the peripheries of the respective wafers W of the second wafer group 301 pass through the gaps 286a, 288a of the first carrying members 281a, 281b, respectively. Subsequently, as shown in FIG. 53, the wafer hand 270 is elevated by the operation of the rotational elevating mechanism 272 to receive the second wafer group 301 from the first carrying members 281a, 281b, thereby forming the third wafer group 302 where twenty-six sheets of wafers W are arranged on the wafer hand 270 at regular intervals of L/2 being substantial half of the regular intervals of L. Then, the first carrying members 281a, 281b are rotated with an angle of 90 degrees from the horizontal postures to the vertical postures, while the second carrying members 282a, 282b are lowered below the third wafer group 302 into respective conditions where the wafers W would not be interrupted by the same members' change from the vertical postures to the horizontal postures. Note that the third wafer group 302 has a width being substantial half of a width of the arrangement where twenty-six sheets of wafers W are accommodated in the carrier C at regular interval of L. Additionally, in the third wafer group 302, the front faces Wa, Wa of the adjoining wafers W are opposite to each other and also the back faces Wb, Wb are opposite to each other since the front faces Wa and the back faces Wb of the wafers W of the second group 301 have been reversed, as mentioned before.

Figure 54:
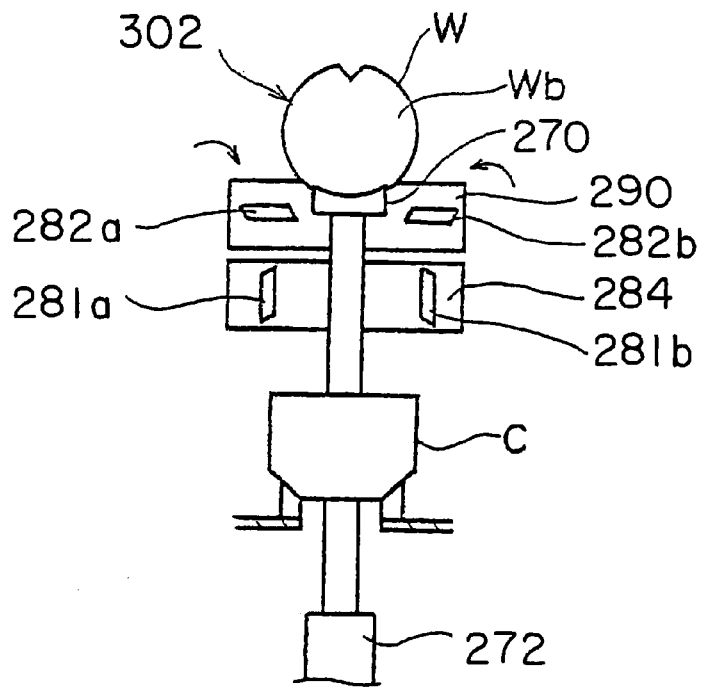
FIG. 54 is an explanatory diagram of the ninth process to array the wafers in the wafer arraying device of FIG. 41.
Figure 55:
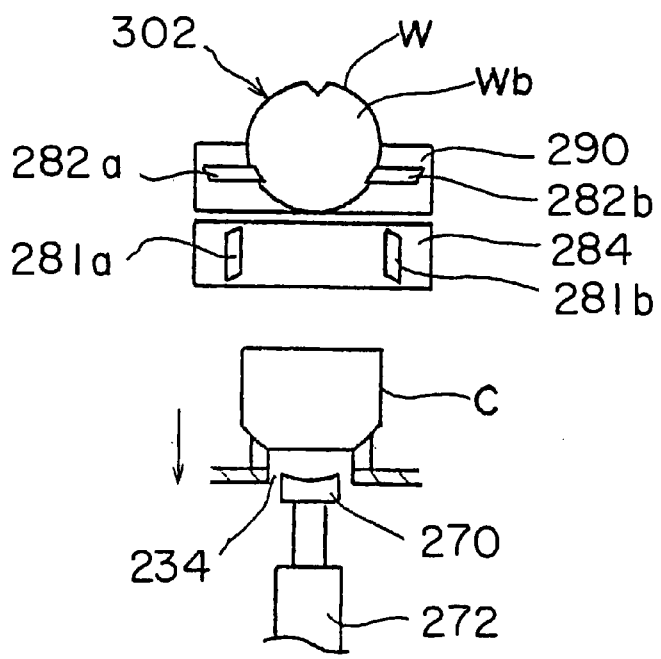
FIG. 55 is an explanatory diagram of the tenth process to array the wafers in the wafer arraying device of FIG. 41.
Figure 56:
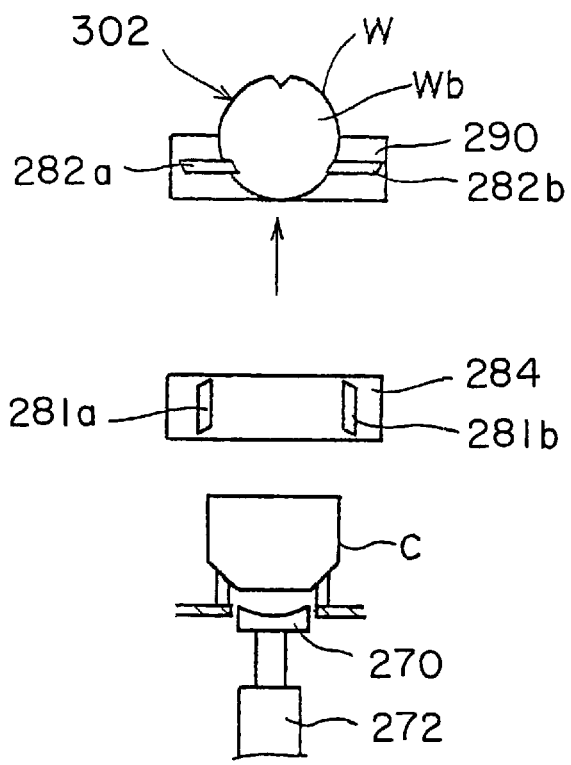
FIG. 56 is an explanatory diagram of the 11th. process to array the wafers in the wafer arraying device of FIG. 41.
Figure 56:
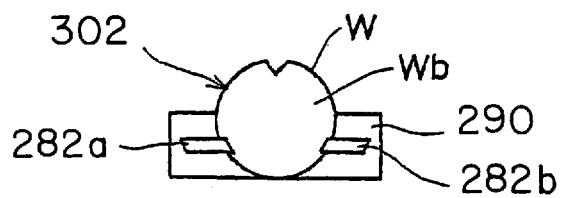
Figure 69:
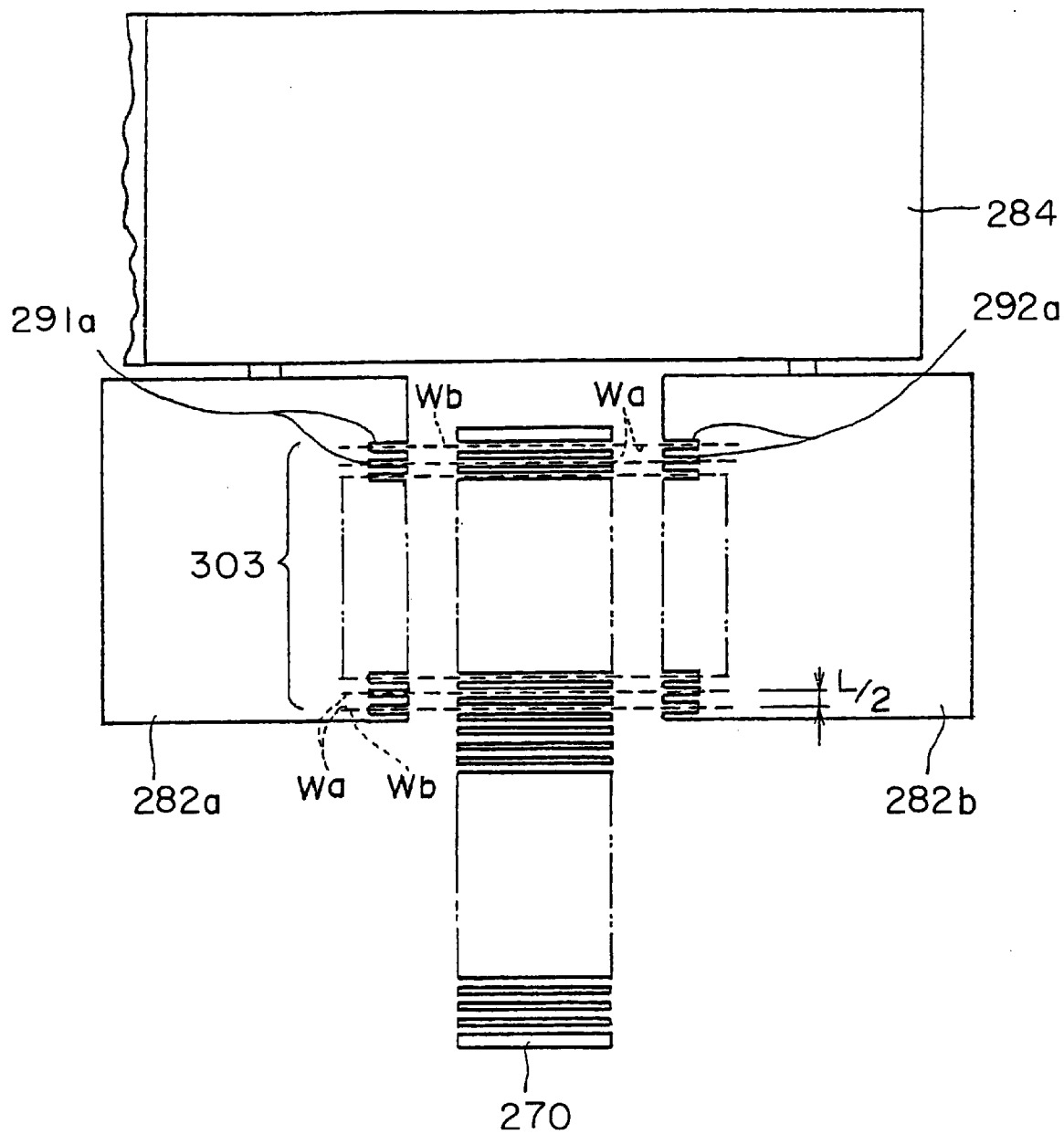
FIG. 69 is a plan view showing a situation of FIG. 55.
Figure 70:
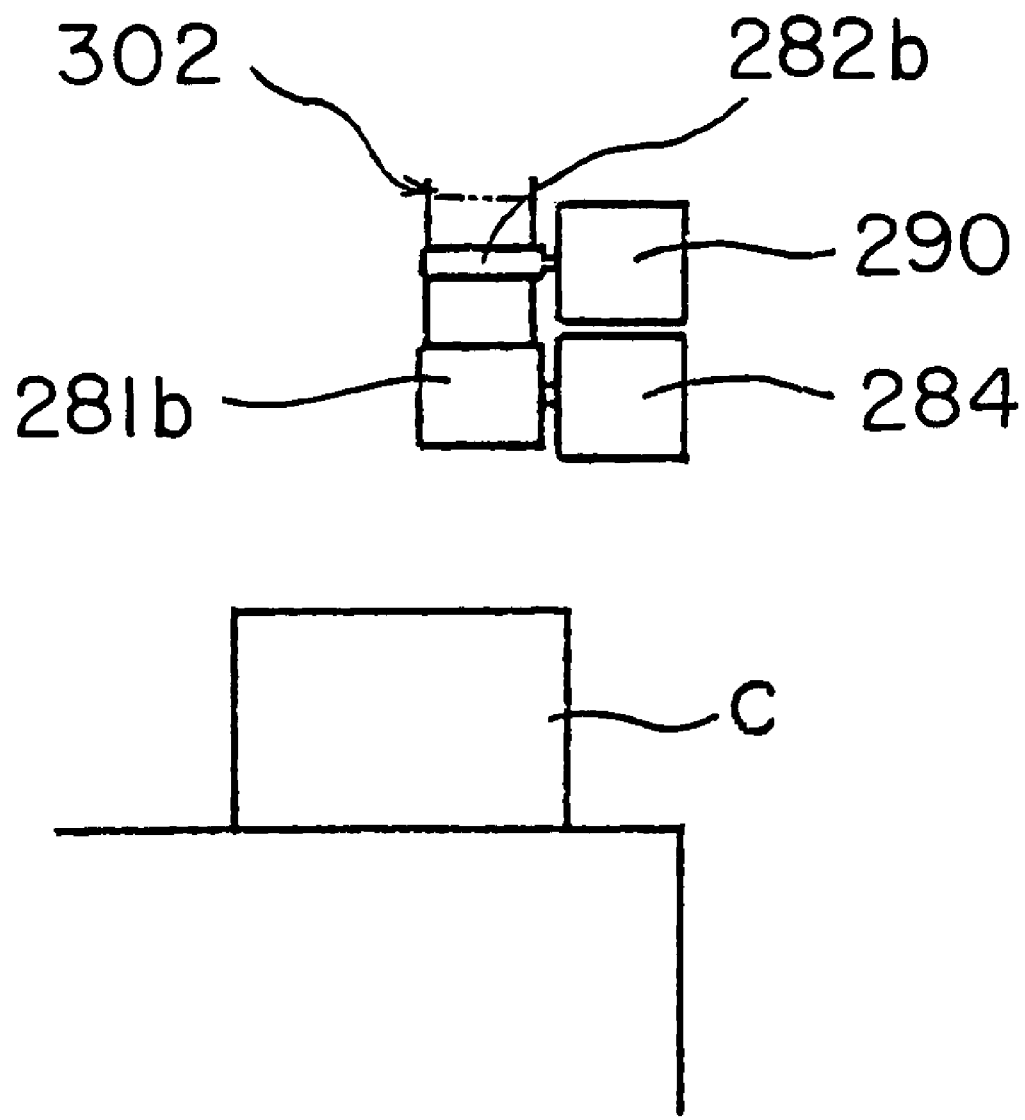
FIG. 70 is a side view showing the situation of FIG. 55.

Thereafter, as shown in FIG. 54, the second carrying members 282a, 282b are rotated with an angle of 90 degrees from the vertical postures to the horizontal postures. Next, as shown in FIG. 55, the wafer hand 270 descends to the level of the station 234, while the third wafer group 302 is delivered to the second carrying members 282a, 282b on the hand's way to the station 234. FIG. 69 illustrates a situation at that time, in plan view. FIG. 70 illustrates the situation at that time, in side view. That is, as shown in FIGS. 69 and 70, the peripheries of the respective wafers W of the third wafer group 302 are inserted into the grooves 291a, 292a, so that the second carrying members 282a, 282b carry the third wafer group 302. Subsequently, as shown in FIG. 56, the second carrying members 282a, 282b are respectively elevated to their original positions.

Figure 57:
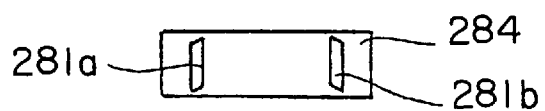
FIG. 57 is an explanatory diagram of the 12th. process to array the wafers in the wafer arraying device of FIG. 41.
Figure 57:
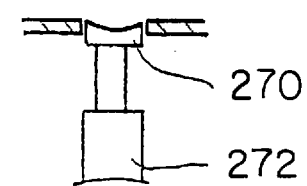
Figure 58:
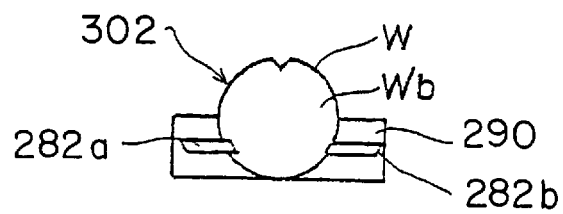
FIG. 58 is an explanatory diagram of the 13th. process to array the wafers in the wafer arraying device of FIG. 41.
Figure 58:
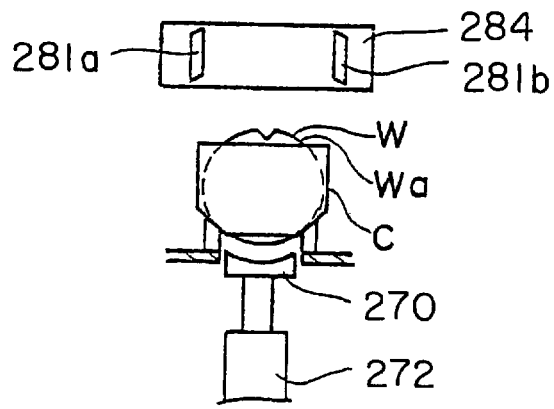

Next, after withdrawing the vacant carrier C from the pickup-and-accommodation stage 224 as shown in FIG. 57, the carrier C mounted on the station 30 at the loading stage 20 is moved to the pickup-and-accommodation stage 224 as shown in FIG. 58. Note that the so-withdrawn carrier C is either moved to e.g. the stock section 3 in stock or discharged from the cleaning apparatus 1.

Figure 59:
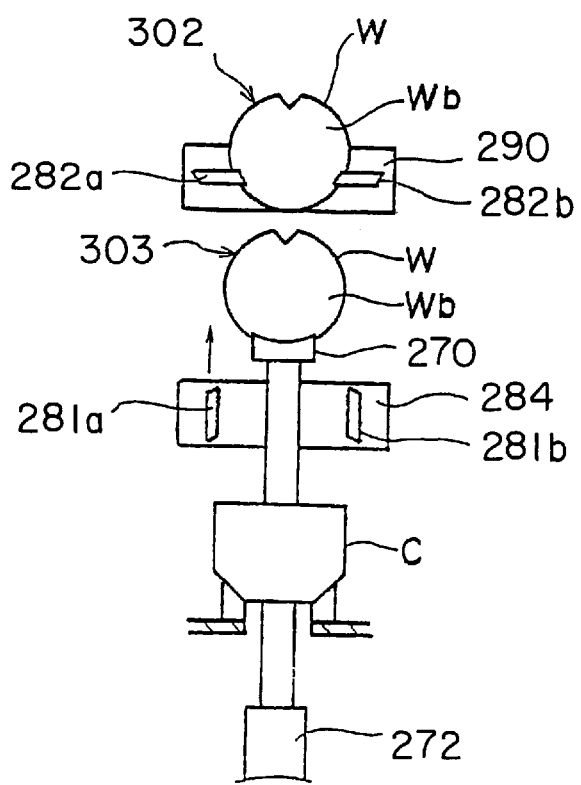
FIG. 59 is an explanatory diagram of the 14th. process to array the wafers in the wafer arraying device of FIG. 41.
Figure 60:
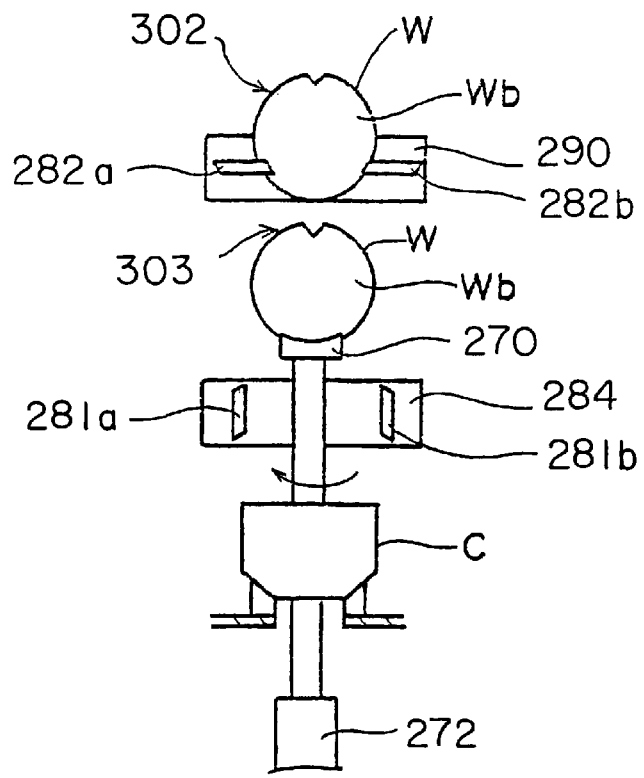
FIG. 60 is an explanatory diagram of the 15th. process to array the wafers in the wafer arraying device of FIG. 41.
Figure 61:
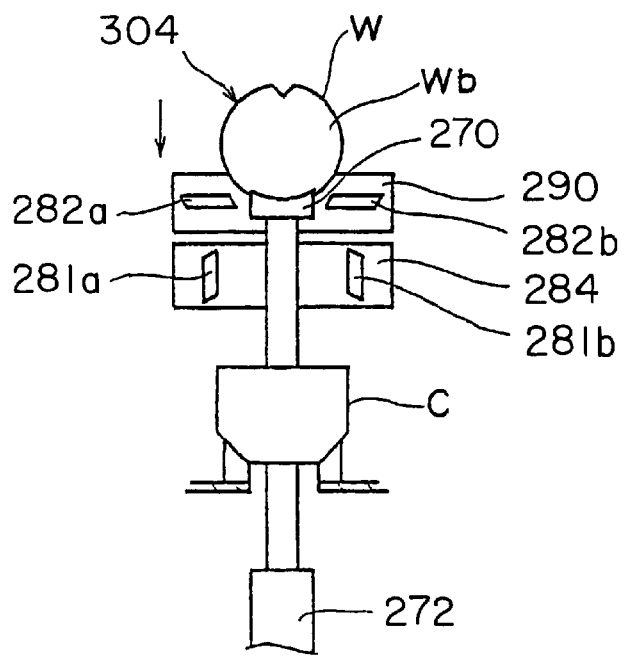
FIG. 61 is an explanatory diagram of the 16th. process to array the wafers in the wafer arraying device of FIG. 41.
Figure 71:
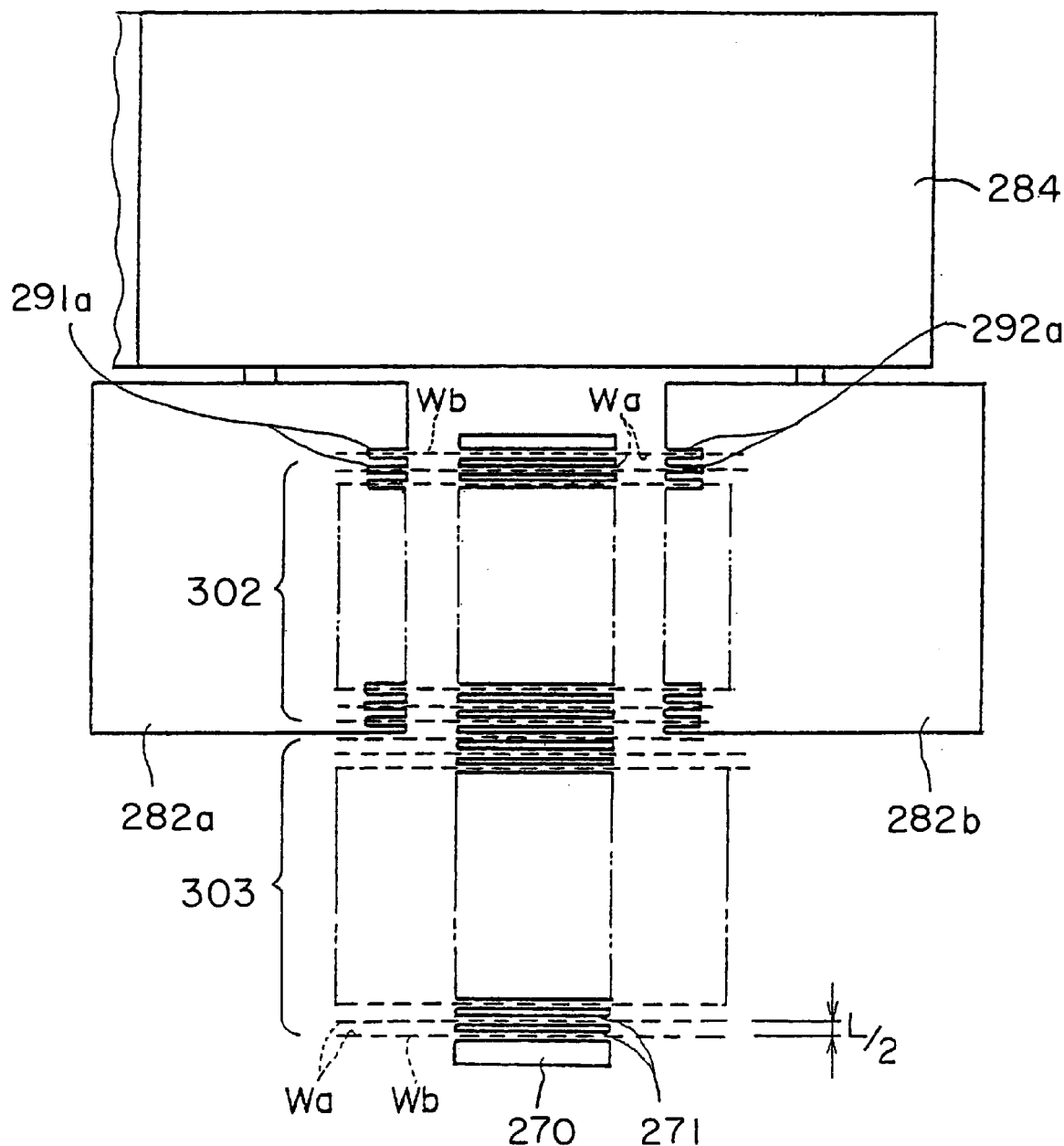
FIG. 71 is a plan view showing a situation of FIG. 60.
Figure 72:
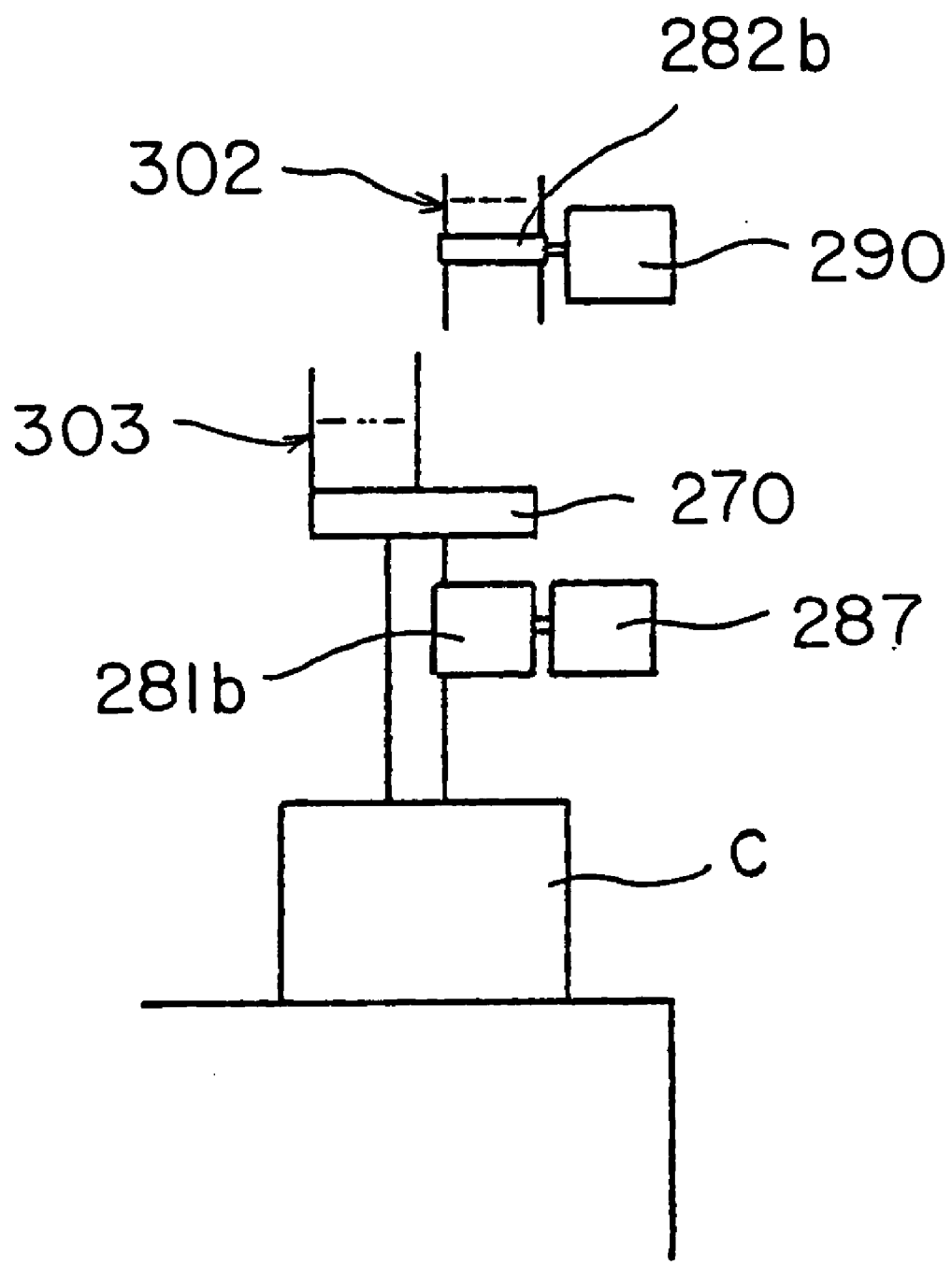
FIG. 72 is a side view showing the situation of FIG. 60.

Thereafter, on repetition of the operations similar to those of FIGS. 47 to 52, there is established a fourth wafer group 303 where twenty-six sheets of wafers W are arranged at even intervals of L/2 (about half of the intervals L), on the wafer hand 270. Then, by the wafer hand 270, the fourth wafer group 303 is projected upward of the first support 284, as shown in FIG. 59. Next, the wafer hand 270 rotates about the rotational elevating shaft 273 as a center with an angle of 180 degrees, so that twenty-six vacant grooves 271 on the wafer hand 270 are rotated downward of the third wafer group 302 carried by the second carrying members 282a, 282b, as shown in FIG. 60. FIG. 71 illustrates a situation at that time, in plan view. FIG. 72 illustrates the situation at that time, in side view. That is, in the wafer hand 270 capable of carrying fifty-two sheets of wafers W at regular intervals of L/2 (about half of the intervals L), there is ensured a space allowing twenty-six sheets of wafers W to be carried at regular intervals of L/2 (about half of the intervals L), shown in FIGS. 71 and 72. Therefore, the wafers W of the third wafer group 302 are inserted into twenty-six vacant grooves 26 on the back half of the wafer hand 270, respectively. Subsequently, as shown in FIG. 61, the second carrying members 282a, 282b are lowered with the descent of the second support 290, so that the third wafer group 302 is inserted behind the fourth wafer group 303. Then, the third wafer group 302 is adjacent to the fourth wafer group 303 through the interval of L/2 (about half of the intervals L). in this way, a fifth wafer group 304 is completed on the wafer hand 270 while arranging fifty-two sheets of wafers W at regular intervals of L/2. Note that the array width of the fifth wafer group 304 is substantially equal to that of the arrangement where twenty-six sheets of wafers W are accommodated in the carrier C, at regular intervals of L.

In this way, there are carried out the following steps of: (a) pushing up twenty-six sheets of wafers W arranged at regular intervals of L in the carrier C thereby to hold them above the carrier C; (b) lifting up thirteen sheets of wafers W from the so-held twenty-six sheets of wafers W at regular intervals of L thereby to hold them; (c) inserting the thirteen sheets of wafers W carried by the first carrying members 281a, 281b between the remaining wafers W (thirteen sheets) respectively and pushing up twenty-six sheets of wafers W while being arranged at intervals of L/2 being substantial half of the interval of L thereby to hold them; (d) lifting up the so-held wafers W (twenty-six sheets) at intervals of L/2 thereby to hold them; (e) carrying out the steps (a), (b) and (c) on twenty-six sheets of wafers W arranged in the other carrier C at regular intervals of L; (f) arranging the wafers W (twenty-six sheets) held at the step (d) adjacently to the wafers W (twenty-six sheets) held at the step (e); and (g) pushing up fifty-two sheets of wafers W (number of two carriers C) while being arranged at intervals of L/2 and carrying them.

Figure 62:
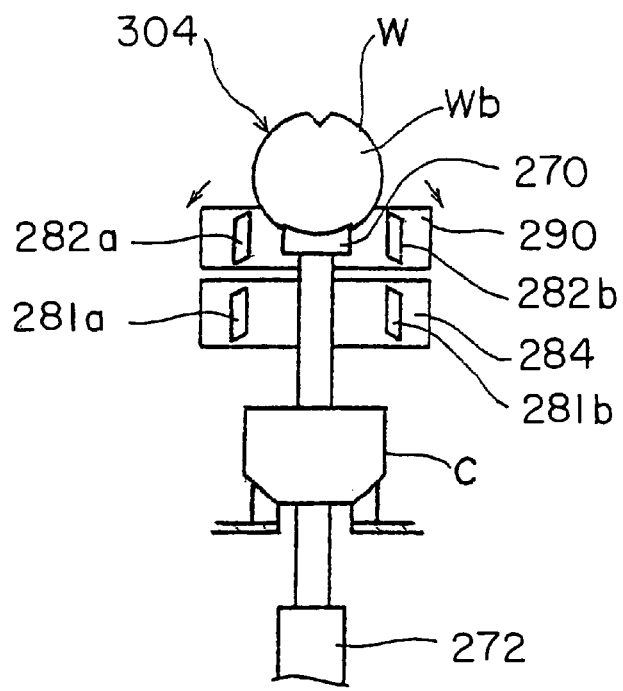
FIG. 62 is an explanatory diagram of the 17th. process to array the wafers in the wafer arraying device of FIG. 41.
Figure 63:
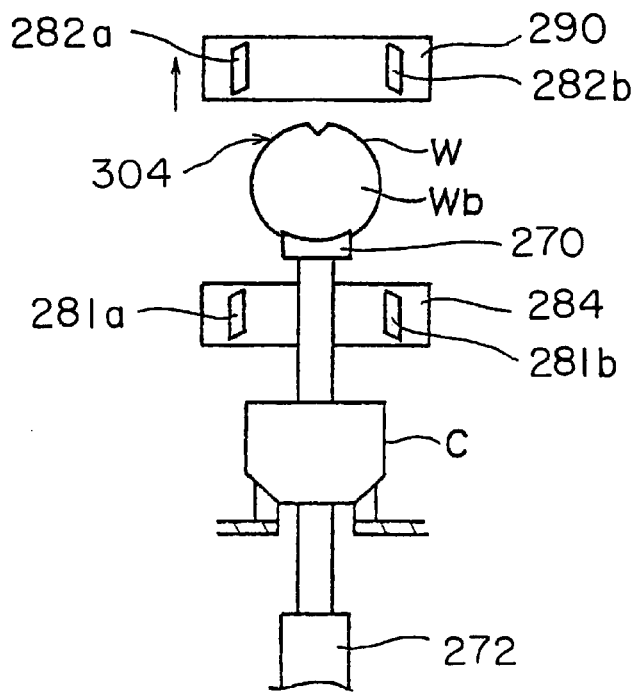
FIG. 63 is an explanatory diagram of the 18th. process to array the wafers in the wafer arraying device of FIG. 41.
Figure 64:
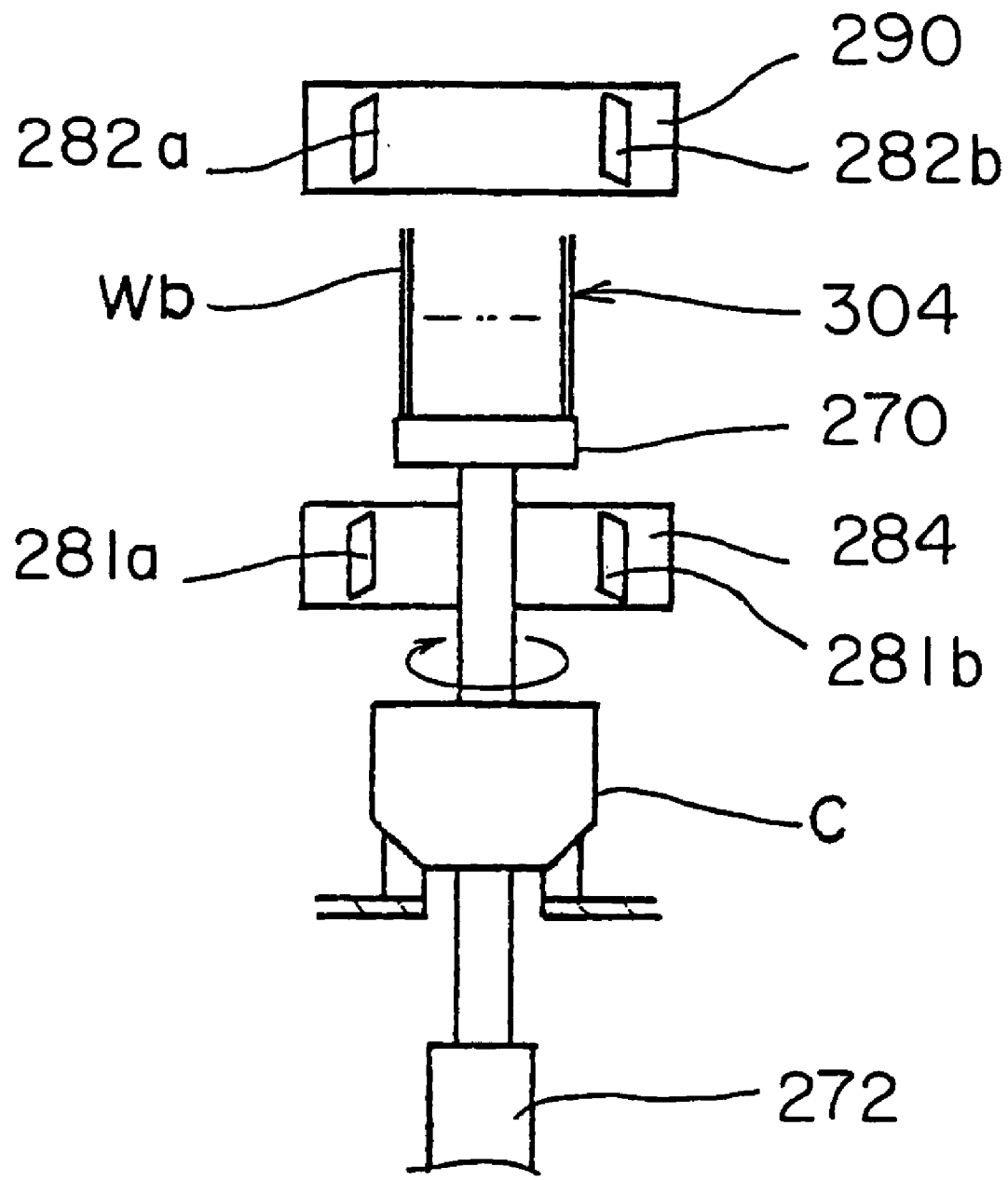
FIG. 64 is an explanatory diagram of the 19th. process to array the wafers in the wafer arraying device of FIG. 41.

Thereafter, as shown in FIG. 62, the second carrying members 282a, 282b are rotated with an angle of 90 degrees from the horizontal postures to the vertical postures. After the second support 290 has risen upward of the fifth wafer group 304 as shown in FIG. 63, the wafer hand 270 rotates with an angle of 90 degrees thereby to change the arraying direction of the wafers W of the fifth wafer group 304 from the front-and-behind direction of the cleaning apparatus 1 (X-direction in FIGS. 2 to 39) to the left-and-right direction of the cleaning apparatus 1 (Y-direction in FIGS. 2 to 39), so that the wafers W direct toward the stock section 3 (right of space of FIG. 64).

Subsequently, the fifth wafer group 304 (fifty-two sheets of wafers W with a width correspond to the single carrier C) is delivered to the transfer arm 8. Continuously, the same group 304 is transported to the chemical-and-rising devices 10, 12, and the drying device 9 in order and returned to the wafer arraying device 222 again. Using the grooves 285b, 287b of the first carrying members 281a, 281b and also the grooves 291b, 292b of the second carrying members 282a, 282b, the pitch changer 280 carries out the above-mentioned steps in substantially-reverse order thereby to accommodate the fourth wafer group 304 in two carriers C. Then, these carriers C are discharged to the outside via the unloading stage 21.

According to the above wafer arraying method and device 222, since twenty-six sheets of wafers W are arranged at regular intervals of L/2 (about half of the intervals L) in the third wafer group 302 and the fourth wafer group 303 respectively, the array width of the whole wafers W can be reduced to about half in comparison with the arrangement where twenty-six sheets of wafers W are arranged in the carrier C at regular intervals of L. Accordingly, the fifth wafer group 304 obtained by combining the third wafer group 302 with the fourth wafer group 303 can hold fifty-two sheets of wafers W in the same width as the width of an arrangement where twenty-six sheets of wafers are accommodated at regular intervals of L. Thus, the respective chemical-and-rinsing apparatuses 10, 12 for each cleaning the fifth wafer group 304 can be improved in their throughputs without enlarging the size.

In the fifth wafer group 304, furthermore, the front face Wa and the back face Wb of one wafer W are confronted by the front face Wa and the back face Wb of the adjoining wafer W, respectively. Therefore, it is possible to prevent the particles etc., which have been peeled off, for example, the back face Wb of one wafer W at the time of cleaning process, from sticking to the front face Wa of the adjoining wafer W.

Note that the third wafer group 302 and the fourth wafer group 303 may be processed respectively and individually. Then, as mentioned above, since the third wafer group 302 and the fourth wafer group 303 to be cleaning and dried each has a width being substantial half of the width of arrangement to accommodate twenty-six sheets of wafers W in the carrier C at regular intervals of L, it is possible to miniaturize the respective chemical-and-rinsing apparatuses 10, 12 and also the drying apparatus 9, thereby saving the footprint of the cleaning apparatus 1. Additionally, it is possible to reduce the consumption of various kinds of chemical liquids and IPA.

Figure 73:
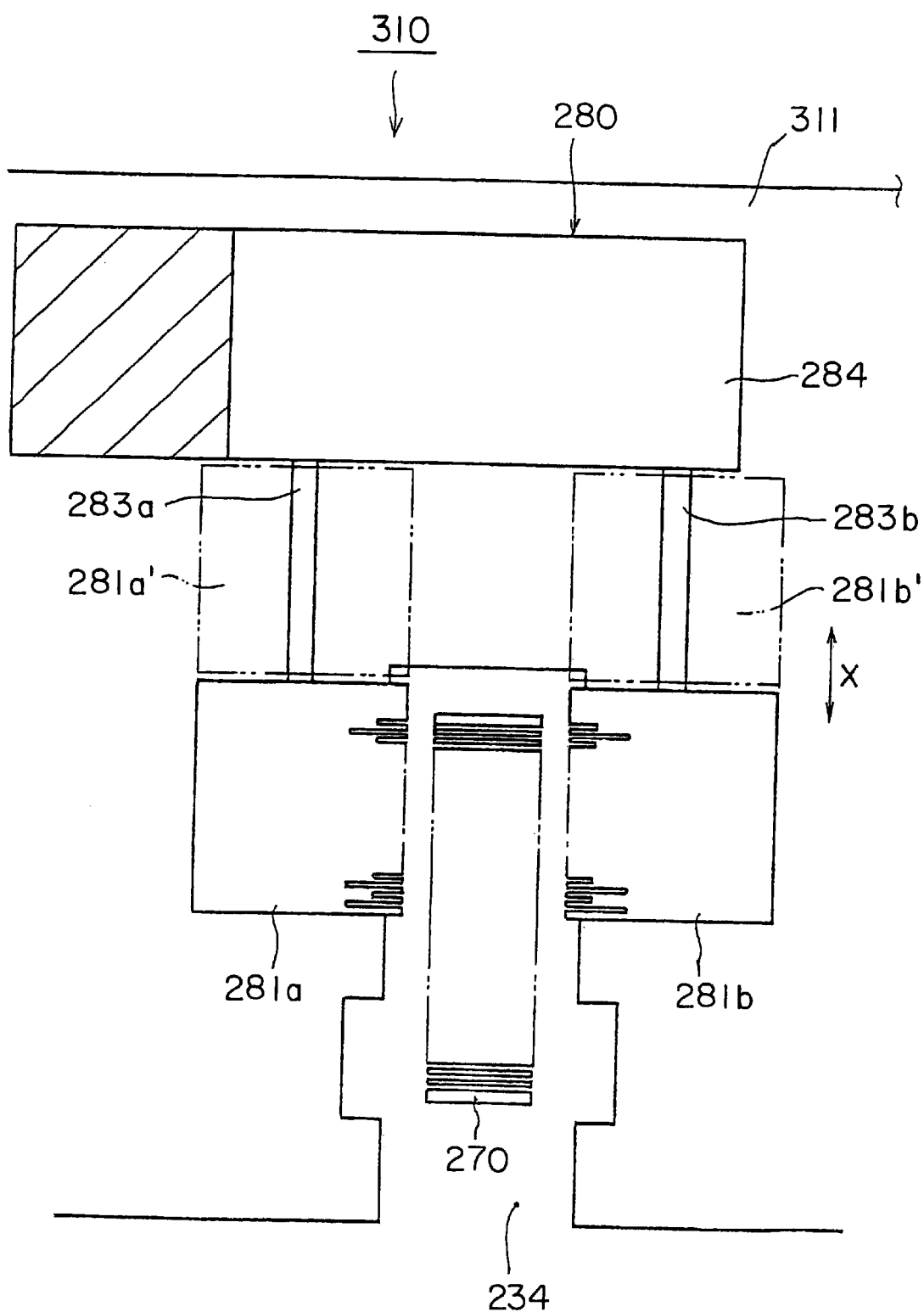
FIG. 73 is an enlarged plan view of an essential part of the wafer arraying device in accordance with the fifth embodiment of the invention.

Next, we describe a wafer arraying device 310 in accordance with the fifth embodiment of the invention. As shown in FIG. 73, the wafer arraying device 310 can divide twenty-six sheets of wafers W taken out of the carrier C into the first wafer group 300 and the second wafer group 301 since the support shafts 283a, 283b are expanded and contracted to move the second carrying members 282a, 282b horizontally.

That is, while extending the width of a pickup-and-accommodation stage 311 in the wafer arraying device 310, the pitch changer 280 is positioned behind the cleaning apparatus 1, in comparison with the changer's positions shown in FIGS. 2, 39 and 42. Consequently, when the first carrying members 281a, 281b are moved upward of the wafer hand 270 horizontally while respectively moving the first carrying member 281a and the first carrying member 281b to respective positions shown with a two-dot chain lines 281a' and 281b' horizontally (X-direction), the pitch changer 280 is withdrawn from the upside of the wafer hand 270. Again, the similar operation is applicable to the second carrying members 282a, 282b. Besides the shown arrangement of the pitch changer 280, the constitution of the device 310 is identical to that of the previously-mentioned wafer arraying device 222. Therefore, in the wafer arraying device 310, constituents similar to those of the device 222 in terms of function and constitution are indicated with the same reference numerals respectively and their overlapping descriptions are eliminated.

Figure 74:
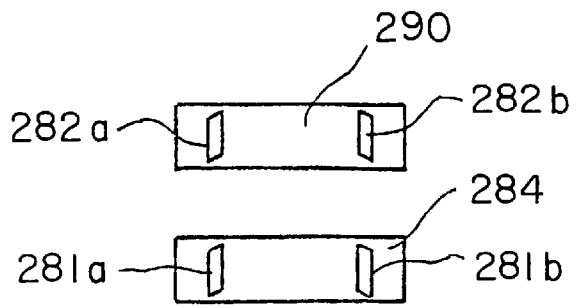
FIG. 74 is an explanatory diagram of the first process to array the wafers in the wafer arraying device of FIG. 73.
Figure 74:
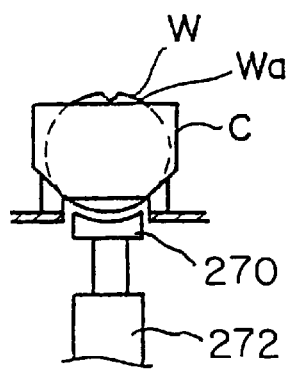

Next, the wafer arraying method performed by the wafer arraying device 310 will be described with reference to the first process diagram to the seventh process diagram shown in FIGS. 74 to 80, respectively. First, as shown in FIG. 74, the carrier C is mounted on the pickup-and-accommodation stage 311.

Figure 75:
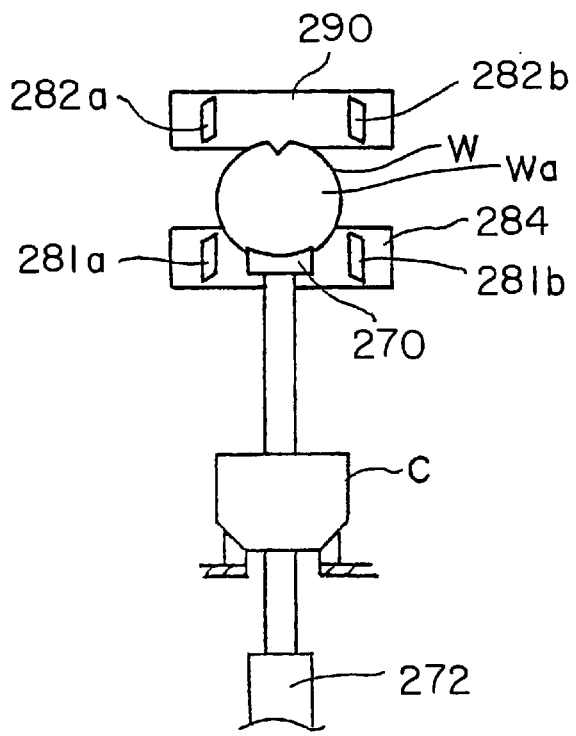
FIG. 75 is an explanatory diagram of the second process to array the wafers in the wafer arraying device of FIG. 73.
Figure 81:
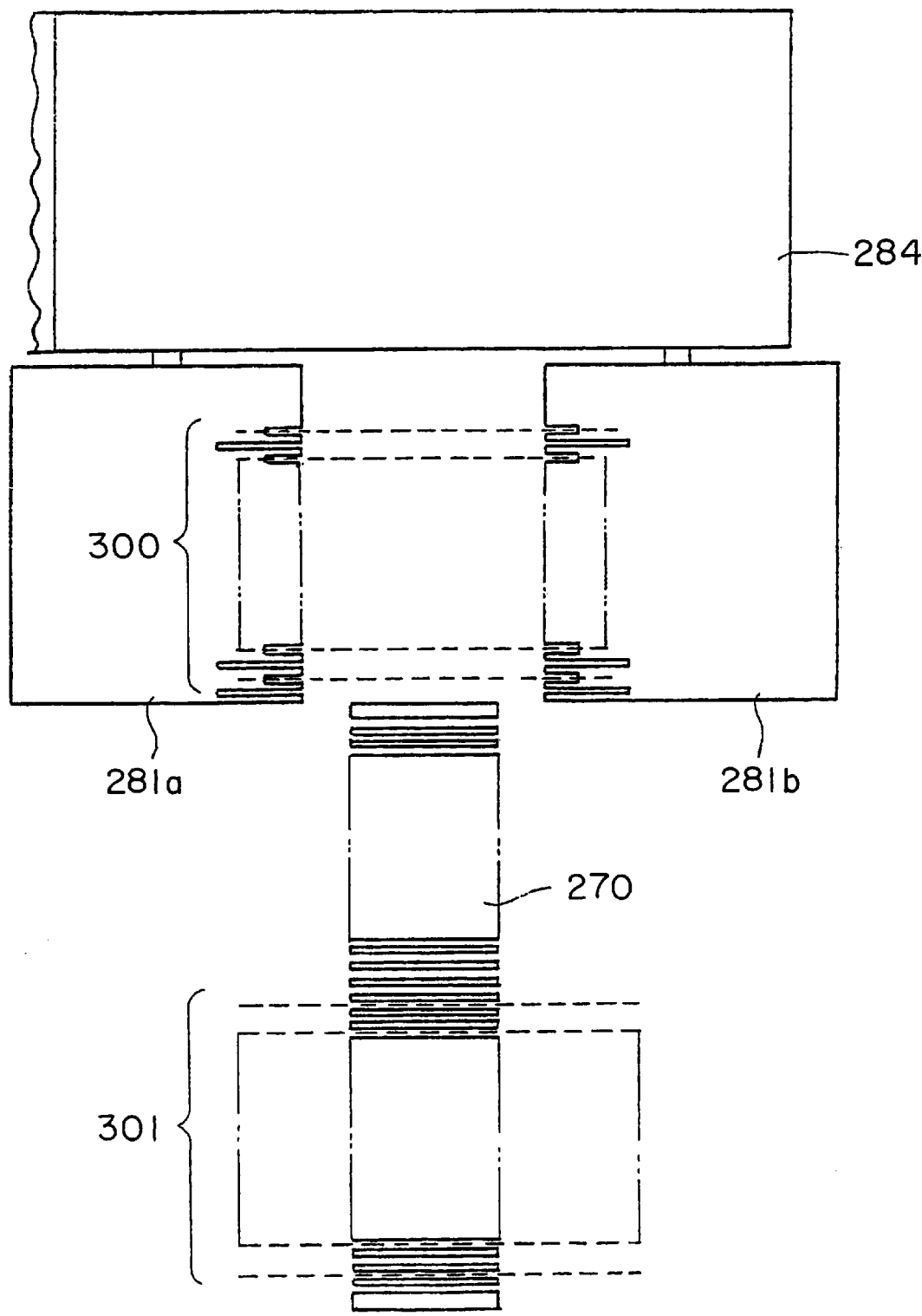
FIG. 81 is a plan view showing a situation of FIG. 77.
Figure 82:
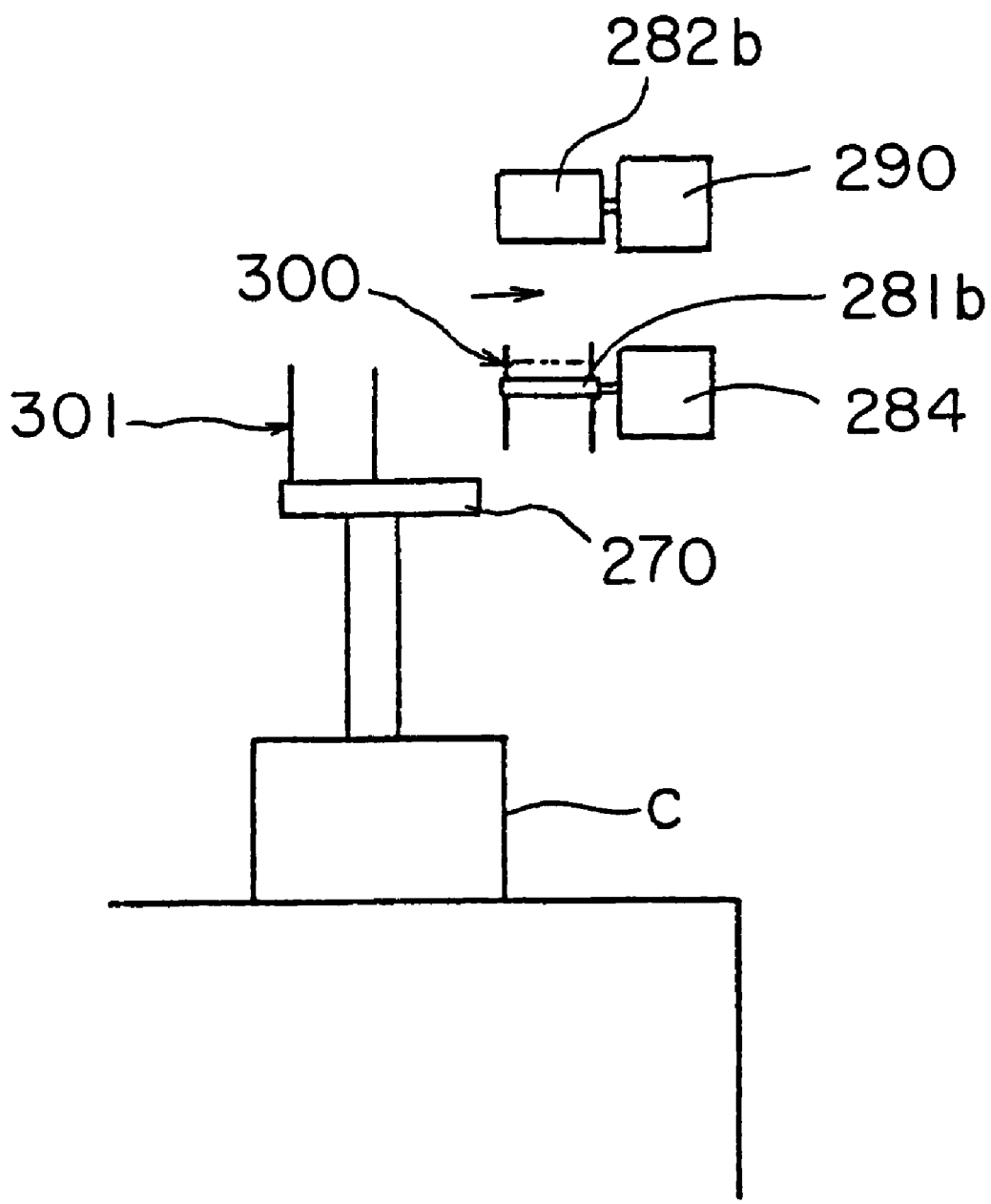
FIG. 82 is a side view showing the situation of FIG. 77.

From this state, the wafer hand 270 is elevated by the drive of the rotational elevating mechanism 272 to take the wafers W out of the carrier C, as shown in FIG. 75. Next, the first carrying members 281a, 281b rotate with an angle of 90 degrees from the vertical postures to the horizontal postures (FIG. 76). Subsequently, as shown in FIG. 77, the wafer hand 270 is slightly lowered by the rotational elevating mechanism 272 and thereafter, the first carrying members 281a, 281b are withdrawn from the upside of the wafer hand 270 thereby to divide the wafer W into the first wafer group 300 and the second wafer group 301. FIG. 81 is a plan view of the device 310, while FIG. 82 is a side view of the device 310, both showing the above condition.

Figure 78:
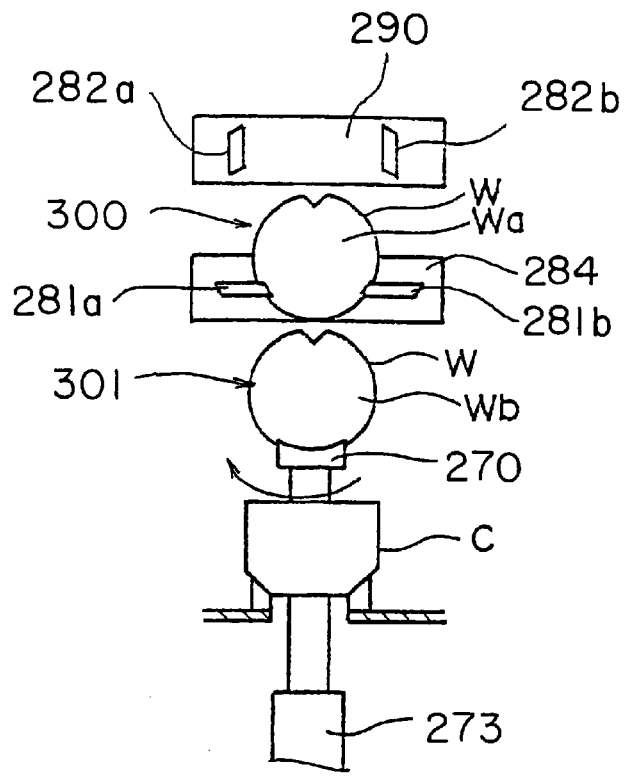
FIG. 78 is an explanatory diagram of the fifth process to array the wafers in the wafer arraying device of FIG. 73.
Figure 79:
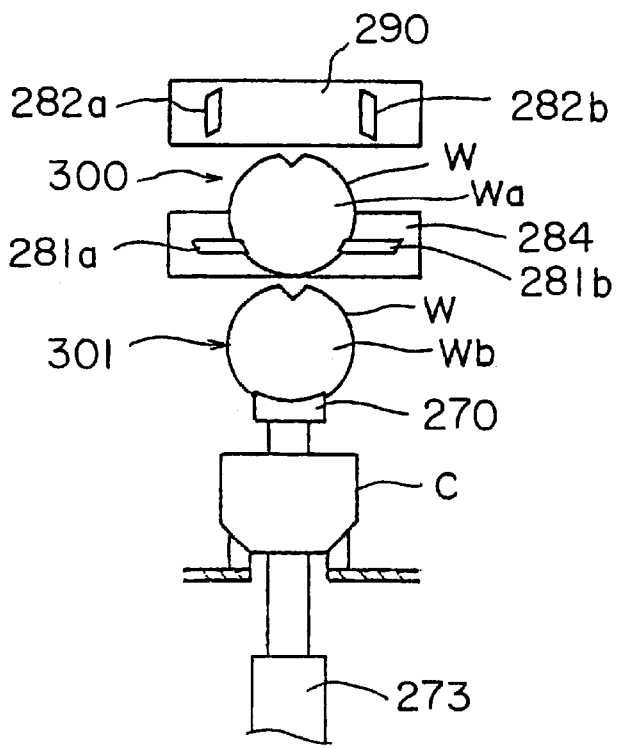
FIG. 79 is an explanatory diagram of the sixth process to array the wafers in the wafer arraying device of FIG. 73.
Figure 80:
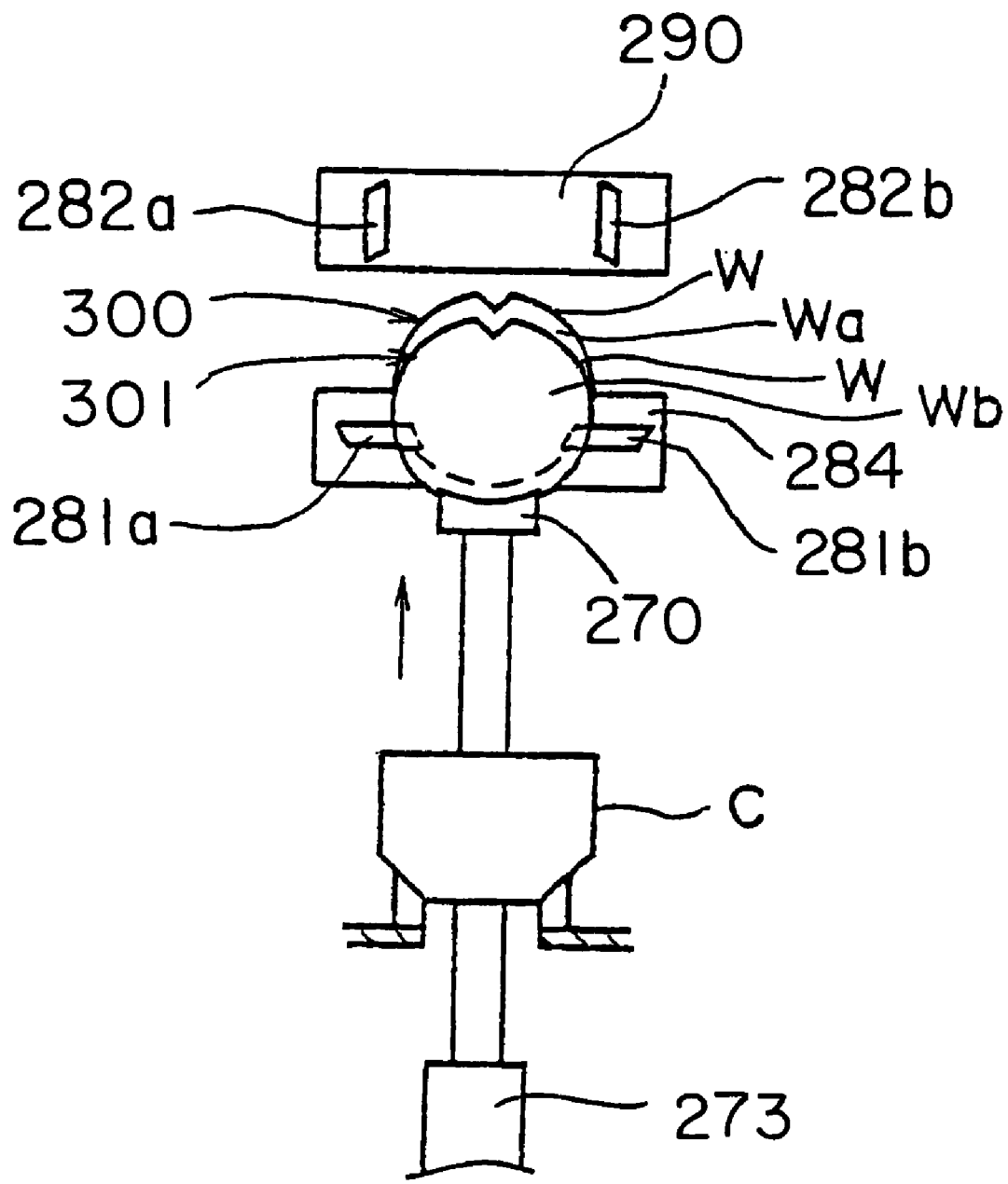
FIG. 80 is an explanatory diagram of the seventh process to array the wafers in the wafer arraying device of FIG. 73.
Figure 83:
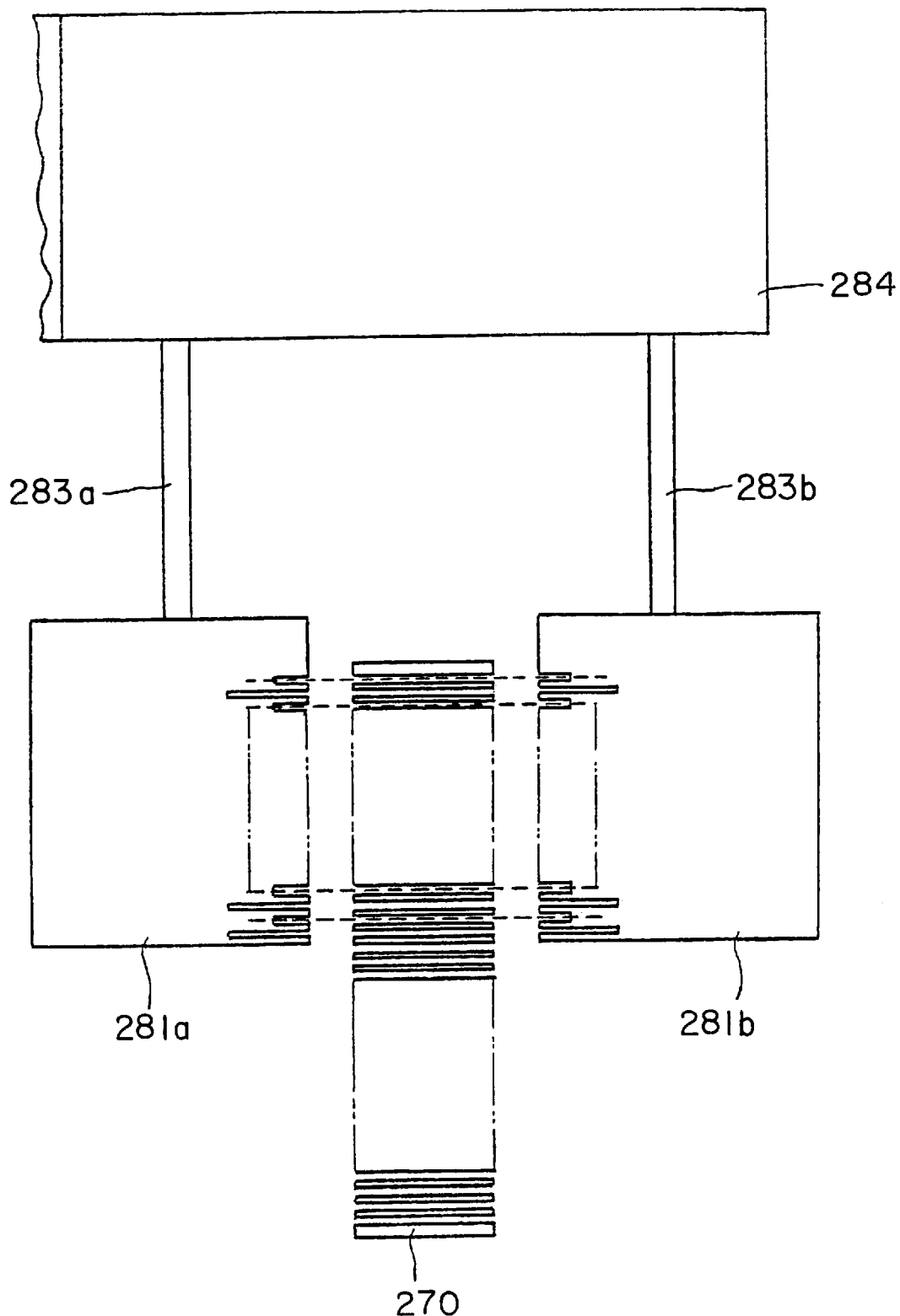
FIG. 83 is a plan view showing a situation of FIG. 79.
Figure 84:
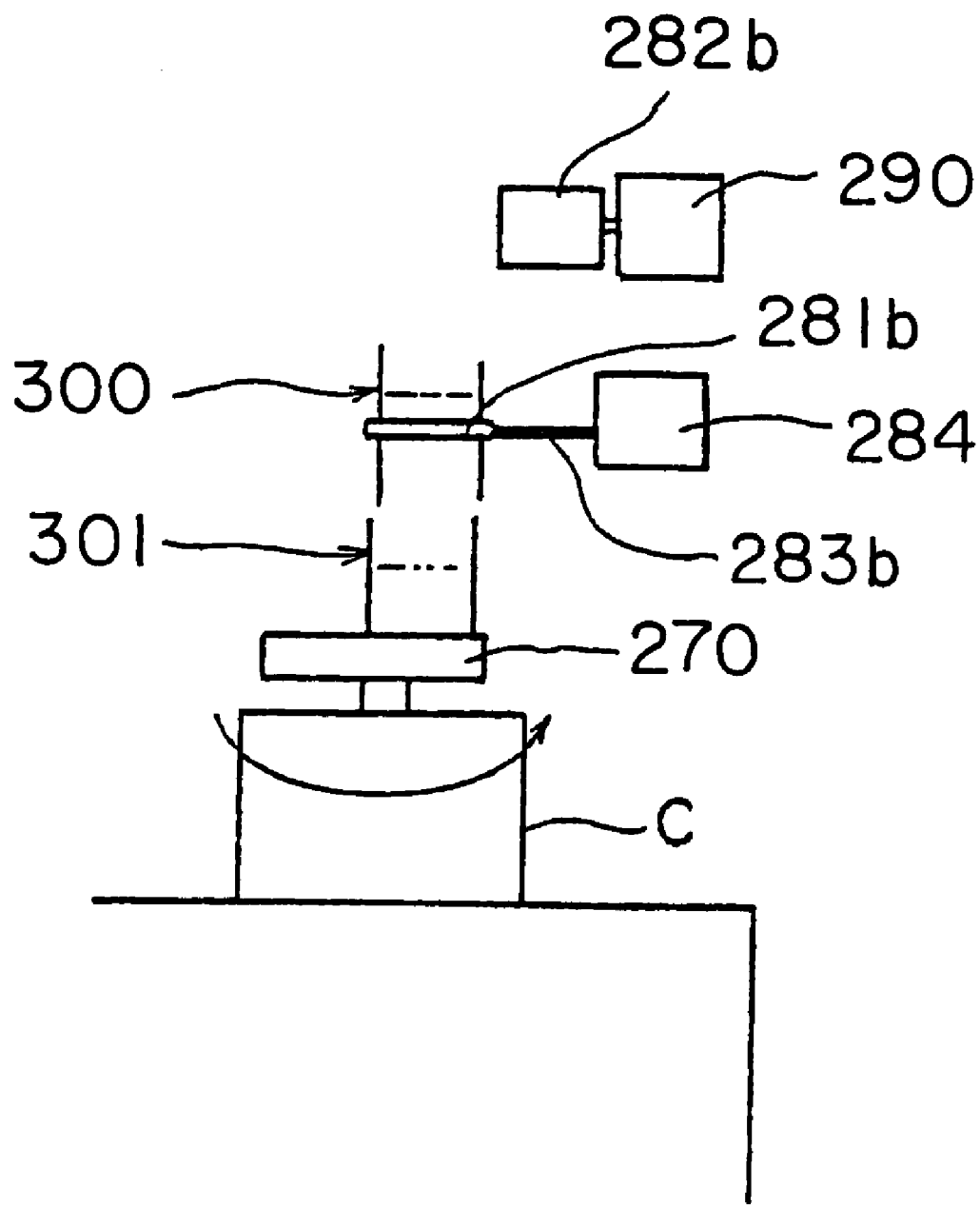
FIG. 84 is a side view showing the situation of FIG. 79.

Then, as shown in FIG. 78, the wafer hand 270 rotates about the rotational elevating shaft 273 with an angle of 180 degrees to reverse the front faces Wa and the back faces Wb of the wafers W of the second group 301. Next, as shown in FIG. 79, the first carrying members 281a, 281b are moved above the wafer hand 270 horizontally thereby to position the first wafer group 300 above the second wafer group 301. FIG. 83 is a plan view showing this situation and FIG. 84 is the side view showing the same situation. Next, as shown in FIG. 80, the wafer hand 270 is elevated to insert the respective wafers W of the first wafer group 300 between the respective wafers W of the second wafer group 301. After insertion, the first carrying members 281a, 281b and the second carrying members 282a, 282b are all lowered, so that the wafer hand 270 receives the first wafer group 300, thereby completing a third wafer group 302 on the wafer hand 270, similarly to the previously-mentioned case of FIG. 53. In this way, it is executed to move the carrier C having twenty-six sheets of wafers W accommodated at regular intervals of L to the pickup-and-accommodation stage 311. At the same stage 311, the above wafers W are taken out of the carrier C to form the third wafer group 302 where the so-taken wafers W are arranged at regular intervals of L/2. Thereafter, the similar steps will be repeated. That is, the other carrier C is brought to the pickup-and-accommodation stage 311. At the same stage 311, twenty-six sheets of wafers W are taken out of the other carrier C, thereby forming a fourth wafer group 303 where the so-taken wafers W are arranged at regular intervals of L/2. Then, by establishing a width between the end of the third wafer group 302 and the end of the fourth wafer group 303 so as to be the interval of L/2, there is finally completed the fifth wafer group 304 in which the third wafer group 302 and the fourth wafer group 303 are arranged in series.

According to the above-mentioned method, the horizontal movement of the first carrying members 281a, 281b also allows the wafers W to be divided into the first wafer group 300 and the second wafer group 301. Additionally, it is possible to give and receive the wafers W between the wafer hand 270 and the pitch changer 280.

Figure 85:
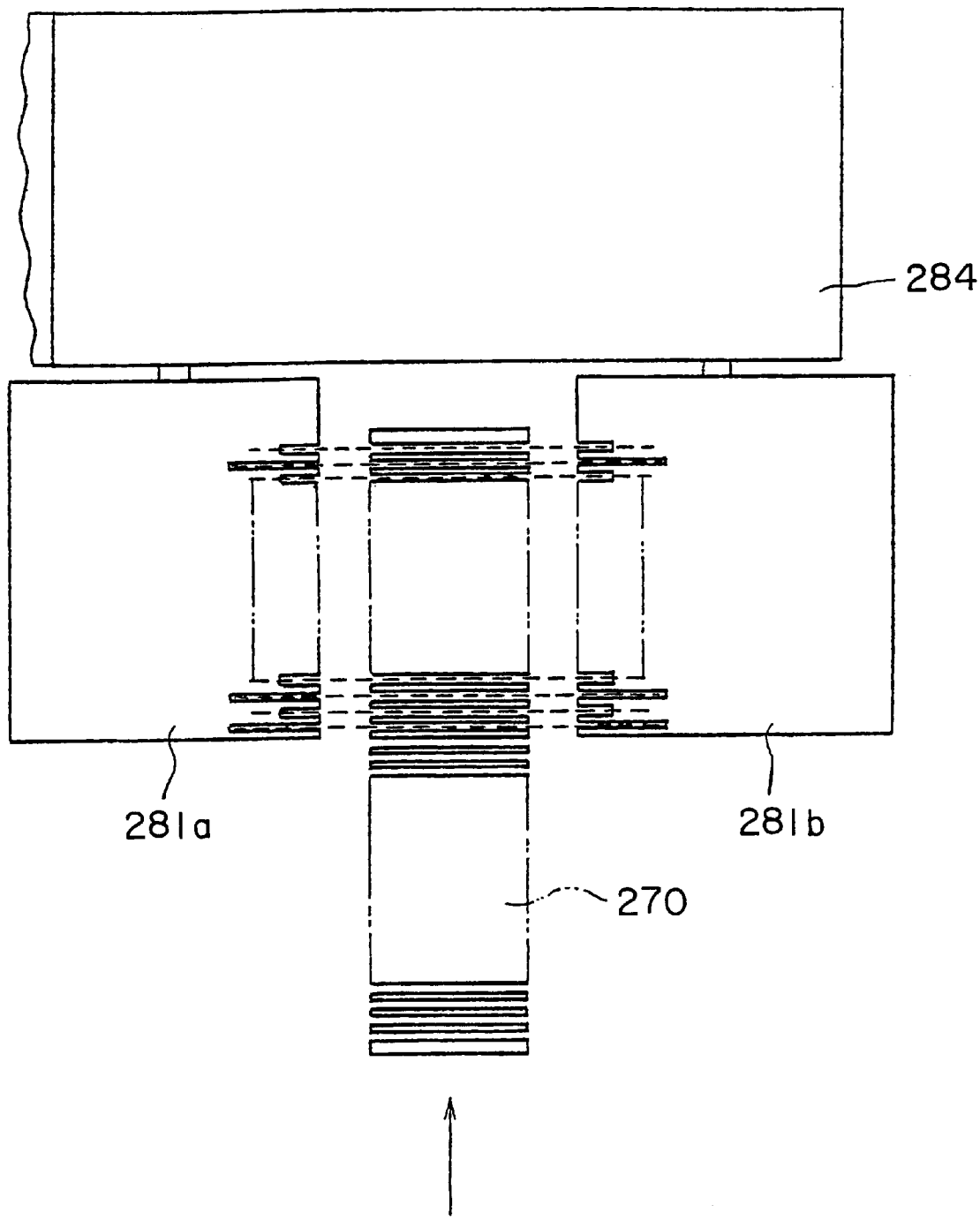
FIG. 85 is a plan view of the wafer arraying device of FIG. 73, showing its situation to move the wafer hand to the underside of the first carrying member horizontally.
Figure 86:
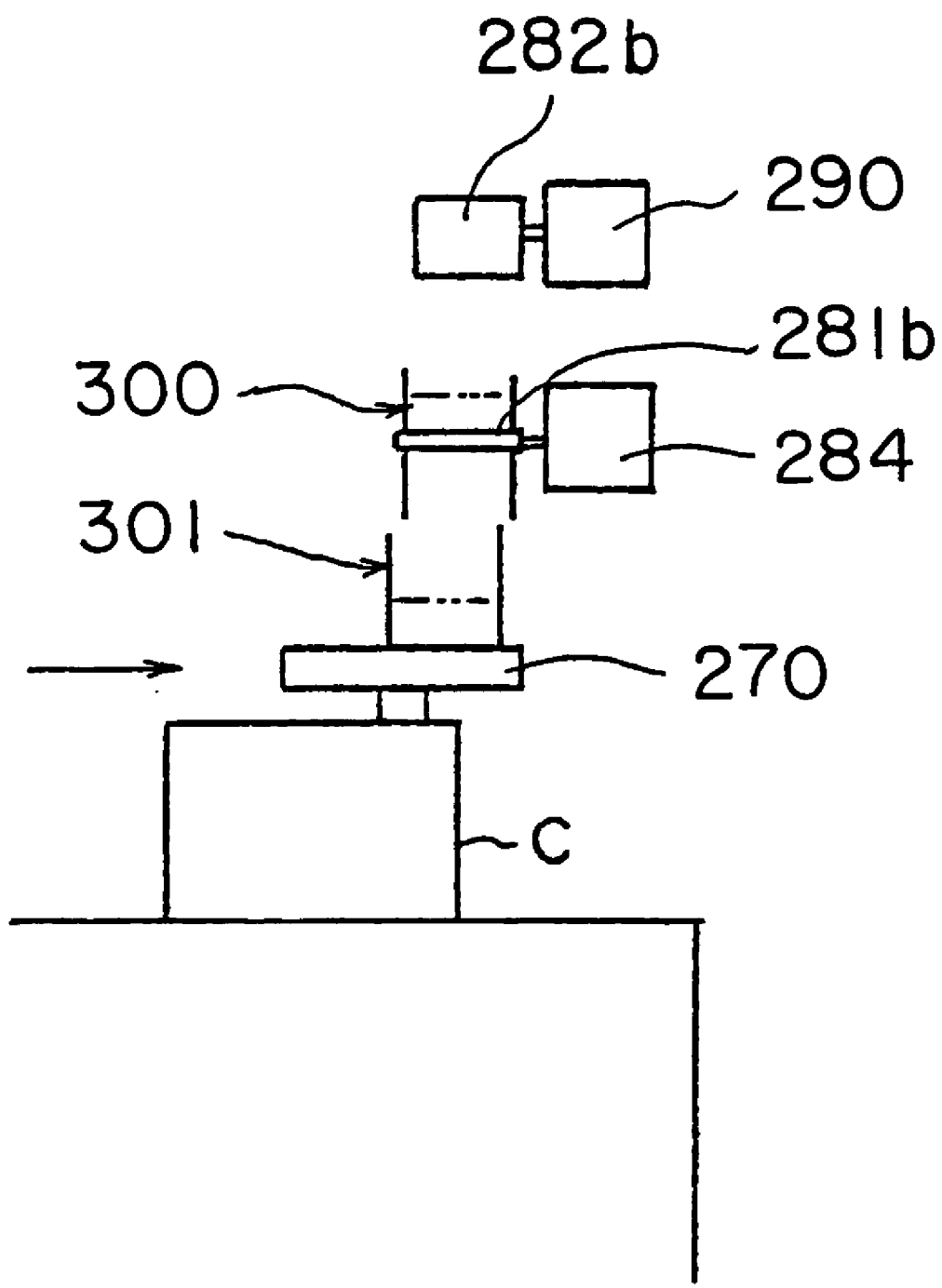
FIG. 86 is a side view of the wafer arraying device of FIG. 73, showing its situation to move the wafer hand to the underside of the first carrying member horizontally.

Note that, after rotating the wafer hand 270 about the rotational elevating shaft 273 with an angle of 180 degrees thereby to turn over the front faces Wa and the back faces Wb of the wafers W of the second wafer group 301, it may be executed to move the wafer hand 270 downward of the first carrying members 281a, 281b, as shown in FIGS. 85 and 86. Then, with the subsequent descend of the first carrying members 281a, 281b, the wafers W of the first wafer group 300 can be inserted between the respective wafers W of the second wafer group 301 respectively. In this way, the horizontal movement of the second wafer group 301 downward of the first wafer group 300 also allows the wafers W of the same group 300 to be respectively positioned between the respective wafers W of the second wafer group 301, in plan view.

Further, the rotational elevating shaft 273 may be connected with the wafer hand 270 so that the center axis of the wafer hand 270 is coaxial with the center axis of the rotational elevating shaft 273. In this case, the wafer hand 270 moves for a distance of interval L/2 horizontally after its rotation with an angle of 180 degrees to turn over the front faces Wa and the back faces Wb of the wafers W of the second wafer group 301. This horizontal movement also allows the wafers W of the first wafer group 300 to be respectively positioned between the respective wafers W of the second wafer group 301, in plan view and additionally, the adjoining wafers W can be arranged at even intervals L/2 in plan view, which is substantially half of the regular intervals L. Alternatively, the second wafer group 301 may be moved downward of the first wafer group 300 horizontally without reversing the front faces Wa and the back faces Wb of the wafers W of the second wafer group 301 so that the wafers W of the first group 300 are respectively inserted between the respective wafers of the second group 301, thereby facing the front face and the back face of the adjoining wafers W each other.

The present invention has been described by an example of accommodating twenty-six (even number) sheets of wafers in each of two carriers C. While, in case of accommodating twenty-five (odd number) sheets of wafers in each of two carriers C, the cleaning-and-drying process may be performed since the wafer hand 270 and the pitch changer 280 have allowed fifty sheets of wafers W to be arrayed with an array width substantially equal to the array width in case of accommodating twenty-five sheets of wafers W in the carrier C at regular intervals of L. Then, the wafer hand 270 is constructed so as to take twenty-five sheets of wafers W in and out of the carrier C while they are being arranged at regular intervals and carry fifty sheets of wafers W at regular intervals of L/2.

On the other hand, the pitch changer 280 is constructed so as to divide the twenty-five sheets of wafers W pushed up by the wafer hand 270 into two wafer groups of wafer in even and odd numbers and also insert the wafers of one wafer group between the wafers of the other wafer group respectively. In this way, the wafer arraying method and devices 222, 230 of the invention are applicable to the wafers W irrespective of the number of wafers, odd or even.

Again, the pitch changer may be constructed so as to turn over the front and back faces of the wafers. In such a case, after the pitch changer has reversed the front and back faces of the wafers, the first carrying member is horizontally shifted to bring the first wafer group upward of the second wafer group. Alternatively, the wafer hand is horizontally shifted to bring the second wafer group downward of the first wafer group, so that the respective wafers of the second wafer group are disposed between the respective wafers of the first wafer group, in plan view. With the above-mentioned structure and method, the wafers W of the first group are subsequently inserted between the respective wafers W of the second wafer group, thereby completing the third wafer group.

Again, although the present invention has been described by example of one cleaning apparatus that cleans a batch of wafers, the invention is not limited to the above apparatus only. Thus, the present invention is also applicable to the other apparatus for performing a designated treatment, for example, an apparatus for applying a designated treatment liquid on the wafers. Additionally, although the wafers have been referred as the substrates throughout the embodiments, the present invention is not limited to such the embodiments and also applicable to the other substrates, for example, LCD substrates etc.

As described above, according to the present invention, it is possible to complete the formation of a group of substrates stably in a short time. Additionally, since there is no need to establish another stage or space for forming the group of substrates separately from this stage, it is possible to miniaturize the processing apparatus for processing such the group of substrates. Further, since the grooves of the other container can be utilized for the insertion of substrates, it is possible to prevent the respective substrates taken out of the container on one side from touching the respective substrates taken out of the container on the other side, thereby stabilizing the formation of the group of substrates. With the possibility of preventing the occurrence of positional differences, the present invention can dispense with a complicated mechanism for detecting and correcting such positional differences of the respective substrates. Furthermore, according to the feature of claim 3, both front and back faces of one substrate can be confronted by the front face and the back face of the adjoining substrate, respectively. Therefore, it is possible to prevent, for example, a particle peeled off the back face of the substrates from sticking to the front face of the adjoining substrate. Further, it is possible to provide a small-sized and simple processing apparatus and also possible to realize the processing apparatus having an improved throughput.

Again, according to the present invention, by narrowing the interval between the adjoining substrates, it is possible to shorten a width of the whole substrates on arrangement. Accordingly, it is possible to miniaturize the processing apparatus for processing the substrates or improve the throughput of the apparatus. Further, since both front and back faces of one substrate can be confronted by the front face and the back face of the adjoining substrate, respectively, it is possible to prevent particles etc., which may be peeled off the back face of one substrate during processing, from sticking to the front face of the adjoining substrate. Additionally, a plurality of substrates can be suitably divided into halves and therefore, it is possible to form a group of substrates arranged at substantial half of the regular intervals, advantageously. Again, the delivery of substrates can be accomplished between the carrying means and the delivering means.

What is claimed is:

1. A substrate arraying apparatus comprising:

a stage for mounting a container;

a substrate supporting member for supporting substrates and moving through an aperture formed at the stage, the substrate supporting member capable of supporting as many substrate as the substrates being able to be accommodated in a container at regular intervals of L being equal to the regular intervals of the substrates in the container, the substrate supporting member being capable of supporting substrates twice as many substrates as the substrates being able to be accommodated in the container, said substrate support member supports substrates at regular intervals of (1/2)L being equal to half length of the regular intervals of L of the substrates in the container;

a first substrate delivering member including:
      grooves capable of receiving half as many substrates as substrates being able to be accommodated in a container at regular intervals of L for supporting the substrates, and
      a plurality of slots being located between the respective grooves and being (1/2)L away from both sides of the grooves, the plurality of slots allowing half as many substrates being able to be accommodated in a container at regular intervals of L to pass through,
      wherein the first substrate delivering member is capable of receiving substrates from the substrate supporting member substantially half as many substrates supported by the substrate supporting member at regular intervals of L and located at one side of the substrate supporting member; and a second substrate delivering member located above the first substrate delivering member, the second substrate delivering member having a closed position in which the second substrate delivering member is capable of receiving as many substrates as the substrates being able to be accommodated in a container, at intervals of (1/2)L being equal to half length of the regular intervals of L of the substrates in the container, from the substrate supporting member, said second substrate delivering member having an open position in which the second substrate delivering member is capable of passing the substrate supporting member.

2. A substrate arraying apparatus as claimed in claim 1, further comprising a stage for mounting the container and a transfer table supporting the container from its downside thereby to both loading and unloading the container to and from the stage.

3. A substrate arraying apparatus as claimed in claim 2, further comprising a stock section for stocking the container, wherein the transfer table carries out both loading the container into the stock section and unloading the container from the stock section.

4. A substrate arraying apparatus as claimed in claim 2, wherein the transfer table is provided with a sensor for detecting a condition of the substrates being accommodated in the container.

5. A substrate arraying apparatus as claimed in claim 1,
wherein the substrate supporting member is adapted so as to be relatively movable to the container up and down, and wherein the substrate supporting member is adapted so as to be relatively rotatable with respect to the first substrate delivering member and the second substrate delivering member in a horizontal plane.

6. A substrate arraying apparatus as claimed in claim 1, wherein the second substrate delivering member is arranged above the first substrate delivering member; and the first substrate delivering member and the second substrate delivering member are adapted so as to be relatively movable to the substrate supporting member up and down.

7. A substrate arraying method comprising the steps of:

mounting a container on a stage, the container receiving an original substrate group consisting of a plurality of substrates arranged therein at regular intervals;

moving all substrates of the original substrate group from the container to a substrate supporting member capable of supporting substrates at regular intervals;

moving substrates of a first substrate group located at one side of the substrate supporting member in the original substrate group from the substrate supporting member to a first substrate delivering member capable of supporting substrates;

relatively positioning the respective substrates of a second substrate group left on the substrate supporting member between respective substrates of the first substrate group in plain view;

inserting the respective substrates of the second substrate group between the respective substrates of the first substrate group by relatively moving the respective substrates of the second substrate group toward the first substrate group;

forming a third substrate group consisting of the substrates in number of one container on the substrate supporting member in such a manner that the substrates are arranged at regular intervals that are narrower than the intervals of the substrates in the container;

transferring the substrates of the third substrate group from the substrate supporting member to a second substrate delivering member;

removing the container from the stage;

mounting another container on the stage, the other container receiving a second original substrate group having a plurality of substrates arranged therein at regular intervals;

moving all substrates of the second original substrate group from the other container to the substrate supporting member capable of supporting substrates at regular internals;

moving substrates of a fourth substrate group located at one side of the substrate supporting member in the second original substrate group from the substrate supporting member to the first substrate delivering member capable of supporting substrates;

relatively positioning respective substrates of a fifth substrate group left on the substrate supporting member between respective substrates of the fourth substrate group in plain view;

inserting the respective substrate of the fifth substrate group between the respective substrate of the fourth substrate group by relatively moving the respective substrates of the fifth substrate group towards the fourth substrate group;

forming a sixth substrate group consisting of the substrates in number of one container on the substrate supporting member in such a manner that substrates are arranged at regular intervals that are narrower than the intervals of substrates in the container;

transferring the substrates of the third substrate group on the second substrate delivering member from the second substrate delivering member to the substrate supporting member supporting the substrates of the sixth substrate group in such a manner that the third substrate group are arranged next to the sixth substrate group.

8. A substrate arraying method as claimed in claim 7, further comprising the step of reversing the substrates of either the first substrate group or the second substrate group, wherein the reversing step is carried out between the step of moving substrates of the first substrate group from the substrate supporting member to the first substrate delivering member and the step of forming a third substrate group on the substrate supporting member, or between the step of moving substrates of the fourth substrate group from the substrate supporting member to the first substrate delivering member and the step of forming a sixth substrate group on the substrate supporting member.

9. A substrate arraying method as claimed in claim 8, wherein the reversing step is executed by rotating the substrates of the first substrate group or the substrates of the second substrate group about a vertical axis thereof.

10. A substrate arraying method as claimed in claim 7, wherein the step of dividing the substrates into the first substrate group and the second substrate group is executed by relatively moving the substrates of the first substrate group to the substrates of the second substrate group up and down.

11. A substrate arraying method as claimed in claim 7, wherein the substrates taken out of the container and arranged at regular intervals are mounted on the substrate supporting member;

substantial half of the substrates on one side of a substrate supporting member are supported as the first substrate group by a substrate delivering member;

the remaining half of the substrates on the other side of the substrate supporting member are positioned as the second substrate group below the first substrate group of substrates; and the horizontal movement to position the respective substrates of the second substrate group between the respective substrates of the first substrate group in plan view, is carried out by rotating the substrate supporting member about a vertical axis passing through a position deviated from the center of the substrate supporting member.

12. A substrate arraying method as claimed in claim 7, further comprising, after forming the sixth substrate group on the substrate supporting member and before moving third substrate group from the second substrate delivering member to the substrate supporting member, the step of positioning the substrate supporting member such that the substrates of the sixth substrate group on the substrate supporting member do not interfere with the substrates of the third substrate group on the second substrate delivering member.

* * * * *